US008442241B2

(12) United States Patent
Yamada et al.

(10) Patent No.: US 8,442,241 B2
(45) Date of Patent: May 14, 2013

(54) AUDIO SIGNAL PROCESSING FOR SEPARATING MULTIPLE SOURCE SIGNALS FROM AT LEAST ONE SOURCE SIGNAL

(75) Inventors: Yuji Yamada, Tokyo (JP); Koyuru Okimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 1506 days.

(21) Appl. No.: 11/665,688

(22) PCT Filed: Oct. 4, 2005

(86) PCT No.: PCT/JP2005/018338

§ 371 (c)(1),
(2), (4) Date: Jan. 30, 2008

(87) PCT Pub. No.: WO2006/043413

PCT Pub. Date: Apr. 27, 2006

(65) Prior Publication Data

US 2011/0116639 A1 May 19, 2011

(30) Foreign Application Priority Data

Oct. 19, 2004 (JP) ................................ 2004-303935

(51) Int. Cl.
*H03G 5/00* (2006.01)

(52) U.S. Cl.
USPC ................................................ 381/98; 381/17

(58) Field of Classification Search .................... 381/98, 381/17–19, 21, 22, 307
See application file for complete search history.

(56) References Cited

U.S. PATENT DOCUMENTS

| | | | | |
|---|---|---|---|---|
| 6,405,163 | B1 * | 6/2002 | Laroche | 704/205 |
| 6,697,491 | B1 * | 2/2004 | Griesinger | 381/20 |
| 6,920,223 | B1 | 7/2005 | Fosgate | |
| 6,970,567 | B1 | 11/2005 | Gundry et al. | |
| 2001/0031053 | A1 * | 10/2001 | Feng et al. | 381/92 |
| 2004/0125960 | A1 * | 7/2004 | Fosgate et al. | 381/20 |
| 2004/0218682 | A1 * | 11/2004 | Nam et al. | 375/260 |
| 2005/0195995 | A1 * | 9/2005 | Baumgarte | 381/104 |

FOREIGN PATENT DOCUMENTS

| | | |
|---|---|---|
| JP | 04-296200 | 10/1992 |
| JP | 06-205500 | 7/1994 |
| JP | 07-039000 | 2/1995 |
| JP | 10-313498 A | 11/1998 |
| JP | 10-313500 | 11/1998 |

(Continued)

*Primary Examiner* — Kimberly Rizkallah
*Assistant Examiner* — Duy T Nguyen
(74) *Attorney, Agent, or Firm* — Wolf, Greenfield & Sacks, P.C.

(57) ABSTRACT

An audio signal processing device is provided whereby, from two systems of audio signals in which audio signals of multiple audio sources are included, the audio signals of the multiple audio sources can be suitably separated. The audio signal processing device divides each of two systems of audio signals into a plurality of frequency bands, calculates a level ratio or a level difference of the two systems of audio signals, at each of the divided plurality of frequency bands, and extracts and outputs frequency band components of and nearby values regarding which the level ratio or the level difference calculated at the level comparison means have been determined beforehand. The frequency band components have a level ratio or level difference at and nearby the values determined beforehand which are different one from another.

7 Claims, 33 Drawing Sheets

FOREIGN PATENT DOCUMENTS

| | | | |
|---|---|---|---|
| JP | 2003-516069 | A | 5/2000 |
| JP | 2002-078100 | A | 3/2002 |
| JP | 2004-102186 | A | 4/2002 |
| JP | 2002-247699 | A | 8/2002 |
| JP | 2003-515771 | A | 5/2003 |
| JP | 2003-223193 | A | 8/2003 |
| JP | 2003-274492 | | 9/2003 |
| JP | 2003-274492 | A | 9/2003 |
| JP | 2004-507953 | A | 3/2004 |
| JP | 2004-343590 | A | 12/2004 |
| WO | WO 00/30404 | A1 | 5/2000 |
| WO | 02-19768 | A2 | 3/2002 |

* cited by examiner

AUDIO SIGNAL PROCESSING FOR SEPARATING MULTIPLE SOURCE SIGNALS FROM AT LEAST ONE SOURCE SIGNAL

This application is a national phase application under 35 U.S.C. §371 of International Application No. PCT/JP2005/018338 filed Oct. 4, 2005 and entitled "Audio Signal Processing Device and Audio Signal Processing Method," which claims priority to Japanese Patent Application No. JP 2004-303935 filed Oct. 19, 2004 and entitled "Audio Signal Processing Device and Audio Signal Processing Method," the entire contents of both of which are incorporated herein by reference.

TECHNICAL FIELD

The present invention relates to an audio signal processing device and method for separating, from input audio time-sequence signals of two systems (two channels) each made up of multiple sound sources, audio signals of sound sources of a greater number of channels than the number of input channels.

The present invention also relates to an audio signal processing device for generating audio signals for playing, using a headphone set or two speakers, the audio signals of sound sources of a greater number of channels than the number of input channels, following separation thereof from the two channels of input audio time-sequence signals.

BACKGROUND ART

Audio signals of each channel of the two right and left channels carrying stereo music signals recorded on records, compact discs, and so forth, often are made up of audio signals from multiple sound sources. Such stereo audio signals are often provided with level differences and recorded in the respective channels so as to realize sound image localization of the multiple sound sources between speakers when played using two speakers.

For example, if we say that we have five sound sources MS1 through MS5, the signals of which are S1 through S5, which are to be recorded as audio signals SL and SR in the form of the two channels left and right, the signals S1 through S5 of the sound sources MS1 through MS5 are each given level differences between the two left and right channels, so as to be added and mixed into the audio signals of the respective channels, as shown here.

$$SL=S1+0.9S2+0.7S3+0.4S4$$

$$SR=S5+0.4S2+0.7S3+0.9S4$$

Playing stereo audio signals recorded with the signals of the sound sources MS1 through MS5 having been panned to the two left and right channels with level difference through two speakers, 1L and 1R, as shown in FIG. 32 for example, gives the listener 2 the perception of the sound images A, B, C, D, and E, corresponding to the sound sources MS1, MS2, MS3, MS4, and MS5. Also, these sound images A, B, C, D, and E are known to be localized between the speaker 1L and the speaker 1R.

Also, in the event that the listener 2 wears a headphone set 3 as shown in FIG. 33, and plays the above stereo audio signals of the two left and right channels with a left speaker unit 3L and right speaker unit 3R of the headphone set 3, the listener 2 can be given the perception that the sound images A, B, C, D, and E, corresponding to the sound sources MS1, MS2, MS3, MS4, and MS5, are within the head or nearby.

However, with such a playing method, sound images are localized only in a narrow area between the two speakers or speaker units, and further, sound images are often perceived to be overlapping each other.

An arrangement may be conceived with the case of FIG. 32 wherein the spacing between the two speakers 1L and 1R is spread in order to avoid overlapping sound images, but in such cases, clear sound image localization has not been obtainable, with the center area sound image (sound image C in FIG. 32) being unclear. Of course, the sound images corresponding to the sound sources could not be localized at positions freely, or behind or to the side of the listener.

There has also been a problem in that in the event of playing the same stereo audio signals with the headphone set 3, the sound images A through E are localized within the head from nearby the left ear to nearby the right ear as shown in FIG. 33, leading to sound images being localized in a range even narrower than with speaker output, and furthermore in an overlapped state, resulting in an unnatural-sounding sound field.

With regard to such a problem, the three or more channels of audio signals from the original sound sources can be separated and synthesized from the two-channel stereo audio signals for example, and the separated and synthesized multichannel audio signals played by speakers corresponding to each of the multiple channels, thereby yielding a natural sound field. This also enables sound images to be synthesized behind the listener and so forth, for example.

As for methods for achieving such an object, there is a method using a matrix circuit and directivity enhancing circuits. This principle will be described with reference to FIG. 34.

Signals L, C, R, and S, of four types of sound sources, are prepared, and these sound source signals are used to obtain two sound source signals Si1 and Si2 by encoding processing with the following synthesizing equations.

$$Si1=L+0.7C+0.7S$$

$$Si2=R+0.7C-0.7S$$

The two signals Si1 and Si2 (two channels) generated in this way are recorded in a recording media such as a disk or the like, played from the recording media, and input to input terminals 11 and 12 of a decoding device 10 shown in FIG. 34. The four channels of sound source signals L, C, R, and S are separated from the signals Si1 and Si2 at the decoding device 10.

Specifically, the input signals Si1 and Si2 from the input terminals 11 and 12 are supplied to an addition circuit 13 and subtraction circuit 14, added to and subtracted from each other, thereby generating an addition output signal Sadd and Sdiff, respectively. At this time, the signals Si1 and Si2, and signals Sadd and Sdiff, are expressed as follows.

$$Si1=L+0.7C+0.7S$$

$$Si2=R+0.7C-0.7S$$

$$Sadd=1.4C+L+R$$

$$Sdiff=1.4S+L-R$$

Accordingly, in signal Si1 the signal L, in signal Si2 the signal R, in signal Sadd the signal C, and in signal Sdiff the signal S, each have a level 3 dB higher than the other sound source signals, so each channel audio has preserved the characteristics of the respective sound source the best. Thus, taking each of the signal Si1, signal Si2, signal Sadd, and signal Sdiff, as the respective output signals, enables the sound source signals L, C, R, and S, of the four original channels, to be separated and output.

However, in this state, separation of sound image between the channels is insufficient. Accordingly, in the example shown in FIG. 34, the signal Si1, signal Si2, signal Sadd, and signal Sdiff, are output to output terminals 161, 162, 163, and 164, via directivity enhancing circuits 151, 152, 153, and 154 which increase the output levels.

Each of the directivity enhancing circuits 151, 152, 153, and 154 work to dynamically increase a channel signal of the signal Si1, signal Si2, signal Sadd, and signal Sdiff with a level which is greater than the other channel signals, so as to realize apparent improvement in separation from other channels.

Next, another conventional example will be described with reference to FIG. 35 through FIG. 37D. In this example, as shown in FIG. 35, decorrelation processing units 171, 172, 173, and 174 are provided instead of the directivity enhancing circuits 151, 152, 153, and 154 in the example in FIG. 34.

The decorrelation processing units 171 through 174 are each configured of filers having properties such as shown in, for example, FIG. 36A, FIG. 36B, FIG. 36C, and FIG. 36D, or FIG. 37A, FIG. 37B, FIG. 37C, and FIG. 37D.

With FIG. 36A, FIG. 36B, FIG. 36C, and FIG. 36D, decorrelation of the channels is realized by mutually shifting the phase at the hatched frequency bands. With FIG. 37A, FIG. 37B, FIG. 37C, and FIG. 37D, decorrelation of the channels is realized by removing bands differing among the channels.

Playing the pseudo 4-channel signals generated at the decoding device 10 shown in the example in FIG. 35 and output from the output terminals 161 through 164, from different speakers each, ensures noncorrelation among the channels, so sound field reproduction with a good spread can be realized.

The Patent Document to reference for this is PCT Japanese Translation Patent Publication No. 2003-515771.

However, with the method in FIG. 34 described above, while separation of sound sources of three or more encoded channels from the signals Si1 and Si2 can be realized to a certain extent, there are the following problems.

(1) While good separation can be obtained in a state where only one sound source is present, there is no difference in level among the channels in a state wherein all sound sources are present at generally the same level at the same time, so the directivity enhancement circuits 151 through 154 do not operate, and accordingly only 3 dB of separation can be ensured among the channels.

(2) The signal levels of the sound sources dynamically change due to the directivity enhancement circuits 151 through 154, and accordingly unnatural increases/decreases in sound readily occur.

(3) When two adjacent sound sources are present, one sound source may be dragged by the other.

(4) There are little separation effects except with sound sources encoded with separation in mind.

Also, the method described above with FIG. 34 also has the following problems. That is to say, with the method using the decorrelation processing in the example in FIG. 34, frequency band phases are shifted or bands are removed regardless of the type of sound source, so while a sound field with a good spread can be obtained, sound sources cannot be separated, and accordingly a clear sound image cannot be made.

In the event of attempting to separate sound sources from 2-channel stereo signals, the method using directivity enhancement circuits has problems in that separation among sound sources in the event of multiple sound sources being present at the same time is insufficient, there are unnatural volume changes, unnatural sound source movements, and further, sufficient advantages cannot be easily obtained unless pre-encoded sound sources are prepared.

Also, with the pseudo-multi-channel method using decorrelation processing, there has been the problem that the sound image of a sound source is not clearly localized.

It is an object of the present invention to provide an audio signal processing device and method, whereby, from two systems of audio signals in which audio signals of multiple audio sources are included, the audio signals of the multiple audio sources can be suitably separated.

DISCLOSURE OF INVENTION

In order to solve the above problems, an audio signal processing device according to the invention in claim 1 comprises: dividing means for dividing each of two systems of audio signals into multiple frequency bands; level comparison means for calculating a level ratio or a level difference of the two systems of audio signals, at each of the divided multiple frequency bands from the dividing means; and three or more output control means for extracting and outputting frequency band components of and nearby values regarding which the level ratio or the level difference calculated at the level comparison means have been determined beforehand, from the multiple frequency band components of both or one of the two systems of audio signal from the dividing means;

wherein the frequency band components extracted and output by the three or more output control means are frequency band components of and nearby the values determined beforehand, of which the level ratio or the level difference are different one from another.

With the invention in claim 1, the fact that the audio signals of multiple sound sources are mixed in the two systems of audio signals at a predetermined level ratio or level difference, is taken advantage of. With the invention in claim 1, each of two systems of audio signals is divided into multiple frequency bands by the dividing means.

With the level comparison means, the level ratio or level difference of the two systems of audio signals is calculated for each of the frequency bands into which the audio signals have been divided.

With each of the three or more output control means, frequency band signal components of and nearby values regarding which the level ratio or the level difference calculated at the level comparison means have been determined beforehand for each output control means are extracted from both or one of the two systems of output signals.

Now, if the level ratio or level difference determined beforehand for each output control means is set to the level ratio or level difference at which audio signals of a particular sound source is mixed in the two systems of audio signals, the frequency components making up the audio signals of the particular sound source can be obtained form each of the output control means. That is to say, audio signals of a particular sound source are each extracted from each of three or more output control means.

The invention according to claim 2 comprises:

first and second orthogonal transform means for transforming two systems of input audio time-sequence signals into respective frequency region signals;

frequency division spectral comparison means for comparing the level ratio or level difference between corresponding frequency division spectrums from the first orthogonal transform means and the second orthogonal transform means;

frequency division spectral control means made up of three or more sound source separating means for controlling the level of frequency division spectrums obtained from both or one of the first and second orthogonal transform means based on the comparison results at the frequency division spectral comparison means, so as to extract and output frequency band components of and nearby values regarding which the level ratio or the level difference have determined beforehand; and three or more inverse orthogonal transform means for restoring the frequency region signals from each of the three or more sound source separating means of the frequency division spectral control means, into time-sequence signals;

wherein output audio signals are obtained from each of the three or more inverse orthogonal transform means.

With the invention in claim 2, the two systems of input audio time-sequence signals are each transformed into respective frequency region signals by first and second orthogonal transform means, and each transformed into components made up of multiple frequency division spectrums.

With the invention in claim 2, the level ratio or level difference between corresponding frequency division spectrums from the first orthogonal transform means and the second orthogonal transform means are compared by the frequency division spectral comparison means.

At each of the three or more output control means, the level of frequency division spectrums obtained from both or one of the first and second orthogonal transform means are controlled based on the comparison results at the frequency division spectral comparison means, and frequency band components of and nearby values regarding which the level ratio or the level difference have determined beforehand are extracted and output. The extracted frequency region signals are then restored to time-sequence signals.

Accordingly, if the predetermined level ratio or level difference is set at each of the multiple output control means to the level ratio or level difference at which the audio signals of the particular sound source are mixed in the two systems of audio signals, frequency region components making up the audio signals of the particular sound source set to each of the output control means are extracted and obtained from both or one of the two systems of audio signals by the output control means. That is to say, audio signals of a particular sound source extracted from the two systems of input audio time-sequence signals are obtained from each of the three or more output control means.

Also, the invention in claim 3 comprises:

first and second orthogonal transform means for transforming two systems of input audio time-sequence signals into respective frequency region signals;

phase difference calculating means for calculating the phase difference between corresponding frequency division spectrums from the first orthogonal transform means and the second orthogonal transform means;

frequency division spectral control means made up of three or more sound source separating means for controlling the level of frequency division spectrums obtained from both or one of the first and second orthogonal transform means based on the phase difference calculated at the phase difference calculating means, so as to extract and output frequency band components of and nearby values regarding which the phase difference have been determined beforehand; and three or more inverse orthogonal transform means for restoring the frequency region signals from each of the three or more sound source separating means of the frequency division spectral control means, into time-sequence signals;

wherein output audio signals are obtained from each of the three or more inverse orthogonal transform means.

With the invention in claim 3, the two systems of input audio time-sequence signals are transformed into respective frequency region signals by the first and second orthogonal transform means, and each are transformed into components made up of multiple frequency division spectrums.

Also, with claim 3, the phase difference between corresponding frequency division spectrums from the first orthogonal transform means and the second orthogonal transform means are calculated by the phase difference calculating means.

Also, at each of the three or more sound source separating means, the level of frequency division spectrums obtained from both or one of the first and second orthogonal transform means is controlled based on the calculation results at the phase difference calculating means, and frequency band components of and nearby values regarding which the phase difference have been determined beforehand are extracted and output. The extracted frequency region signals are then restored to time-sequence signals.

Accordingly, if the predetermined phase difference is set to the phase difference at which the audio signals of the particular sound source are mixed in the two systems of audio signals, frequency region components making up the audio signals of the particular sound source are extracted and obtained from at least one of the two systems of audio signals. That is to say, audio signals of a particular sound source are extracted from each of the three or more sound source separation means.

According to this invention, audio signals of three or more multiple sound sources mixed in two systems of audio signals at a predetermined level ratio or level difference, or predetermined phase difference, are separated and output from both or one of the two systems of audio signals, based on the predetermined level ratio or level difference, or predetermined phase difference.

BEST MODE FOR CARRYING OUT THE INVENTION

Embodiments of the audio signal processing device and method according to the present invention will now be described with reference to the drawings.

In the following description, a case will be described regarding sound source separation from stereo audio signals made up of the left channel audio signals SL and right channel audio signals SR described above.

For example, let us say that the audio signals S1 through S5 of the sound sources MS1 through MS 5 are panned to the left channel audio signals SL and right channel audio signals SR with level difference at the ratios indicated in the following (Expression 1) and (Expression 2).

$$SL=S1+0.9S2+0.7S3+0.4S4 \quad \text{(Expression 1)}$$

$$SR=S5+0.4S2+0.7S3+0.9S4 \quad \text{(Expression 2)}$$

Comparing the (Expression 1) and (Expression 2), the audio signals S1 through S5 of the sound sources MS1 through MS 5 are distributed to the left channel audio signals SL and right channel audio signals SR with level differences as described above, so the original sound sources can be separated as long as the sound sources can be panned from the left channel audio signals SL and/or right channel audio signals SR again.

In the following embodiment, the fact that each sound source generally has different spectral components is employed to convert each of the two left and right channels of stereo audio signals into frequency regions having sufficient resolution by way of FFT processing, thereby separating into multiple frequency division spectral components. The level ratio or level difference among corresponding frequency division spectrums is then obtained for the audio signals of each of the channels.

The frequency division spectrums regarding which the obtained level ratio or level difference correspond to in (Expression 1) and (Expression 2) for each of the audio signals of the sound sources to be separated are then detected. In the event that frequency division spectrums, which are the level ratio or level difference regarding each of the audio signals of the sound sources to be separated, are detected, the detected frequency division spectrums are separated for each sound source, thereby enabling sound source separation which is not affected much by other sound sources.

[Example of Acoustic Reproduction System to which an Embodiment of the Present Invention is Applied]

Figure 2:
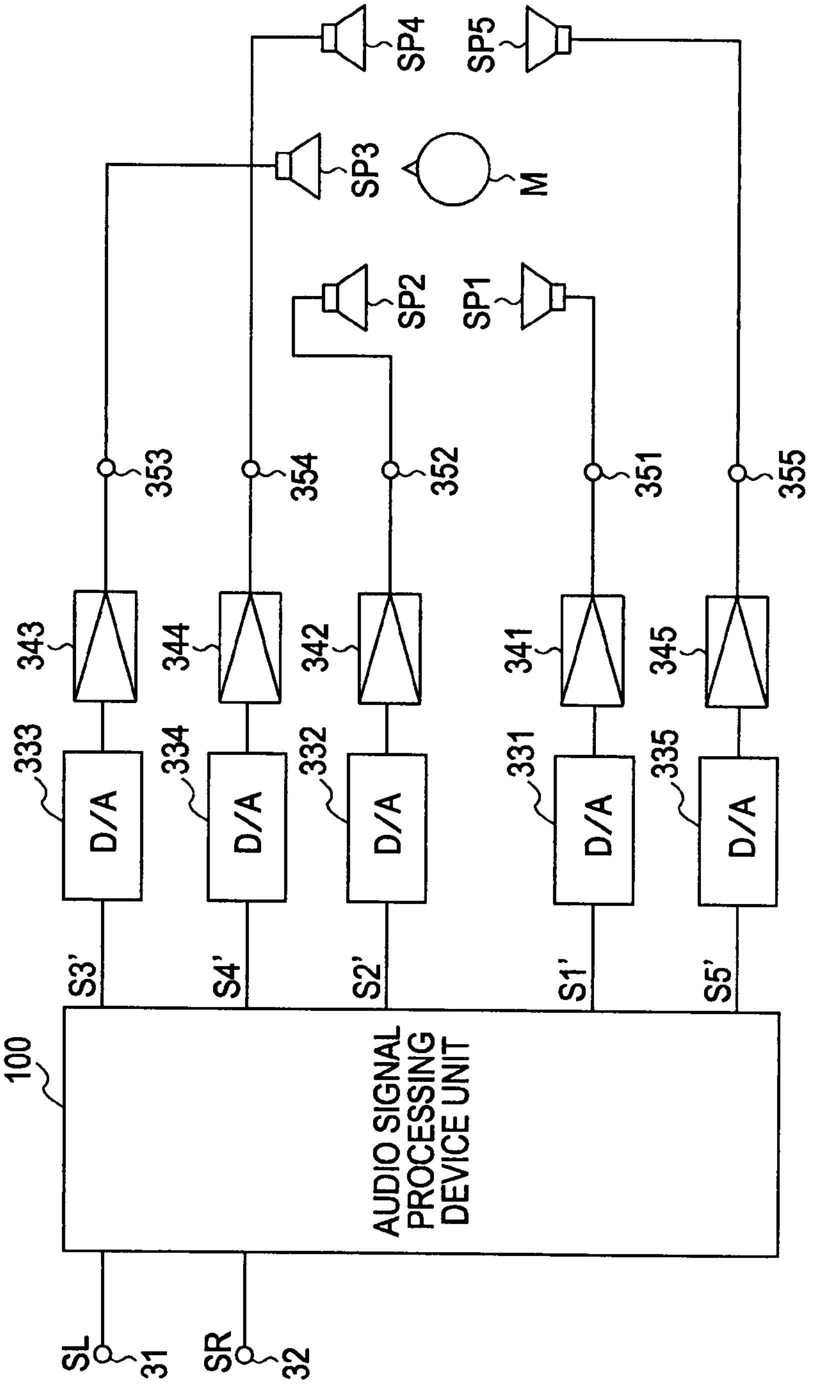
FIG. 2 is a block diagram illustrating a configuration example of an audio playing system to which the first embodiment has been applied.

FIG. 2 is a block diagram illustrating the configuration of an acoustic reproduction system to which a first embodiment of the audio signal processing device according to the present invention has been applied. The acoustic reproduction system separates the five sound source signals from the two left and right channels of stereo audio signals SL and SR made up of the five sound source signals such as in the above-described (Expression 1) and (Expression 2), and performs acoustic reproduction of the separated five sound source signals from five speakers SP1 through SP5.

That is to say, the left channel audio signals SL and the right channel audio signals SR are supplied via input terminals 31 and 32 to an audio signal processing device unit 100, which is the embodiment of the audio signal processing device. With this audio signal processing device unit 100, audio signals S1', S2', S3', S4', and S5', of the five sound sources, are separated and extracted from the left channel audio signals SL and the right channel audio signals SR.

Each of the audio signals S1', S2', S3', S4', and S5', of the five sound sources that have been separated and extracted by the audio signal processing device unit 100 are converted into analog signals by D/A converters 331, 332, 333, 334, and 335, respectively, and then supplied to speakers SP1, SP2, SP3, SP4, and SP5, via amplifiers 341, 342, 343, 344, and 345, and output terminals 351, 352, 353, 354, and 355, respectively, and acoustically reproduced.

Now, in the example in FIG. 2, with the frontal direction of the listener M as the direction of the speaker SP3, the speakers SP1, SP2, SP3, SP4, and SP5 are positioned at the rear left, rear right, front center, front left, and front right positions respectively, as to the listener M, with the audio signals S1', S2', S3', S4', and S5', of the five sound sources serving as a rear left (LS: Left-Surround) channel, (RS: Right-Surround) channel, center channel, left (L) channel, and right (R) channel, respectively.

[Configuration of Audio Signal Processing Device Unit 100 (First Embodiment of Audio Signal Processing Device)]

Figure 1:
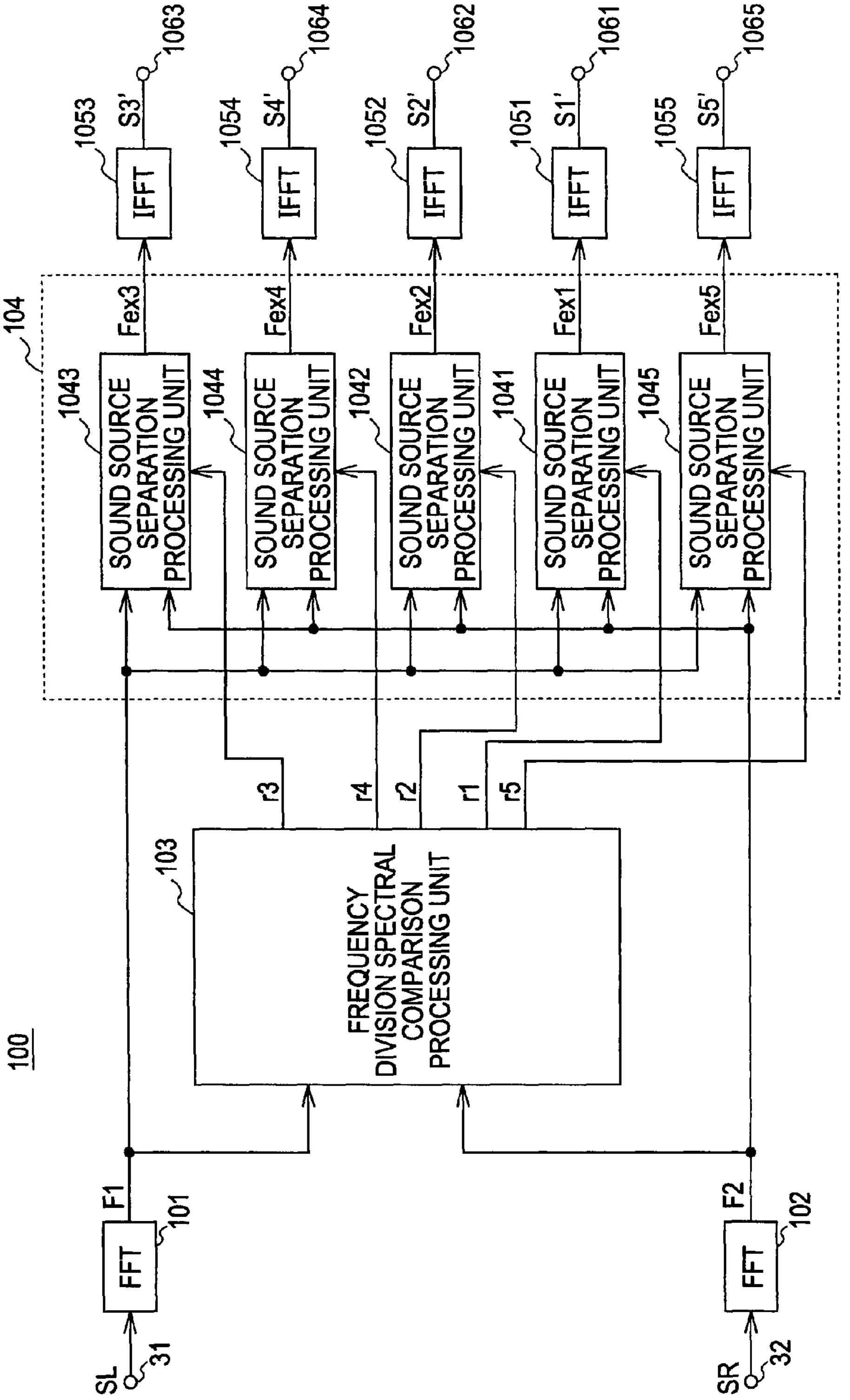
FIG. 1 is a block diagram illustrating a configuration example of a first embodiment of an audio signal processing device according to the present invention.

FIG. 1 illustrates a first example of the audio signal processing device unit 100. In this first example of the audio signal processing device unit 100, of the two channels of stereo signals, the left channel audio signals SL are supplied to an FFT (Fast Fourier Transform) unit 101 serving as an example of D/A conversion means, and following being converted into digital signals in the event of being analog signals, the signals SL are subjected to FFT processing (Fast Fourier Transform), and the time-sequence audio signals are converted into frequency region data. It is needless to say that the analog/digital conversion at the FFT 101 is unnecessary if the signals SL are digital signals.

On the other hand, of the two channels of stereo signals, the right channel audio signals SR are supplied to an FFT unit 102 serving as an example of D/A conversion means, and following being converted into digital signals in the event of being analog signals, the signals SR are subjected to FFT processing (Fast Fourier Transform), and the time-sequence audio signals are converted into frequency region data. It is needless to say that the analog/digital conversion at the FFT 102 is unnecessary if the signals SR are digital signals.

The FFT units 101 and 102 in this example have the same configurations, and divide the time-sequence signals SL and SR into frequency division spectrums of multiple frequencies which are different from one another. The number of frequency divisions obtained as the frequency division spectrums is a plurality corresponding to the precision of separation of sound sources, with the number of frequency separations being 500 or more for example, and preferably 4000 or more. The number of frequency divisions is equivalent to the number of points of the FFT unit.

Frequency division spectral output F1 and F2 from the FFT unit 101 and FFT unit 102 respectively are each supplied to a frequency division spectral comparison processing unit 103 and a frequency division spectral control processing unit 104.

The frequency division spectral comparison processing unit 103 calculates the ratio level for the same frequencies between the frequency division spectral output F1 and F2 from the FFT unit 101 and FFT unit 102, and output the calculated level ratio to the frequency division spectral control processing unit 104.

The frequency division spectral control processing unit 104 has sound source separation processing units 1041, 1042, 1043, 1044, and 1045, of a number corresponding to the number of audio signals of the multiple sound sources to be separated and extracted, which is five in this example. In this example, each of the five sound source separation processing units 1041 through 1045 are supplied with the output F1 of the FFT unit 101 and the output F2 of the FFT unit 102, and the information of the level ratio calculated at the frequency division spectral comparison processing unit 103.

Each of the sound source separation processing units 1041, 1042, 1043, 1044, and 1045 receives the level ratio information from the frequency division spectral comparison processing unit 103, extracts only frequency division spectral components wherein the level ratio is equal to the distribution ratio between the two channel signals SL and SR for the sound source signals to be separated and extracted, from at least one of the FFT unit 101 and FFT unit 102, both in this case, and outputs the extraction result outputs Fex1, Fex2, Fex3, Fex4, and Fex5, to respective inverse FFT units 1051, 1052, 1053, 1054, and 1055.

Each of the sound source separation processing units 1041, 1042, 1043, 1044, and 1045 is set beforehand by the user regarding frequency division spectral components of what sort of level ratios to extract, according to the sound source to be separated. Accordingly, each of the sound source separation processing units 1041, 1042, 1043, 1044, and 1045 are configured such that only frequency division spectral components of audio signals of sound sources panned to the two left and right channels, set by the user at a level ratio for separation, are extracted.

Each of the inverse FFT units 1051, 1052, 1053, 1054, and 1055 converts the frequency division spectral components of the extraction result outputs Fex1, Fex2, Fex3, Fex4, and Fex5, from the respective sound source separation processing units 1041, 1042, 1043, 1044, and 1045 of the frequency division spectral control processing unit 104, into the original time-sequence signals, and outputs the converted output signals as the audio signals S1', S2', S3', S4', and S5', of the five sound sources which the user has set for separation, from the output terminals 1061, 1062, 1063, 1064, and 1065.

[Configuration of Frequency Division Spectral Comparison Processing Unit 103]

Figure 3:
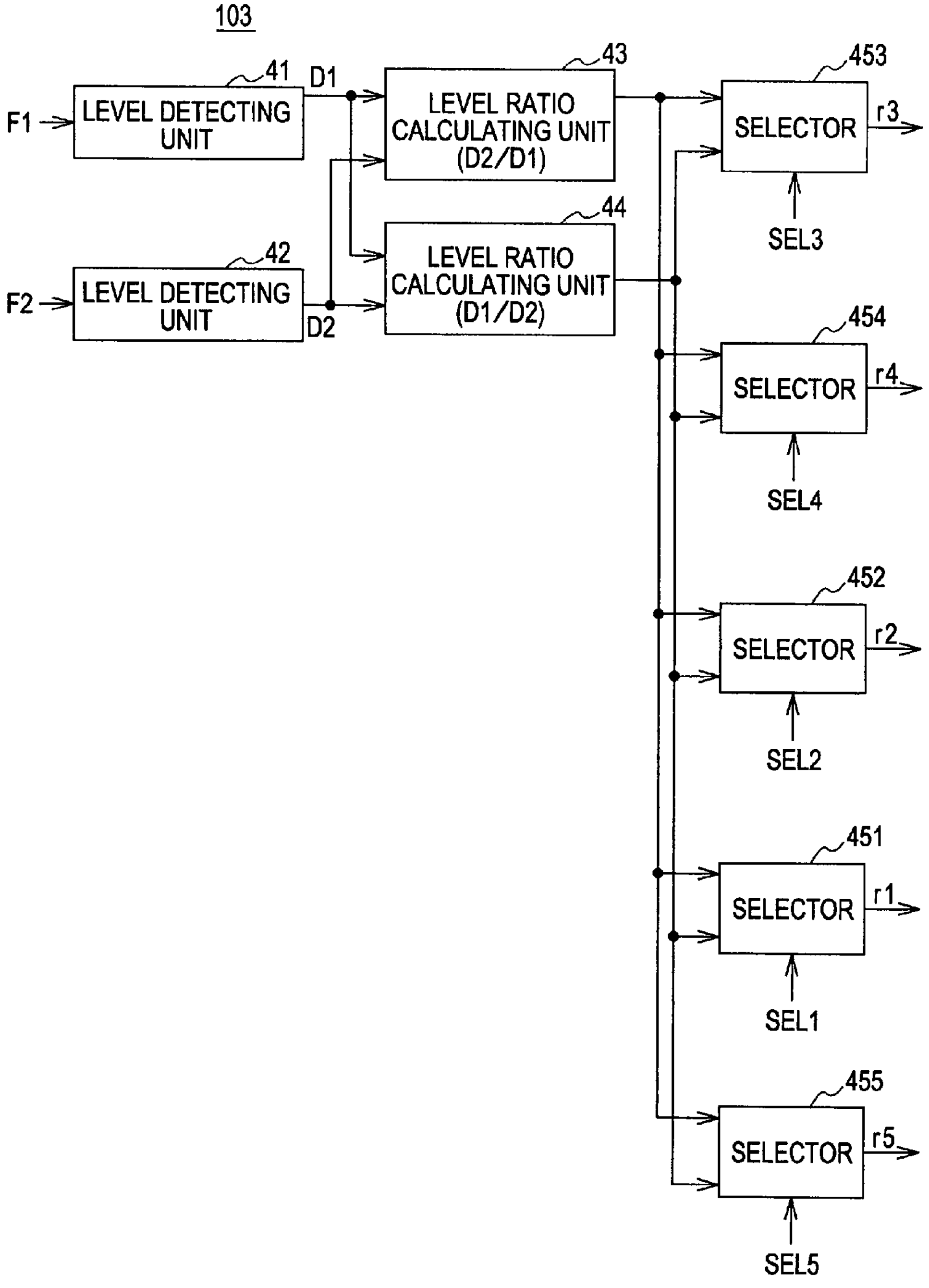
FIG. 3 is a block diagram illustrating a configuration example of a frequency division spectral comparison processing unit, which is a part of FIG. 1.

In this example, the frequency division spectral comparison processing unit 103 functionally has a configuration such as shown in FIG. 3. That is to say, the frequency division spectral comparison processing unit 103 is configured of level detecting units 41 and 42, level ratio calculating units 43 and 44, and selectors 451, 452, 453, 454, and 455.

The level detecting unit 41 detects the level of each frequency component of the frequency division spectral component F1 from the FFT unit 101, and outputs the detection output D1 thereof. Also, the level detecting unit 42 detects the level of each frequency component of the frequency division spectral component F2 from the FFT unit 102, and outputs the detection output D2 thereof. In this example, the amplitude spectrum is detected as the level of each frequency division spectrum. Note that the power spectrum may be detected as the level of each frequency division spectrum.

The level ratio calculating unit 43 them calculates D2/D1. Also, the level ratio calculating unit 44 calculates the inverse D1/D2. The level ratios calculated at the level ratio calculating units 43 and 44 are supplied to each of selectors 451, 452, 453, 454, and 455. One level ratio thereof is then extracted from each of the selectors 451, 452, 453, 454, and 455, as output level ratios r1, r2, r3, r4, and r5.

Each of the selectors 451, 452, 453, 454, and 455 are supplied with selection control signals SEL1, SEL2, SEL3, SEL4, and SEL5, for performing selection control regarding to which to select, the output of the level ratio calculating unit 43 or the output of the level ratio calculating unit 44, according to the sound source set by the user to be separated and the level ratio thereof. The output level ratios r obtained from each of the selectors 451, 452, 453, 454, and 455 are supplied to the respective sound source separation processing units 1041, 1042, 1043, 1044, and 1045 of the frequency division spectral control processing unit 104.

In this example, with each of the sound source separation processing units 1041, 1042, 1043, 1044, and 1045 of the frequency division spectral control processing unit 104, values used as level ratios of sound sources to be separated are always such that level ratio≦1. That is to say, the level ratios r input to each of the sound source separation processing units 1041, 1042, 1043, 1044, and 1045 are such that the level of the frequency division spectrum which is of a smaller level has been divided by the level of the frequency division spectrum which is of a greater level.

Accordingly, with each of the sound source separation processing units 1041, 1042, 1043, 1044, and 1045, in the event of separating sound source signals distributed so as to be included more in the left channel audio signals SL, the level ratio calculation output from the level ratio calculation unit 43 is used, and conversely, in the event of separating sound source signals distributed so as to be included more in the right channel audio signals SR, the level ratio calculation output from the level ratio calculation unit 44 is used.

For example, in the event that the user is to perform setting input of distribution factor values PL and PR (wherein (PL and PR are values of 1 or smaller) of the left channel and the right channel as the level ratio of the sound source to be separated, the distribution factor values PL and PR are such that PR/PL<1, the selection control signals SEL1, SEL2, SEL3, SEL4, and SEL5 are selection control signals wherein the output of the level ratio calculating unit 43 (D2/D1) is taken as output level ratio r from each of the selectors 451, 452, 453, 454, and 455, and the distribution factor values PL and PR are such that PR/PL>1, the selection control signals SEL1, SEL2, SEL3, SEL4, and SEL5 are selection control signals wherein the output of the level ratio calculating unit 44 (D1/D2) is taken as output level ratio r from each of the selectors 451, 452, 453, 454, and 455.

Note that in the event that the distribution factor values PL and PR set by the user are equal (wherein level ratio=1), either the output of the level ratio calculating unit 43 or the output of the level ratio calculating unit 44 may be selected at each of the selectors 451, 452, 453, 454, and 455.

[Configuration of Sound Source Separation Processing Unit of Frequency Division Spectral Control Processing Unit 104]

Figure 4:
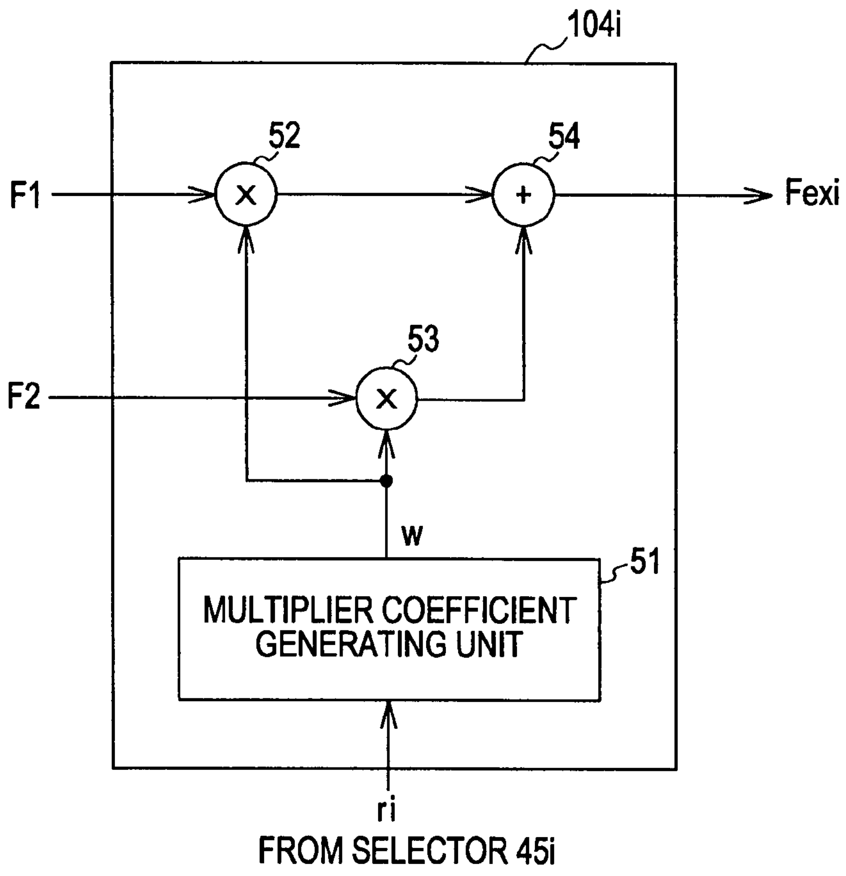
FIG. 4 is a block diagram illustrating a configuration example of a frequency division spectral control processing unit, which is a part of FIG. 1.

Each of the sound source separation processing units 1041, 1042, 1043, 1044, and 1045 of the frequency division spectral control processing unit 104 have the same configuration, and in this example functionally have a configuration such as shown in FIG. 4. That is to say, the sound source separation processing unit 104*i* shown in FIG. 4 illustrates the configuration of one of the sound source separation processing units 1041, 1042, 1043, 1044, and 1045, and is configured of a multiplier coefficient generating unit 51, multiplication units 52 and 53, and an adding unit 54.

The frequency division spectral component F1 from the FFT unit 101 is supplied to the multiplying unit 52, as well as is the multiplier coefficient w from the multiplier coefficient generating unit 51, and the multiplication results of these are supplied from the multiplying unit 52 to the adding unit 54. Also, the frequency division spectral component F2 from the FFT unit 102 is supplied to the multiplying unit 53, as well as is the multiplier coefficient w from the multiplier coefficient generating unit 51, and the multiplication results of these are supplied from the multiplying unit 53 to the adding unit 54. The output of the adding unit 54 is the output Fexi (wherein Fexi is one of Fex1, Fex2, Fex3, Fex4, or Fex5) of the sound source separation processing unit 104*i*.

The multiplier coefficient generating unit 51 receives output of an output level ratio ri (wherein ri is one of r1, r2, r3, r4, or r5) from a selector 45*i* (wherein selector 45*i* is one of the selectors 451, 452, 453, 454, or 455) of the frequency division spectral comparison processing unit 103, and generates a multiplier coefficient wi corresponding to the level ratio ri. For example, the multiplier coefficient generating unit 51 is configured of a function generating circuit relating to the multiplier coefficient wi wherein the level ratio ri is a variable. What sort of functions are selected as functions to be used by the multiplier coefficient generating unit 51 depends on the distribution factor values PL and PR set by the user according to the sound source to be separated.

The level ratio ri supplied to the multiplier coefficient generating unit 51 changes in increments of the frequency components of the frequency division spectrums, so the multiplier coefficient wi from the multiplier coefficient generating unit 51 also changes in increments of the frequency components of the frequency division spectrums.

Accordingly, with the multiplier 52, the levels of the frequency division spectrums from the FFT unit 101 are controlled by the multiplier coefficient wi, and also, with the multiplier 53, the levels of the frequency division spectrums from the FFT unit 102 are controlled by the multiplier coefficient wi.

Figure 5A:
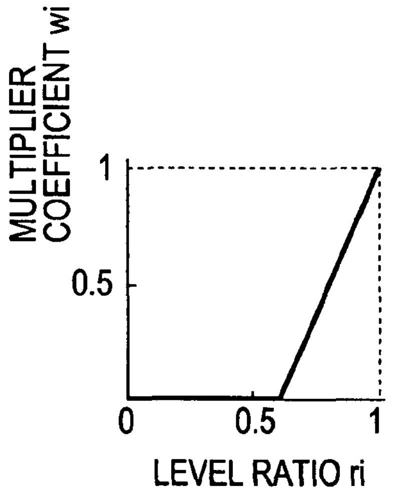
FIG. 5A is a diagram illustrating several examples of a function set to a multiplier coefficient generating unit 51 of the frequency division spectral control processing unit.

FIG. 5A through FIG. 5E show examples of functions used in a function generating circuit serving as the multiplier coefficient generating unit 51. For example, in the case of separating the audio signal S3 of the sound source positioned at the center between sound images of the left and right channels illustrated in (Expression 1) and (Expression 2) above, from the two, left and right channels of audio signals SL and SR, a function generating circuit having properties such as shown in FIG. 5A is used for the multiplier coefficient generating unit 51.

The properties of the function in FIG. 5A is such that in the event that the level ratio ri of the left and right channels is 1, or is near 1, i.e., with frequency division spectral components wherein the left and right channels are at the same level or near the same level, the multiplier coefficient wi is 1 or near 1, and in the region wherein the level ratio ri of the left and right channels is 0.6 or lower, the multiplier coefficient wi is 0.

Accordingly, the multiplier coefficient wi for a frequency division spectral component, wherein the level ratio ri input to the multiplier coefficient generating unit 51 is 1 or is near 1, is 1 or near 1, so the frequency division spectral component is output from the multiplying units 52 and 53 at almost the same level. On the other hand, the multiplier coefficient wi for a frequency division spectral component, wherein the level ratio ri input to the multiplier coefficient generating unit 51 is a value of 0.6 or lower, is 0, so the output level of the frequency division spectral component is taken as 0, and there is no output thereof from the multiplying units 52 and 53.

That is to say, of the multiple frequency division spectral components, the frequency division spectral components wherein the left and right levels are of the same level or close thereto are output at almost the same level, and frequency division spectral components wherein the level difference between the left and right channels is great have the output level thereof taken as 0 and are not output. Consequently, only the frequency division spectral components of the audio signal S3 of the sound source distributed to the audio signals SL and SR of the two left and right channels at the same level are obtained from the adding unit 54.

Figure 5B:
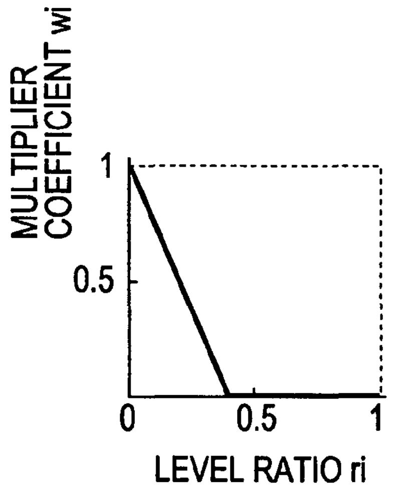
FIG. 5B is a diagram illustrating several examples of a function set to the multiplier coefficient generating unit 51 of the frequency division spectral control processing unit.

Also, in the event of separating the audio signals S1 or S5 of the sound sources positioned at only one side of the left and right channels from the two left and right channels of audio signals SL and SR illustrated in (Expression 1) and (Expression 2) above, a function generating circuit having properties such as shown in FIG. 5B is used for the multiplier coefficient generating unit 51.

In this case with the present embodiment, in the event of separating the audio signal S1, the user inputs the setting of the left/right distribution factor PL:PR=1:0 for the sound source to be separated. Upon the user making such settings, a selection control signal SELi (wherein SELi is one of SEL1, SEL2, SEL3, SEL4, or SEL5) for controlling so as to select the level ratio from the level ratio calculating unit 43 is provided to the selector 45*i*.

On the other hand, in the event of separating the audio signal S5, the user inputs the setting of the left/right distribution factor PL:PR=0:1 for the sound source to be separated. Alternatively, the user inputs settings such that PL=0, PR=1. Upon the user making such settings, a selection control signal SELi for controlling so as to select the level ratio from the level ratio calculating unit 44 is provided to the selector 45*i*.

The properties of the function in FIG. 5B is such that with frequency division spectral components having a level ratio ri of the left and right channels of 0, or near 0, the multiplier coefficient wi is 1 or near 1, and at the region wherein the level ratio ri of the left and right channels is approximately 0.4 or higher, the multiplier coefficient wi is 0.

Accordingly, the multiplier coefficient wi for a frequency division spectral component, wherein the level ratio ri input to the multiplier coefficient generating unit 51 is 0 or is near 0, is 1 or near 1, so the frequency division spectral component is output from the multiplying units 52 and 53 at almost the same level. On the other hand, the multiplier coefficient wi for a frequency division spectral component, wherein the level ratio ri input to the multiplier coefficient generating unit 51 is a value of approximately 0.4 or higher, is 0, so the output level of the frequency division spectral component is taken as 0, and there is no output thereof from the multiplying units 52 and 53.

That is to say, of the multiple frequency division spectral components, the frequency division spectral components wherein one of the left and right channels is very great as compared to the other are output at almost the same level, and frequency division spectral components wherein the left and right channels have little difference in level have the output level thereof taken as 0 and are not output. Consequently, only the frequency division spectral components of the audio signals S1 or S5 of the sound source distributed to only one of the audio signals SL and SR of the two left and right channels are obtained from the adding unit 54.

Figure 5C:
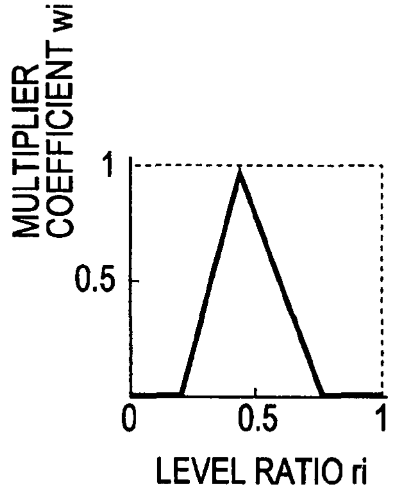
FIG. 5C is a diagram illustrating several examples of a function set to the multiplier coefficient generating unit 51 of the frequency division spectral control processing unit.

Also, in the event of separating the audio signals S2 or S4 of the sound sources distributed with certain level difference between the left and right channels, from the two left and right channels of audio signals SL and SR illustrated in (Expression 1) and (Expression 2) above, a function generating circuit having properties such as shown in FIG. 5C is used for the multiplier coefficient generating unit 51.

That is to say, the audio signal S2 is distributed to the left and right channels at a level ratio of D2/D1 (=SR/SL)=0.4/0.9=0.44. Also, the audio signal S4 is distributed to the left and right channels at a level ratio of D1/D2 (=SL/SR)=0.4/0.9=0.44.

In this case with the present embodiment, in the event of separating the audio signal S2, the user inputs the setting of the left/right distribution factor PL:PR=0.9:0.4 for the sound source to be separated. Alternatively, the user inputs settings such that PL=0.9, PR=0.4. Upon the user making such settings, a selection control signal for controlling so as to select the level ratio from the level ratio calculating unit 43 is provided to the selector, since PR/PL<1 holds.

On the other hand, in the event of separating the audio signal S4, the user inputs the setting of the left/right distribution factor PL:PR=0.4:0.9 for the sound source to be separated. Alternatively, the user inputs settings such that PL=0.4, PR=0.9. Upon the user making such settings, a selection control signal SELi for controlling so as to select the level ratio from the level ratio calculating unit 44 is provided to the selector 45*i*, since PR/PL>1 holds.

The properties of the function in FIG. 5C is such that with frequency division spectral components having a level ratio ri of the left and right channels wherein D2/D1 (=PR/PL)=0.4/

0.9=0.44, or the level ratio ri is near 0.44, the multiplier coefficient wi is 1 or near 1, and at the region wherein the level ratio ri of the left and right channels is other than near to approximately 0.44, the multiplier coefficient wi is 0.

Accordingly, the multiplier coefficient wi for a frequency division spectral component wherein the level ratio ri from the selector 45*i* is 0.44 or is near 0.44, is 1 or near 1, so the frequency division spectral component is output from the multiplying units 52 and 53 at almost the same level. On the other hand, the multiplier coefficient wi for a frequency division spectral component, wherein the level ratio ri from the selector 45*i* is a value of approximately 0.44 or lower or approximately 0.44 or higher, is 0, so the output level of the frequency division spectral component is taken as 0, and there is no output thereof from the multiplying units 52 and 53.

That is to say, of the multiple frequency division spectral components, the frequency division spectral components wherein the level ratio of the left and right channels is 0.44 or nearby are output at almost the same level, and frequency division spectral components wherein the level ratio ri is a value of approximately 0.44 or lower or approximately 0.44 or higher have the output level thereof taken as 0 and are not output.

Consequently, only the frequency division spectral components of the audio signals S2 or S4 of the sound source distributed to the audio signals SL and SR of the two left and right channels with a level ratio of 0.44 are obtained from the adding unit 54.

Thus, according to the present embodiment, with the sound source separation processing units 1041, 1042, 1043, 1044, and 1045, audio signals of sound sources distributed at a predetermined distribution ratio to the two left and right channels can be separated from the audio signals of the two channels based on the distribution ratio thereof.

In this case, with the above-described embodiment, audio signals of a sound source to be separated at the sound source separation processing units 1041, 1042, 1043, 1044, and 1045, are extracted from both of the audio signals of the two channels, but separating and extracting from both channels is not necessarily imperative, and an arrangement may be made wherein this is separated and extracted from only the one channel where an audio signal component of a sound source to be separated is contained.

Also, with the above-described embodiment, at the audio signal processing device unit 100, the sound source signals are separated from the two systems of sound signals based on the level ratio of the sound source signals distributed to the two systems of audio signals, but an arrangement may be made wherein the signals of the sound source can be separated and extracted from at least one of the two systems of audio signals based on the level difference of the signals of the sound source as to the two systems of audio signals.

Note that the above description has been made with reference to an example of two left and right channels of stereo signals, with the sound sources being distributed to the left and right channels according to (Expression 1) and (Expression 2), but the pertinent sound source can be separated following selection properties of the functions shown in FIG. 5A through FIG. 5E even with normal stereo music signals which have not been intentionally distributed.

Figure 5D:
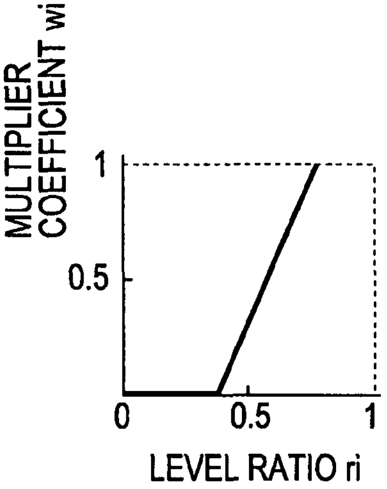
FIG. 5D is a diagram illustrating several examples of a function set to the multiplier coefficient generating unit 51 of the frequency division spectral control processing unit.
Figure 5E:
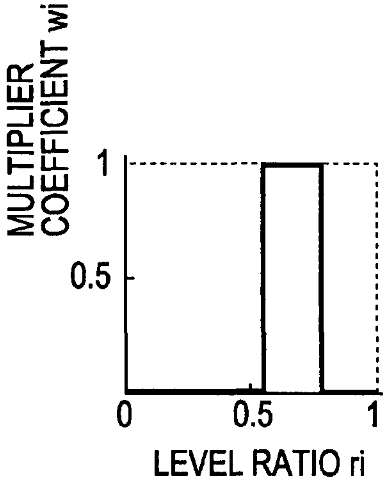
FIG. 5E is a diagram illustrating several examples of a function set to the multiplier coefficient generating unit 51 of the frequency division spectral control processing unit.

Also, different sound source selectivity can be provided, such as changing, widening, narrowing, etc., the level ratio range to be separated, by changing the function as with FIG. 5D, FIG. 5E, and so forth, as other examples.

With regard to spectrum configuration of the sound source, many stereo audio signals are configured with sound sources having differing spectrums, but these sound sources also can be separated similarly as that described above.

Also, the quality of sound source separation can be further improved regarding sound sources with much spectral overlapping as well, by raising the frequency resolution at the FFT units 101 and 102 so as to use FFT circuits with 4000 points or more, for example.

[Second Embodiment of Configuration of Audio Signal Processing Device Unit 100]

With the above-described first embodiment, sound source separation processing units are provided for the audio signals of all of the sound sources to be separated, and the audio signals of all of the sound sources to be separated from the two systems of audio signals, the two left and right channel stereo signals SL and SR in the above example, are separated and extracted from one of the two systems of audio signals using a predetermined level ratio or level difference at which the audio signals of the sound sources have been distributed in the two channels of stereo signals.

However, there is no need to separate and extract all sound source audio signals, and an arrangement may be made wherein, following separation and extracting of a part of the sound source audio signals from the left or right channel audio signals, the audio signals of the sound source separated and extracted are subtracted from the left channel or right channel, thereby separating and extracting the other sound source audio signals as residuals thereof.

Figure 6:
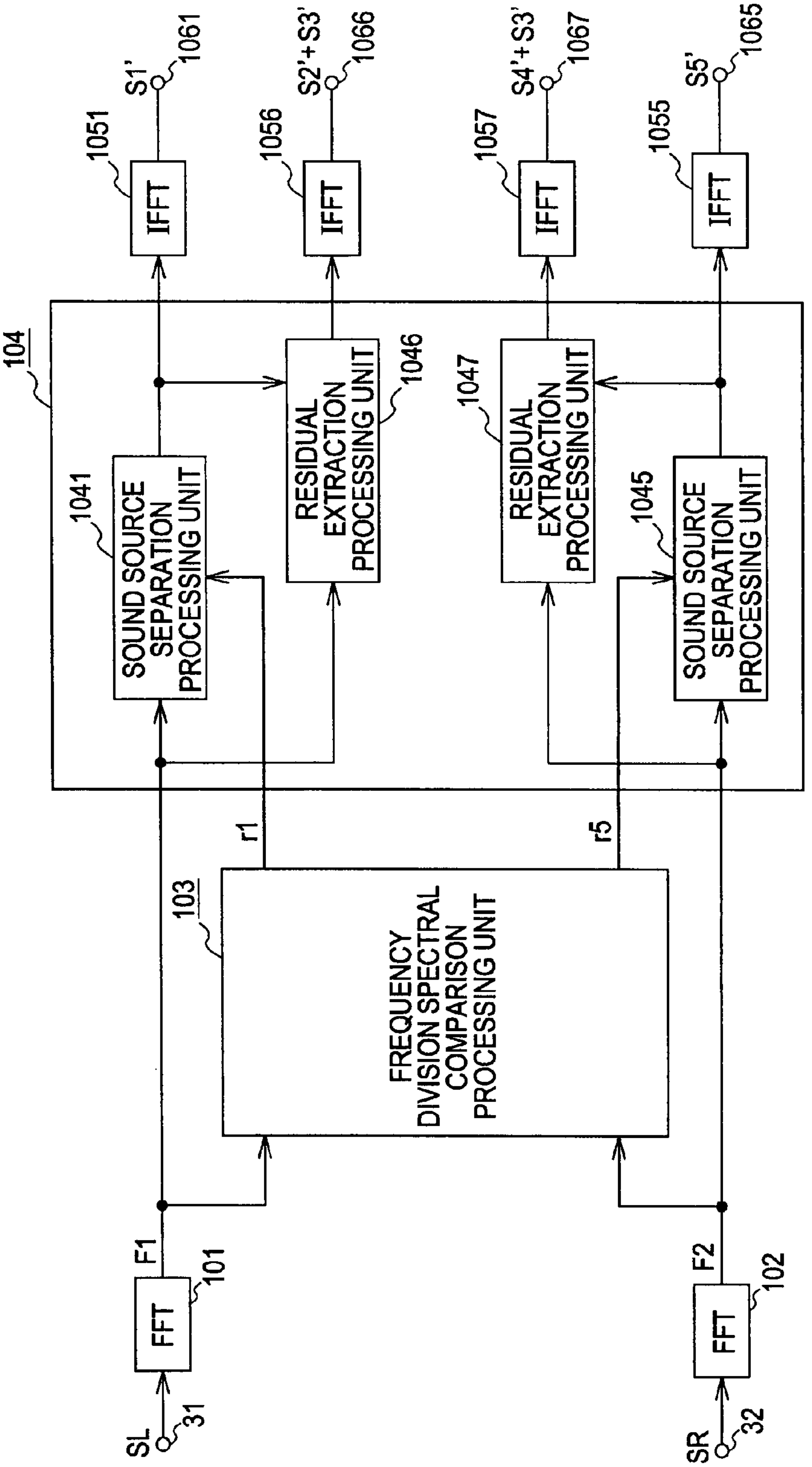
FIG. 6 is a block diagram illustrating a configuration example of a second embodiment of an audio signal processing device according to the present invention.

The second embodiment described below is an example of this case. FIG. 6 is a block diagram illustrating an example thereof.

With the example in FIG. 6, the audio signals S1 of a sound source MS1 are separated and extracted from left channel audio signals SL using a sound source separation processing unit, and also the audio signals S1 that have been separated and extracted are subtracted from the left channel audio signals SL, thereby yielding the sum of audio signals S2 of a sound source MS2 and audio signals S3 of a sound source MS3.

Also, audio signals S5 of a sound source MS5 are separated and extracted from right channel audio signals SR using a sound source separation processing unit, and also the audio signals S5 that have been separated and extracted are subtracted from the right channel audio signals SR, thereby yielding a signal of the sum of audio signals S4 of a sound source MS4 and audio signals S3 of the sound source MS3.

That is to say, as shown in FIG. 6, with this second embodiment, the frequency division spectral control processing unit 104 is provided with sound source separation processing units 1041 and 1045, and residual extraction processing units 1046 and 1047.

With this second embodiment, the sound source separation processing unit 1041 is supplied with only the frequency regions signals F1 of the left channel audio signals from the FFT unit 101, and the signals F1 are also supplied to the residual extraction processing unit 1046. The frequency regions signals of the sound source 1 extracted from the sound source separation processing unit 1041 are supplied to the residual extraction processing unit 1046, and subtracted from the frequency regions signals F1.

Also, the sound source separation processing unit 1045 is supplied with only the frequency regions signals F2 of the right channel audio signals from the FFT unit 102, and the signals F2 are also supplied to the residual extraction processing unit 1047. The frequency regions signals of the sound source MS5 extracted from the sound source separation processing unit 1045 are supplied to the residual extraction processing unit 1047, and subtracted from the frequency regions signals F2.

The level ratio r1 from the frequency division spectral comparison processing unit 103 is supplied to the sound source separation processing unit 1041, and the level ratio r5 from the frequency division spectral comparison processing unit 103 is supplied to the sound source separation processing unit 1045.

Accordingly, in the example shown in FIG. 6, the sound source separation processing unit 1041 is configured of the multiplier coefficient generating unit 51 shown in FIG. 4 and one multiplying unit 52, the sound source separation processing unit 1045 is configured of the multiplier coefficient generating unit 51 shown in FIG. 4 and one multiplying unit 53, and both are of a configuration wherein the adding unit 54 is unnecessary.

Also, the frequency division spectral comparison processing unit 103 needs to use only the selectors 451 and 455 of the configuration in FIG. 3, so the selectors 452 through 454 are unnecessary.

In this configuration, with the sound source separation processing unit 1041, only frequency region signals of the sound source MS1 are extracted only from the frequency region signals F1, which are supplied to the inverse FFT unit 1051. Accordingly, audios signals S1' of the time region of the sound source MS1 are obtained at the output terminal 1061.

At the residual extraction processing unit 1046, the frequency region signals of the sound source MS1 from the sound source separation processing unit 1041 are subtracted from the frequency region signals F1 from the FFT unit 101, thereby yielding residual frequency region signals. The frequency region signals which are the residual output from the residual extraction processing unit 1046 are signals which are the sum of the frequency region signals of the sound source MS2 and the frequency region signals of the sound source MS3, based on the (Expression 1).

The output of the residual extraction processing unit 1046 is supplied to the inverse FFT unit 1056, with signals obtained from the inverse FFT unit 1056 which are signals of the sum of the frequency region signals of the sound source MS2 and the frequency region signals of the sound source MS3 which have been restored to signals of the time region, i.e., signals which are the sum of the audio signals of the sound source MS2 and the sound source M3 (S2'+S3'), which are extracted from the output terminal 1066.

Also, with the sound source separation processing unit 1045, only frequency region signals of the sound source MS5 are extracted only from the frequency region signals F2, which are supplied to the inverse FFT unit 1055. Accordingly, audios signals S5' of the time region of the sound source MS5 are obtained at the output terminal 1065.

At the residual extraction processing unit 1047, the frequency region signals of the sound source MS5 from the sound source separation processing unit 1045 are subtracted from the frequency region signals F2 from the FFT unit 102, thereby yielding residual frequency region signals. The frequency region signals which are the residual output from the residual extraction processing unit 1047 are signals which are the sum of the frequency region signals of the sound source MS4 and the frequency region signals of the sound source MS3, based on the (Expression 2).

The output of the residual extraction processing unit 1047 is supplied to the inverse FFT unit 1057, with signals obtained from the inverse FFT unit 1056 which are signals of the sum of the frequency region signals of the sound source MS4 and the frequency region signals of the sound source MS3 which have been restored to signals of the time region, i.e., signals which are the sum of the audio signals of the sound source MS4 and the sound source M3 (S4'+S3'), which are extracted from the output terminal 1067.

With this second embodiment, the D/A converter 333 and amplifier 343 and speaker SP3 for the audio signals S3' are removed from FIG. 2, and digital audio signals from the output terminals 1061, 1065, 1066, and 1067 are each acoustically reproduced at the speakers as follows.

That is to say, the digital audio signal S1' from the output terminal 1061 is converted into analog audio signals by the D/A converter 331, supplied to the speaker SP1 via the amplifier 341 and acoustically reproduced, and also, the digital audio signal S5' from the output terminal 1065 is converted into analog audio signals by the D/A converter 335, supplied to the speaker SP5 via the amplifier 345 and acoustically reproduced.

Further, the digital audio signal (S2'+S3') from the output terminal 1066 is converted into analog audio signals by the D/A converter 332, supplied to the speaker SP2 via the amplifier 342 and acoustically reproduced, and the digital audio signal (S4'+S3') from the output terminal 1067 is converted into analog audio signals by the D/A converter 334, supplied to the speaker SP4 via the amplifier 344 and acoustically reproduced. In this case, the placement of the speaker SP2 and speaker SP4 as to the listener M may be changed from that in the case of the first embodiment.

[Third Embodiment of Configuration of Audio Signal Processing Device Unit 100]

The third embodiment is a modification of the second embodiment. That is to say, with the second embodiment, the frequency region signals of a particular sound source separated and extracted from the frequency region signals F1 or F2 from the FFT unit 101 or FFT unit 102 with the sound source separation processing unit are subtracted from the frequency region signals F1 or F2 from the FFT unit 101 or FFT unit 102, thereby obtaining signals other than the signals of the sound source separated and extracted, in the state of frequency region signals. Accordingly, with the second embodiment, the residual extraction processing unit is provided within the frequency division spectral control processing unit 104.

Figure 7:
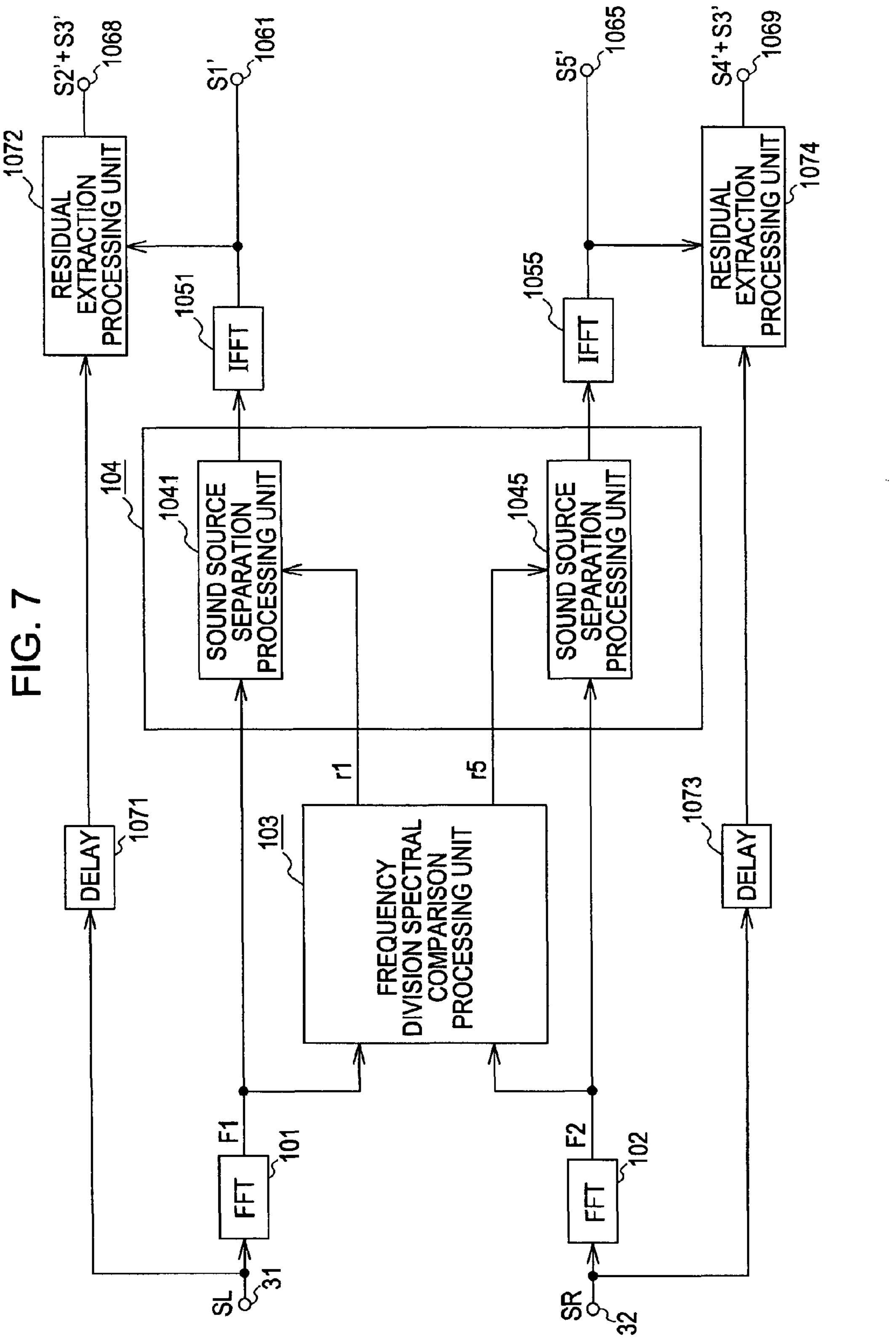
FIG. 7 is a block diagram illustrating a configuration example of a third embodiment of an audio signal processing device according to the present invention.

Conversely, with the third embodiment, the residual processing unit subtracts signals of the sound source separated and extracted in a time region from one of the two systems of input audio signals. FIG. 7 is a block diagram of a configuration example of the audio signal processing device unit 100 according to the third embodiment, and as with the second embodiment, the audio components of the sound sources MS1 and MS5 are separated and extracted at the sound source separation processing units of the frequency division spectral control processing unit 104, however, this is a case wherein the audio components of the outer sound sources are extracted as the residual thereof from the input audio signals.

That is to say, as shown in FIG. 7, with this third embodiment, the configuration of the frequency division spectral comparison processing unit 103 is the same as that of the second embodiment, but the frequency division spectral control processing unit 104 is unlike that of the second embodiment in being configured of a sound source separation processing unit 1041 and a sound source separation processing unit 1045, with the residual extraction processing unit not being provided within this frequency division spectral control processing unit 104.

With the third embodiment, the audio signals SL of the left channel from the input terminal 31 are supplied, via a delay 1071, to a residual extraction processing unit 1072 which extracts the residual of signals in a time region. The audio signals S1' of the time region of the sound source S1 from the inverse FFT unit 1051 are supplied to the residual extraction processing unit 1072, and subtracted from the audio signals SL of the left channel from the delay 1071.

Accordingly, the residual output from the residual extraction processing unit 1072 is digital audio signals (S2'+S3') which is the sum of the time region signals of the sound source MS2 and the time region signals of the sound source MS3, the result of the time region signals S1' of the sound source MS1 being subtracted from the signals SL in the above (Expression 1). This sum of digital audio signals (S2'+S3') is output via the output terminal 1068.

In the same way, the audio signals SR of the right channel from the input terminal 32 are supplied, via a delay 1073, to a residual extraction processing unit 1074 which extracts the residual of signals in a time region. The audio signals S5' of the time region of the sound source S5 from the inverse FFT unit 1055 are supplied to the residual extraction processing unit 1074, and subtracted from the audio signals SR of the right channel from the delay 1073.

Accordingly, the residual output from the residual extraction processing unit 1074 is digital audio signals (S4'+S3') which is the sum of the time region signals of the sound source MS4 and the time region signals of the sound source MS3, the result of the time region signals S5' of the sound source MS5 being subtracted from the signals SR in the above (Expression 5). This sum of digital audio signals (S4'+S3') is output via the output terminal 1069.

Note that the delays 1071 and 1073 are provided to the residual extraction processing units 1072 and 1074, taking into consideration the processing delays at the frequency division spectral comparison processing unit 103 and the frequency division spectral control processing unit 104.

With the third embodiment, with the acoustic reproduction system shown in FIG. 2, in the same way as with the second embodiment the digital audio signals S1' and S5' from the output terminals 1061 and 1065 are converted into analog audio signals by the D/A converters 331 and 335, supplied to the speakers SP1 and SP5 via the amplifiers 341 and 345 and acoustically reproduced, and also, the digital audio signals (S2'+S3') from the output terminal 1068 are converted into analog audio signals by the D/A converter 332, and further the digital audio signals (S4'+S3') from the output terminal 1069 are converted into analog audio signals by the D/A converter 334, and supplied to the speaker SP4 via the amplifier 344 and acoustically reproduced.

According to this third embodiment, the residual extraction processing units 1072 and 1074 extract residuals in a time region, so the inverse FFT units 1056 and 1057 in the second embodiment are unnecessary, which is advantageous in that the configuration is simplified.

[Fourth Embodiment of Configuration of Audio Signal Processing Device Unit 100]

With the above embodiments, the phase at the time of the audio signals of each of the sound sources being distributed to the two channels of audio signals has been described as being the same phase for the two channels, but there are cases wherein the audio signals of the sound sources are redistributed in inverse phases. As an example, let us consider stereo audios signals SL and SR wherein audio signals S1 through S6 of six sound sources MS1 through MS6 are distributed in the two left and right channels, as shown in the following (Expression 3) and (Expression 4).

$$SL=S1+0.9S2+0.7S3+0.4S4+0.7S6 \quad \text{(Expression 3)}$$

$$SR=S5+0.4S2+0.7S3+0.9S4-0.7S6 \quad \text{(Expression 4)}$$

That is to say, the audio signals S3 of the sound source MS3 and the audio signals S6 of the sound source MS6 are distributed to the left and right channels at the same level each, but the audio signals S3 of the sound source MS3 are distributed to the left and right channels in the same phase, while the audio signals S6 of the sound source MS6 are distributed to the left and right channels in the inverse phases.

Accordingly, in the event of attempting to separate and extract one of the audio signals S3 of the sound source MS3 or the audio signals S6 of the sound source MS6 using the sound source separation processing units of the frequency division spectral control processing unit 104 using only the level ratio or level difference alone without taking into consideration the phase, the audio signals S3 and S6 are distributed to the left and right channels at the same level, so just one cannot be separated and extracted.

Accordingly, with the fourth embodiment, at the sound source separation processing units of the frequency division spectral control processing unit 104, following separating the audio components using the level ratio or level difference as with the above-described embodiments, further separation is performed using phase difference, whereby the audio signals S3 of the sound source MS3 and the audio signals S6 of the sound source MS6 can be separated and output even in cases such as in (Expression 3) and (Expression 4).

Figure 8:
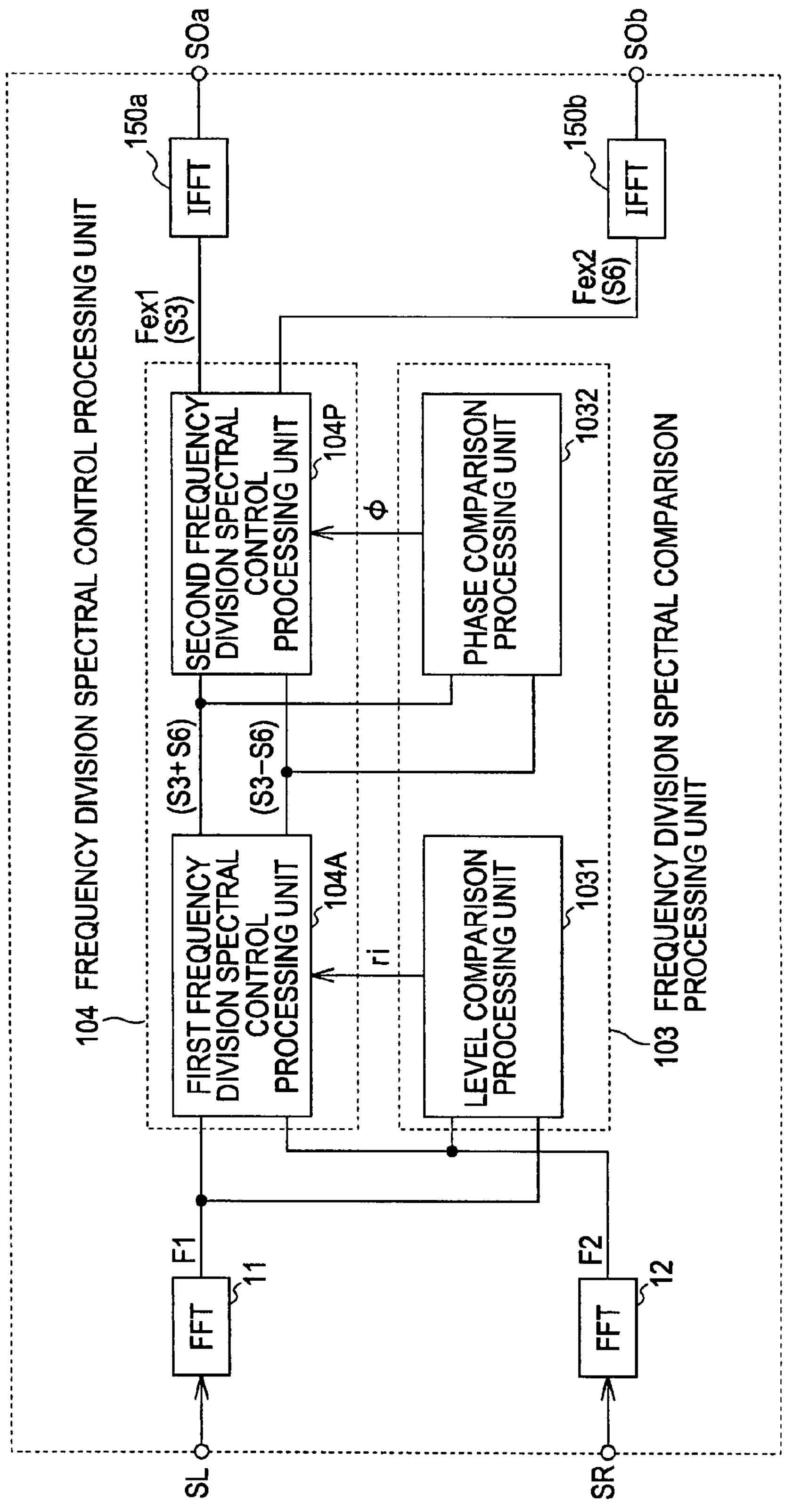
FIG. 8 is a block diagram illustrating a configuration example of a fourth embodiment of an audio signal processing device according to the present invention.

FIG. 8 is a block diagram of a configuration example of the principal components of the audio signal processing device unit 100 according to the fourth embodiment. This FIG. 8 is equivalent to illustrating the configuration of one sound source separation processing unit of the frequency division spectral control processing unit 104.

The frequency division spectral comparison processing unit 103 of the audio signal processing device unit 100 according to the fourth embodiment have a level comparison processing unit 1031 and a phase comparison processing unit 1032.

Also, the frequency division spectral control processing unit 104 according to the fourth embodiment has a first frequency division spectral control processing unit 104A and a second frequency division spectral control processing unit 104P for executing sound source separation processing based on the phase difference. In this case, the sound source separation processing units 104*i* of the frequency division spectral control processing unit 104 have a part which is the first frequency division spectral control processing unit 104A and a part which is the second frequency division spectral control processing unit 104P for executing sound source separation processing based on the phase difference.

Figure 9:
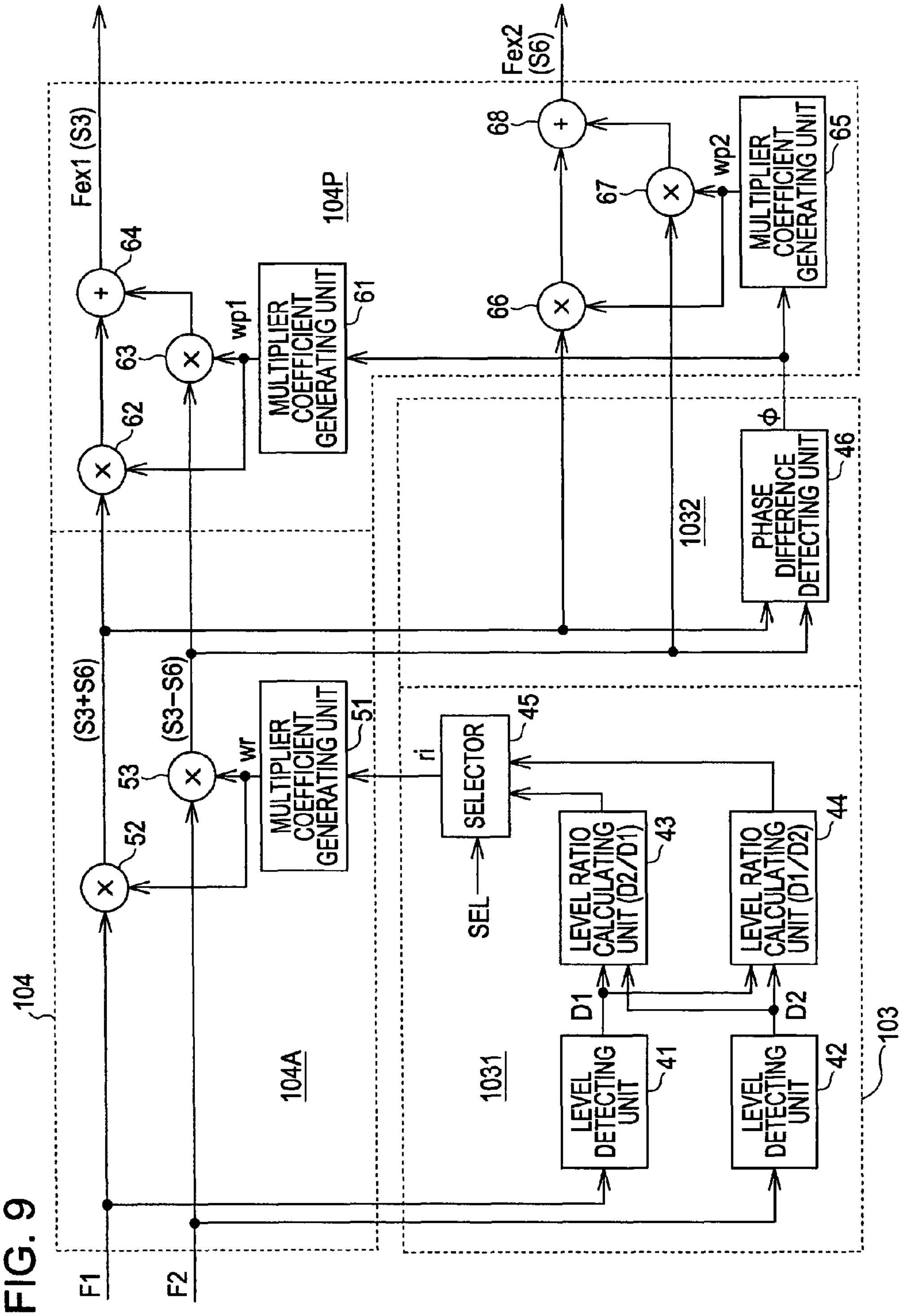
FIG. 9 is a block diagram illustrating a configuration example of a frequency division spectral comparison processing unit, and a frequency division spectral control processing unit, which are a part of FIG. 8.

FIG. 9 is a block diagram illustrating a detailed configuration example of one of the sound source separation processing units of the frequency division spectral comparison processing unit 103 and the frequency division spectral control processing unit 104 according to the fourth embodiment.

That is to say, the level comparison processing unit 1031 of the frequency division spectral comparison processing unit 103 has the same configuration of the frequency division spectral comparison processing unit 103 in the first embodiment described above, being made up of level detecting units 41 and 42, level ratio calculating units 43 and 44, and a selector 45. The fact that in the event that multiple sound source separation units are provided to the frequency division spectral control processing unit 104, selectors 45 of a number corresponding to the number of sound source separation units are provided, is as already described, as illustrated in FIG. 3.

The first frequency division spectral control processing unit 104A of the frequency division spectral control processing unit 104 also has approximately the same configuration as the sound source separation processing units 1041 of the frequency division spectral control processing unit 104 in the first embodiment (except for not including the adding unit 54) as illustrated in FIG. 4, and have a configuration of sound source separation units made up of a multiplier coefficient generating unit 51 and multiplication units 52 and 53.

As shown in FIG. 8 and FIG. 9, the level ratio output ri from the level comparison processing unit 1031 is, exactly in the same way as with the first embodiment, supplied to the multiplier coefficient generating unit 51 of the first frequency division spectral control processing unit 104A, and a multiplication coefficient wr corresponding to the function set to the multiplier coefficient generating unit 51 is generated from the multiplier coefficient generating unit 51 and supplied to the multiplication units 52 and 53.

A frequency division spectral component F1 from the FFT unit 101 is supplied to the multiplication unit 52, and the results of multiplication of the frequency division spectral component F1 and the multiplication coefficient wr is obtained from the multiplication unit 52. Also, a frequency division spectral component F2 from the FFT unit 102 is supplied to the multiplication unit 53, and the results of multiplication of the frequency division spectral component F2 and the multiplication coefficient wr is obtained from the multiplication unit 53.

That is to say, the multiplication units 52 and 53 each yield output wherein the frequency division spectral components F1 and F2 from the FFT units 101 and 102 have been subjected to level control in accordance with the multiplication coefficient wr from the multiplier coefficient generating unit 51.

As described earlier, the multiplier coefficient generating unit 51 is configured of a function generating circuit relating to the multiplication coefficient wr of which the level ratio ri is a variable. What sort of function will be selected as the function used with the multiplier coefficient generating unit 51 depends on the distribution percentage of the sound source to be separated to the sound signals of the two right and left channels.

For example, functions relating to the level ratio ri of the multiplication coefficient wr with properties such as shown in FIG. 5A through FIG. 5E are set to the multiplier coefficient generating unit 51. For example, in the event of separating and extracting audio signals of a sound source distributed to the two left and right channels at the same level, the particular function shown in FIG. 5A is set in the multiplier coefficient generating unit 51 as described earlier.

With this fourth embodiment, the outputs of the multiplication units 52 and 53 are each supplied to the phase comparison processing unit 1032 of the frequency division spectral comparison processing unit 103, and also to the second frequency division spectral control processing unit 104P.

As shown in FIG. 9, the phase comparison processing unit 1032 is made up of a phase difference detecting unit 46 which detects the phase difference ϕ of the output of the multiplication units 52 and 53, with the information of the phase difference ϕ being supplied to the second frequency division spectral control processing unit 104P. The phase difference detecting unit 46 is provided to each sound source separation processing unit.

The second frequency division spectral control processing unit 104P is made up of two multiplier coefficient generating units 61 and 65, multiplication units 62 and 63, multiplication units 66 and 67, and adding units 64 and 68.

Supplied to the multiplication unit 62 are the output of the multiplication unit 52 of the first frequency division spectral control processing unit 104A, and also the multiplication coefficient wp1 from the multiplier coefficient generating unit 61, with the multiplication results of both being supplied from the multiplication unit 62 to the adding unit 64. Also, supplied to the multiplication unit 63 are the output of the multiplication unit 53 of the first frequency division spectral control processing unit 104A, and also the multiplication coefficient wp1 from the multiplier coefficient generating unit 61, with the multiplication results of both being supplied from the multiplication unit 63 to the adding unit 64. The output of the adding unit 64 is taken as the first output Fex1.

Also, supplied to the multiplication unit 66 are the output of the multiplication unit 52 of the first frequency division spectral control processing unit 104A, and also the multiplication coefficient wp2 from the multiplier coefficient generating unit 65, with the multiplication results of both being supplied from the multiplication unit 66 to the adding unit 68. Also, supplied to the multiplication unit 67 are the output of the multiplication unit 53 of the first frequency division spectral control processing unit 104A, and also the multiplication coefficient wp2 from the multiplier coefficient generating unit 65, with the multiplication results of both being supplied from the multiplication unit 67 to the adding unit 68. The output of the adding unit 68 is taken as the second output Fex2.

The multiplier coefficient generating units 61 and 65 receive the phase difference ϕ from the phase difference detecting unit 26 and generate multiplier coefficients wp1 and wp2 corresponding to the received phase difference ϕ. The multiplier coefficient generating units 61 and 65 are configured with function generating circuits relating to the multiplier coefficient wp wherein the phase difference ϕ is a variable. The user sets what sort of functions are selected as the functions used with the multiplier coefficient generating units 61 and 65, according to the phase difference of the sound source to be separated as to the two channels.

The phase difference ϕ supplied to the multiplier coefficient generating units 61 and 65 changes in increments of the frequency components of the frequency division spectrum, so the multiplier coefficients wp1 and wp2 from the multiplier coefficient generating units 61 and 65 also change in increments of the frequency components.

Accordingly, at the multiplication unit 62 and the multiplication unit 66, the level of the frequency division spectrums from the multiplication unit 52 is controlled by the multiplier coefficients wp1 and wp2, and also, at the multiplication unit 63 and the multiplication unit 67, the level of the frequency division spectrums from the multiplication unit 53 is controlled by the multiplier coefficients wp1 and wp2.

FIG. 10A through FIG. 10E illustrate examples of functions used with function generating circuits as the multiplier coefficient generating units 301 and 305.

Figure 10A:
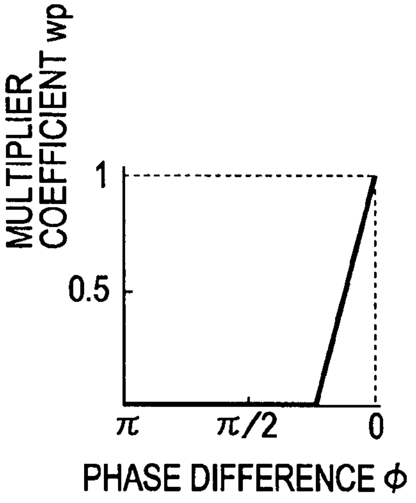
FIG. 10A is a diagram illustrating several examples of a function set to multiplier coefficient generating units 61 and 65 in FIG. 9.

The properties of the function in FIG. 10A is that, in the event that the phase difference ϕ is 0 or is near 0, i.e., with frequency division spectral components wherein the left and right channels are of the same phase or near the same phase, the multiplier coefficient wp (equivalent to wp1 or wp2) is 1 or near 1, and in the region wherein the phase difference ϕ of the left and right channels is approximately π/4 or greater, the multiplier coefficient wp is 0.

For example, in a case wherein a function of the properties shown in FIG. 10A are set at the multiplier coefficient generating unit 61, the multiplier coefficient wp corresponding to the frequency division spectral component, wherein the phase difference ϕ from the phase difference detecting unit 46 is at 0 or near 0, is 1 or near 1, so the frequency division spectral component is output at around the same level from the multiplication units 62 and 63. On the other hand, the multiplier coefficient wp corresponding to the frequency division spectral component, wherein the phase difference $\phi$ from the phase difference detecting unit 26 is of a value $\pi/4$ or greater, is 0, so the frequency division spectral component is zero, and is not output from the multiplication units 62 and 63.

That is to say, of the many frequency division spectral components, the frequency division spectral components with the same phase or near the same phase between the left and right are output with around the same level from the multiplication units 62 and 63, and frequency division spectral components with great phase difference between the left and right components have an output level of zero and are not output. Consequently, only the frequency division spectral components of audio signals of a sound source distributed to the audio signals SL and SR of the two left and right channels with the same phase are obtained from the adding unit 64.

That is to say, the function of the properties shown in FIG. 10A is used for extracting signals of a sound source distributed to the two left and right channels at the same phase.

Figure 10B:
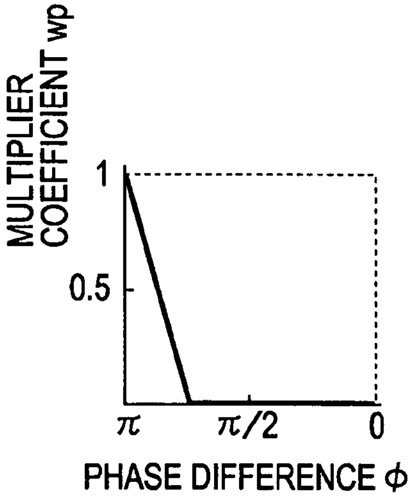
FIG. 10B is a diagram illustrating several examples of a function set to the multiplier coefficient generating units 61 and 65 in FIG. 9.

Also, the properties of the function shown in FIG. 10B are such that in the event that the phase difference $\phi$ of the left and right channels is $\pi$ or near $\pi$, i.e., with frequency division spectral components wherein the left and right channels are of inverse phases or near inverse phases, the multiplier coefficient wp is 1 or near 1, and in the region wherein the phase difference $\phi$ is approximately $3\pi/4$ or lower, the multiplier coefficient wp is zero.

For example, in a case wherein a function of the properties shown in FIG. 10B are set at the multiplier coefficient generating unit 61, the multiplier coefficient wp corresponding to the frequency division spectral component, wherein the phase difference $\phi$ from the phase difference detecting unit 46 is at $\pi$ or near $\pi$, is 1 or near 1, so the frequency division spectral component is output at around the same level from the multiplication units 62 and 63. On the other hand, the multiplier coefficient wp corresponding to the frequency division spectral component, wherein the phase difference $\phi$ from the phase difference detecting unit 46 is of a value $3\pi/4$ or lower is 0, so the frequency division spectral component is zero, and is not output from the multiplication units 62 and 63.

That is to say, of the many frequency division spectral components, the frequency division spectral components with inverse phase or near inverse phase between the left and right are output with around the same level from the multiplication units 62 and 63, and frequency division spectral components with small phase difference between the left and right components have an output level of zero and are not output. Consequently, only the frequency division spectral components of audio signals of a sound source distributed to the audio signals SL and SR of the two left and right channels with inverse phase are obtained from the adding unit 64.

That is to say, the function of the properties shown in FIG. 10B is used for extracting signals of a sound source distributed to the two left and right channels at inverse phase.

Figure 10C:
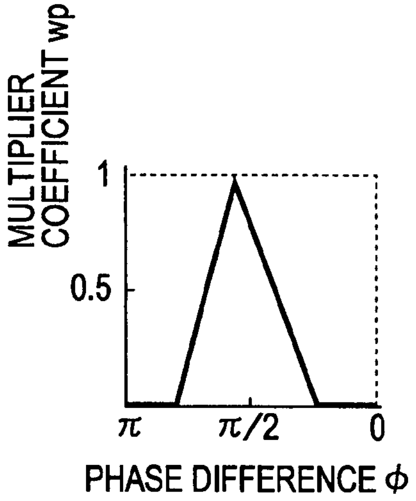
FIG. 10C is a diagram illustrating several examples of a function set to the multiplier coefficient generating units 61 and 65 in FIG. 9.

In the same way, the properties of the function shown in FIG. 10C are such that in the event that the phase difference $\phi$ of the left and right channels is $\pi/2$ or near $\pi/2$, the multiplier coefficient wp is 1 or near 1, and in the regions of other phase differences $\phi$, the multiplier coefficient wp is zero. Accordingly, the function of the properties shown in FIG. 10C is used for extracting signals of a sound source distributed to the two left and right channels at phases differing one from another by around only $\pi/2$.

Figure 10D:
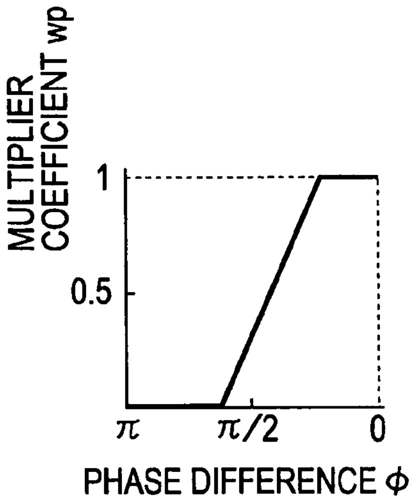
FIG. 10D is a diagram illustrating several examples of a function set to the multiplier coefficient generating units 61 and 65 in FIG. 9.
Figure 10E:
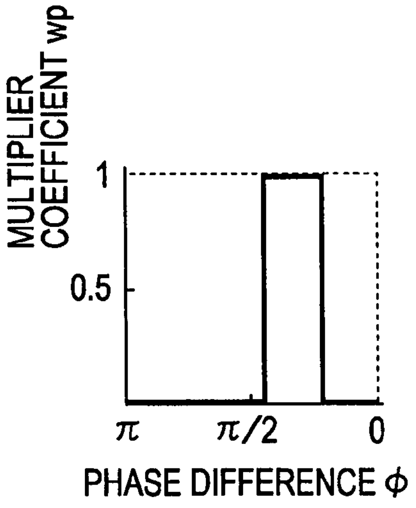
FIG. 10E is a diagram illustrating several examples of a function set to the multiplier coefficient generating units 61 and 65 in FIG. 9.

Moreover, the multiplier coefficient generating units 61 and 65 can be set to functions of properties such as shown in FIG. 10D or FIG. 10E, in accordance with the phase difference at the time of distributing the sound sources to be separated to the two channels of audio signals.

Thus, the first output Fex1 and second output Fex2 obtained from one of the sound source separation processing units of the frequency division spectral control processing unit 104 are supplied to the inverse FFT units 150*a* and 150*b* respectively, restored to the original time-sequence audio signals, and extracted as first and second output signals SOa and SOb. In the event of extracting the first and second output signals SOa and SOb as analog signals, D/A converters are provided to the output side of the inverse FFT units 150*a* and 150*b*.

In this fourth embodiment, in the event of separating from the two left and right channels of audio signals SL and SR shown in the (Expression 3) and (Expression 4), the audio signals S3 of the sound source MS3 distributed to the left and right channels at the same level and the same phase, and the audio signals S6 of the sound source MS6 distributed to the left and right channels at the same level but the opposite phase, as outputs Fex1 and Fex2, a function with the properties such as shown in FIG. 5A is set to the multiplier coefficient generating unit 51, function with the properties such as shown in FIG. 10A is set to the multiplier coefficient generating unit 61, and a function with the properties such as shown in FIG. 10B is set to the multiplier coefficient generating unit 65.

Accordingly, as shown in FIG. 8 and FIG. 9, frequency division spectral components of (S3+S6) of the left channel audio signals SL subjected to FFT processing (frequency division spectrum) are obtained from the multiplication unit 52 of the first frequency division spectral control processing unit 104A of the frequency division spectral control processing unit 104, and also, frequency division spectral components of (S3−S6) of the right channel audio signals SR subjected to FFT processing (frequency division spectrum) are obtained from the multiplication unit 53. That is to say, the signals S3 and S6 are distributed to the left and right channels at the same level, so these are output without the first frequency division spectral control processing unit 104A being capable of separation thereof.

However, with this fourth embodiment, the signals S3 and signals S6 are separated as follows, employing the fact that the signals S3 and signals S6 are distributed to the left and right channels at inverse phases.

That is to say, the outputs of the multiplication units 52 and 53 are supplied to the phase difference detecting unit 26 making up the phase comparison processing unit 1032 of the frequency division spectral comparison processing unit 103, and the phase difference $\phi$ is detected for both outputs. The information of the phase difference $\phi$ detected at the phase difference detecting unit 26 is supplied to the multiplier coefficient generating unit 61, and is also supplied to the multiplier coefficient generating unit 65.

At the multiplier coefficient generating unit 61, a function having the properties such as shown in FIG. 10A is set, so the multiplication units 62 and 63 extract audio signals of a sound source distributed to the left and right channel at the same phase. That is to say, of the frequency division spectral components (S3+S6) and the frequency division spectral components (S3−S6), only the frequency division spectral components of the audio signals S3 of the sound source MS3 which are in the same phase relation are obtained from the multiplication units 62 and 63 respectively, and supplied to the adding unit 64.

Accordingly, the frequency division spectral components of the audio signals S3 of the sound source MS3 are extracted from the adding unit 64 as the output signals Fex1, and supplied to the inverse FFT unit 150*a*. The separated audio signals S3 are restored to time-sequence signals at the inverse FFT unit 150*a*, and output as output signals SOa.

On the other hand, at the multiplier coefficient generating unit 65, a function having the properties such as shown in FIG. 10B is set, so the multiplication units 66 and 67 extract audio signals of a sound source distributed to the left and right channel at inverse phases. That is to say, of the frequency division spectral components (S3+S6) and the frequency division spectral components (S3−S6), only the frequency division spectral components of the audio signals S6 of the sound source MS6 which are in the inverse phase relation are obtained from the multiplication units 66 and 67 respectively, and supplied to the adding unit 68.

Accordingly, the frequency division spectral components of the audio signals S6 of the sound source MS6 are extracted from the adding unit 68 as the output signals Fex2, and supplied to the inverse FFT unit 150*b*. The separated audio signals S6 are then restored to time-sequence signals at the inverse FFT unit 150*b*, and output as output signals SOb.

Note that with the embodiment shown in FIG. 8 and FIG. 9, two signals which cannot be separated with level ratio at the first frequency division spectral control processing unit 104A, the same-phase signals S3 and inverse-phase signals S6 in the above-described example, are separated at the second frequency division spectral control processing unit 104P using respective multiplier coefficients and multiplication units, but an arrangement may be made wherein one of the two signals which cannot be separated using level ratio is separated using phase difference ϕ and multiplier coefficients, following which the separated signal is subtracted from the sum of signals from the first frequency division spectral control processing unit 104A (signals wherein the output of the multiplication unit 52 and the output of the multiplication unit 53 have been added), thereby separating the other of the two signals.

Also, while two sound source signals are obtained with the embodiment in FIG. 8 and FIG. 9, the separated sound source signals to be output may be one. Also, it is needless to say that this fourth embodiment can also be applied in cases of simultaneously separating audio signals of a greater number of sound sources, using phase difference ϕ and multiplier coefficients.

Also, the embodiment in FIG. 8 and FIG. 9 is arranged such that, following extracting the sound source components distributed at the same level in the two systems of audio signals, based on the level ratio of the two systems of frequency division spectrums, the desired sound sources are separated based on the phase difference with regard to the two systems of frequency division spectrums from the extraction results, but it is needless to say that in the event that the input audio signals are two systems of audio signals such as with (S3+S6) and (S3−S6), sound source separation can be performed based only on phase difference.

Fifth Embodiment

The above embodiments are cases wherein two-channel stereo signals are made up of audio signals of five sound sources, with each of the five sound sources being separated, or separated as the sum with other sound sources signals.

This fifth embodiment is a case of a multi-channel acoustic reproduction system, still using the sound source separation methods described in the above embodiments, and also generating audio signals of a channel only of low-frequency signals, thereby generating so-called 5.1 channel audio signals, and driving six speakers with the generated six audio signals.

Figure 11:
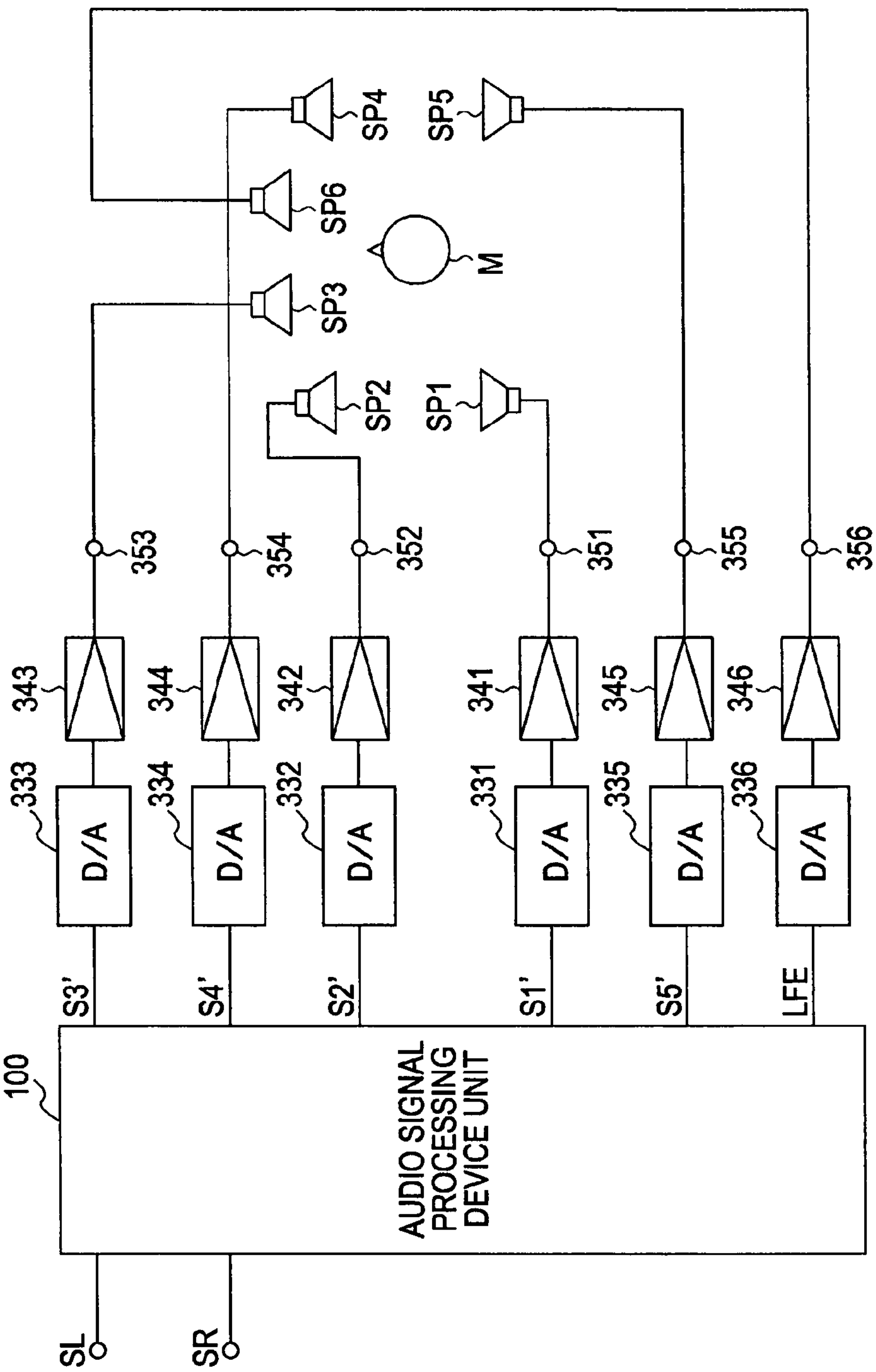
FIG. 11 is a block diagram illustrating a configuration example of an audio playing system to which a fifth embodiment has been applied.

FIG. 11 is a block diagram illustrating a configuration example of an acoustic reproduction system according to the fifth embodiment. Also, FIG. 12 is a block diagram illustrating a configuration example of the audio signal processing device unit 100 in the acoustic reproduction system shown in FIG. 11.

With the fifth embodiment, a low-frequency reproduction speaker SP6 is provided besides the five speakers SP1 through SP5 shown in FIG. 2 with the above-described embodiments. With the audio signal processing device unit 100 according to the fifth embodiment, audio signals S1' through S5' to be supplied to the speakers SP1 through SP 5 are separated and extracted from the high-frequency components of the two-channel stereo signals SL and SR using the method according to the above-described first embodiment, and the audio signals S6' to be supplied to the low-frequency reproduction speaker SP6 are generated from the low-frequency components of the two-channel stereo signals SL and SR.

Figure 12:
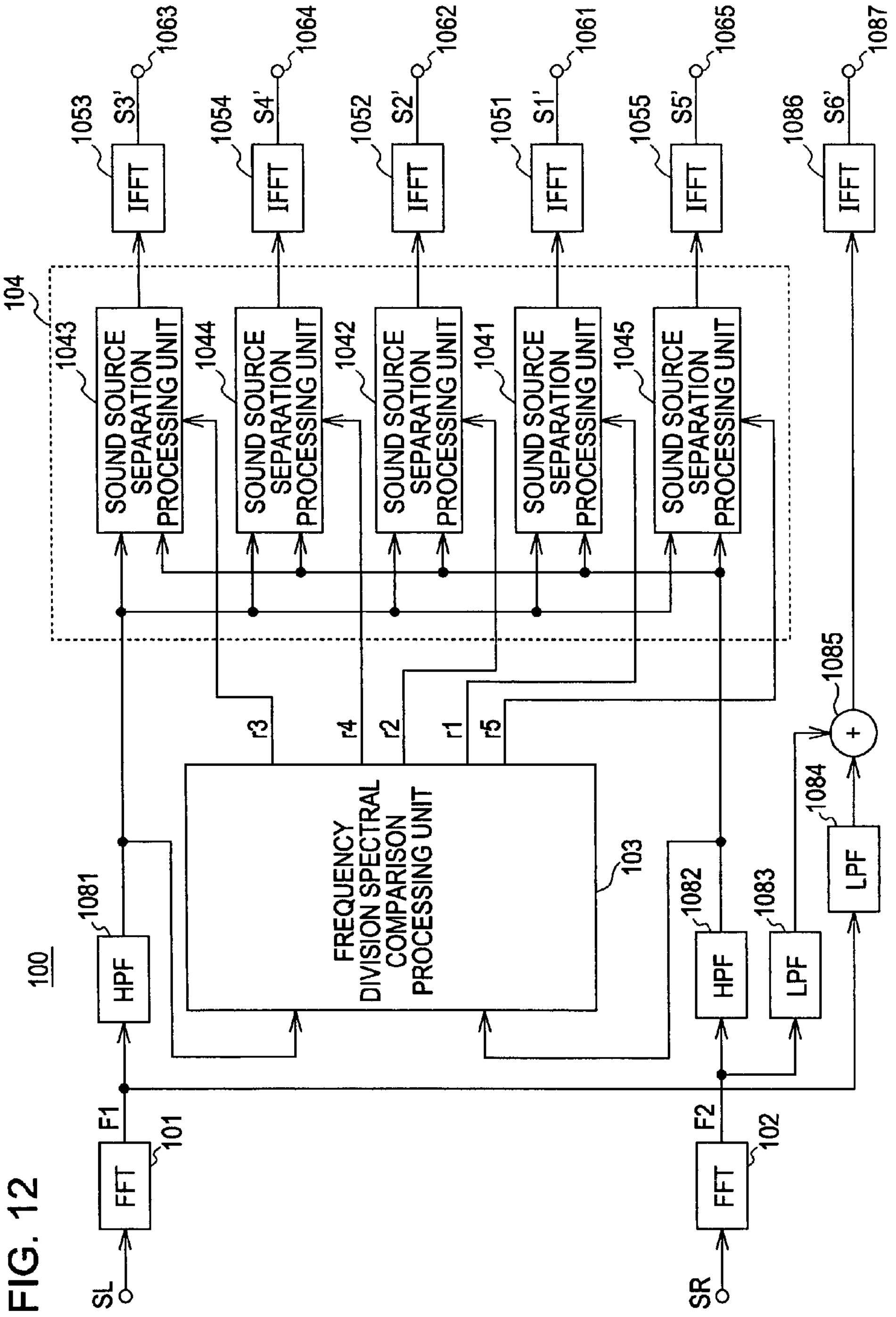
FIG. 12 is a diagram illustrating a configuration example of the fifth embodiment of an audio signal processing device according to the present invention.

That is to say, as shown in FIG. 12, with the fifth embodiment, frequency region signals F1 from the FFT unit 101 are passed through a high-pass filter 1081 so as to yield only high-frequency components, and then supplied to the frequency division spectral comparison processing unit 103 and also supplied to the frequency division spectral control processing unit 104. Also, frequency region signals F2 from the FFT unit 102 are passed through a high-pass filter 1082 so as to yield only high-frequency components, and then supplied to the frequency division spectral comparison processing unit 103 and also supplied to the frequency division spectral control processing unit 104.

As with the first embodiment, the audio signal components of the frequency regions of the five sound sources MS1 through MS5 are separated and extracted at the frequency division spectral comparison processing unit 103 and the frequency division spectral control processing unit 104, restored to the time-region signals S1' through S5' by inverse FFT units 1051 through 1055, and extracted from the output terminals 1061 through 1065.

Also, with the fifth embodiment, frequency region signals F1 from the FFT unit 101 are passed through a low-pass filter 1084 so as to yield only low-frequency components, and then supplied to an adding unit 1085, while frequency region signals F2 from the FFT unit 102 are passed through a low-pass filter 1084 so as to yield only low-frequency components, and then supplied to the adding unit 1085, and added to the low-frequency component from the low-pass filter 1084. That is to say, the sum of the low frequency components of the signals F1 and F2 is obtained from the adding unit 1085.

The sum of the low frequency components of the signals F1 and F2 from the adding unit 1085 is taken as time region signals S6' by an inverse FFT unit 1086, and extracted from an output terminal 1087. That is to say, the sum S6' of the low-frequency components of the audio signals SL and SR of the two left and right channels is extracted from the output terminal 1087. The sum S6' of the low-frequency components is then output as signals LEF (Low Effect Frequency), and supplied to the speaker SP6 via D/A converter 336 and amplifier 346.

Thus, a multi-channel system can be realized wherein 5.1 channel signals are extracted from two channel stereo audio signals SL and SR.

Sixth Embodiment

The sixth embodiment illustrates an example of further subjecting the 5.1 channel signals generated at the audio signal processing device unit 100 to further signal processing, thereby newly separating an SB (Sound Back) channel, and outputting as 6.1 channel signals.

Figure 13:
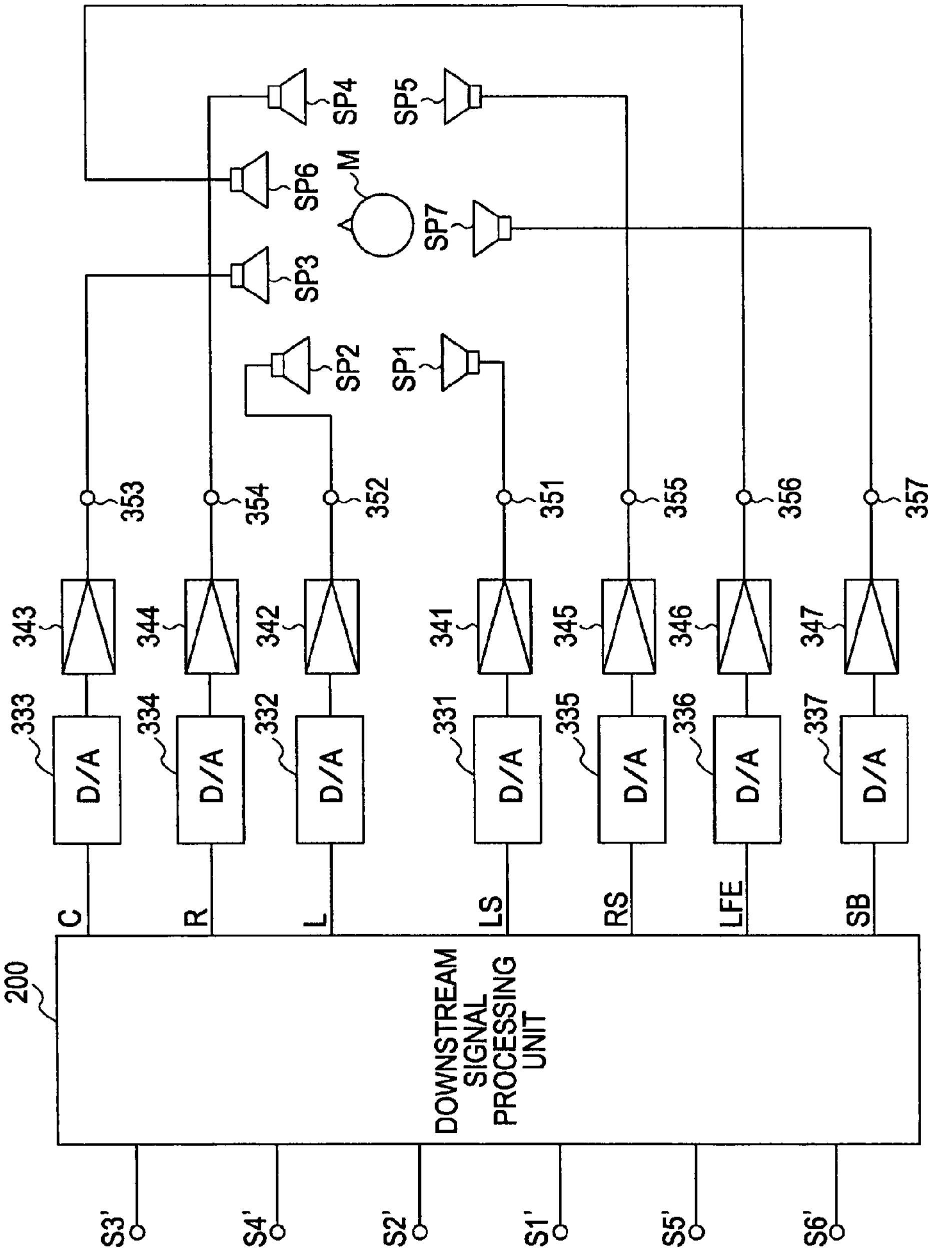
FIG. 13 is a block diagram illustrating a configuration example of an audio playing system to which a sixth embodiment has been applied.

FIG. 13 is a block diagram illustrating a configuration example downstream of the audio signal processing device unit 100 in the acoustic reproduction system. With the sixth embodiment, an SB channel reproduction speaker SP7 is provided besides the speakers SP1 through SP6 in the above-described fifth embodiment.

A downstream signal processing unit 200 is provided downstream of the audio signal processing device unit 100, and 6.1 channel audio signals are generated at the downstream signal processing unit 200 from the 5.1 channel audio signals of the audio signal processing device unit 100 to which the SB channel audio signals are added. The D/A converters 331 through 336 and amplifiers 341 through 346 are provided for the 5.1 channel audio signals from the downstream signal processing unit 200, and a D/A converter 337 for converting the digital audio signals of the added SB channel into analog audio signals, and an amplifier 347, are also provided.

Figure 14:
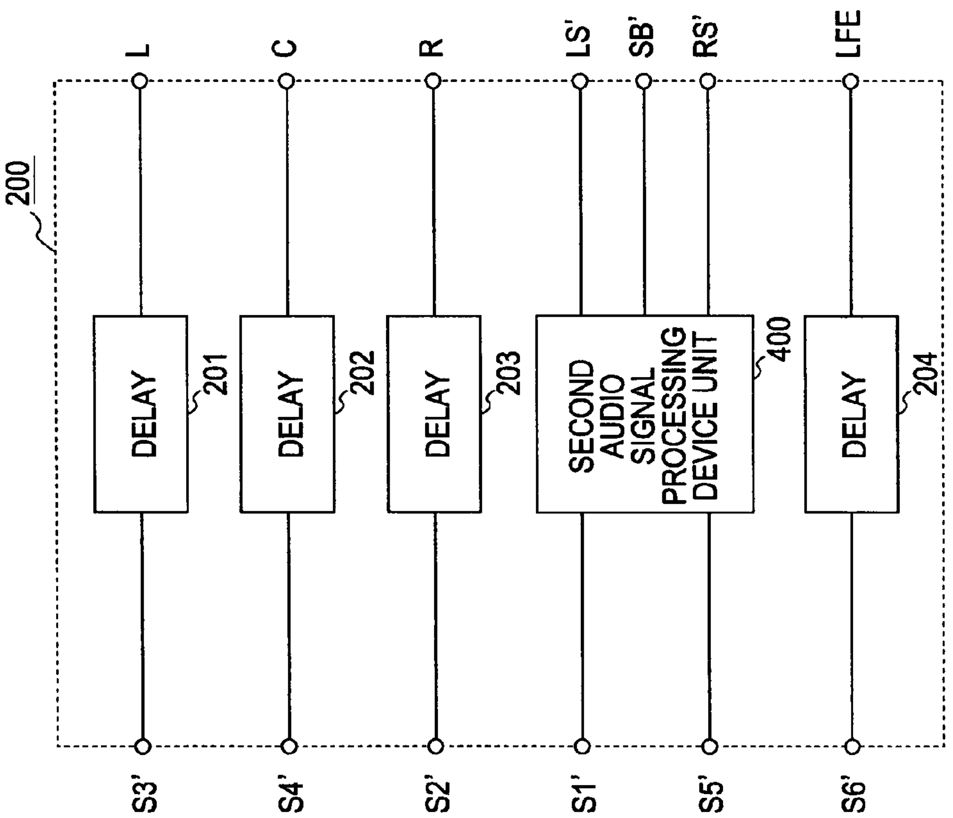
FIG. 14 is a diagram illustrating a configuration example of the sixth embodiment of an audio signal processing device according to the present invention.

FIG. 14 is an internal configuration example of the downstream signal processing unit 200, with digital signals S1' and S5' being supplied to a second audio signal processing device unit 400, and separated into signals LS' and signals RS' and signals SB' and output at the second audio signal processing device unit 400. Also, with the downstream signal processing unit 200, delays 201, 202, 203, and 204 are provided for the digital audio signals S2', S3', S4', and S6', with the digital audio signals S2', S3', S4', and S6' being delayed by the delays 201, 202, 203, and 204 by an amount of time corresponding to the processing delay time at the second audio signal processing device unit 400, and output.

The basic configuration of the second audio signal processing device unit 400 is the same as that of the audio signal processing device unit 100. At the second audio signal processing device unit 400, SB signals are separated and extracted from signals distributed to the digital signals S1' and S5' with the same phase and same level, i.e., digital signals S1' and S5' which are signals wherein the level ratio is 1:1. Also, digital signals LS and RS are separated and extracted from each of the digital signals S1' and S5' as signals included primarily in one of the digital signals S1' and S5', i.e., as signals wherein the level ratio is 1:0.

Figure 15:
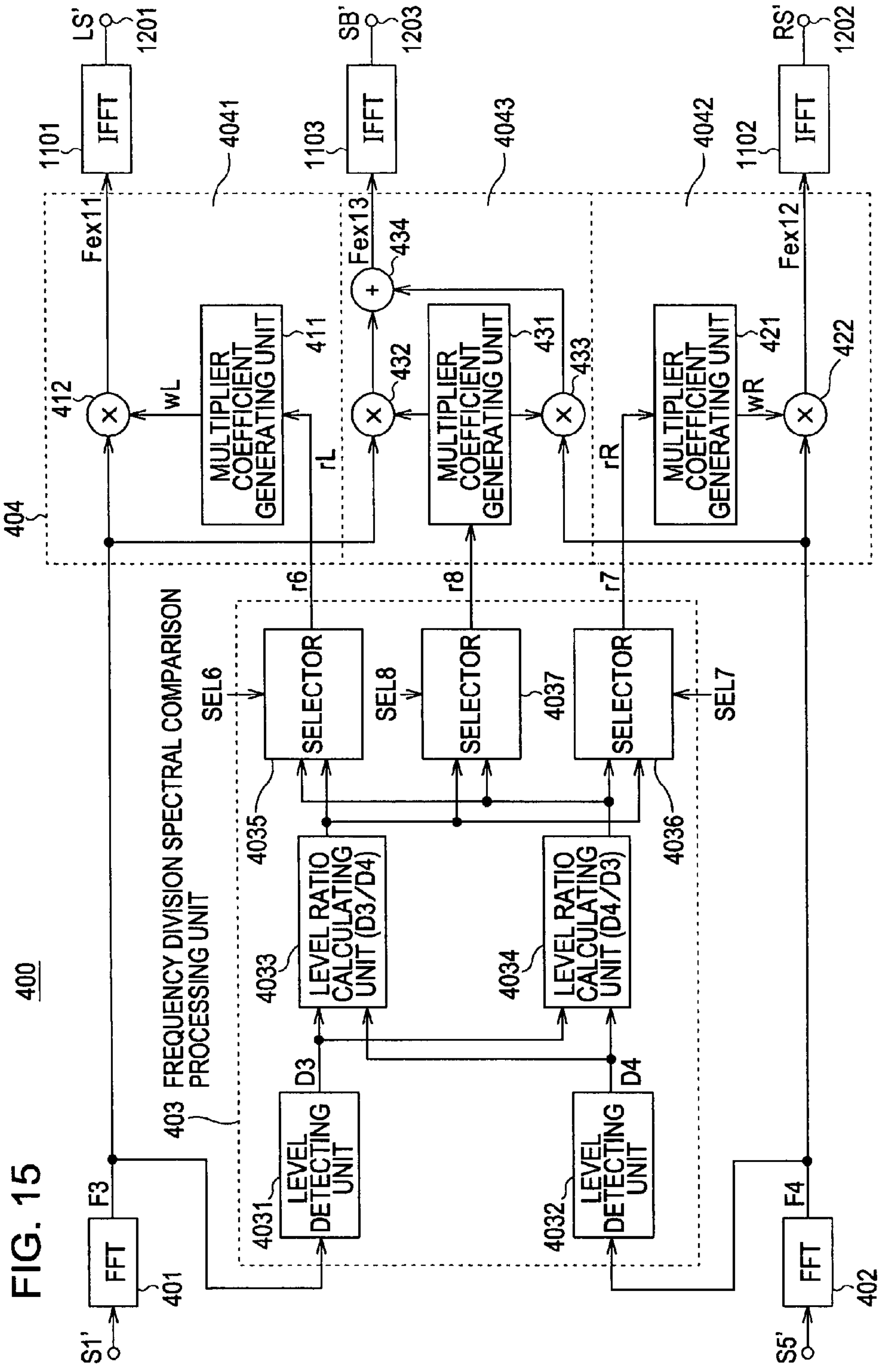
FIG. 15 is a diagram illustrating a configuration example of a part of the sixth embodiment of an audio signal processing device according to the present invention.

FIG. 15 illustrates a block diagram of a configuration example of this second audio signal processing device unit 400. AS shown in FIG. 15, with the second audio signal processing device unit 400, the digital audio signals S1' are supplied to the FFT unit 401, subjected to FFT processing, and the time-sequence audio signals are transformed to frequency region data. Also, the digital audio signals S5' are supplied to the FFT unit 402, subjected to FFT processing, and the time-sequence audio signals are transformed to frequency region data.

The FFT units 401 and 402 have the same configuration as the FFT units 101 and 102 in the previous embodiments. The frequency division spectral outputs F3 and F4 from the FFT units 401 and 402 are each supplied to a frequency division spectral comparison processing unit 403 and a frequency division spectral control processing unit 404.

The frequency division spectral comparison processing unit 403 calculates the level ratio for the corresponding frequencies between the frequency division spectral components F3 and F4 from the FFT unit 401 and FFT unit 402, and outputs the calculated level ratio to the frequency division spectral control processing unit 404.

The frequency division spectral comparison processing unit 403 has the same configuration as the frequency division spectral comparison processing unit 103 in the above-described embodiments, and in this example, is made up of level detecting units 4031 and 4032, level ratio calculating units 4033 and 4034, and selectors 4035, 4036, and 4037.

The level detecting unit 4031 detects the level of each frequency component of the frequency division spectral component F3 from the FFT unit 401, and outputs the detection output D3 thereof. Also, the level detecting unit 4032 detects the level of each frequency component of the frequency division spectral component F4 from the FFT unit 402, and outputs the detection output D4 thereof. In this example, the amplitude spectrum is detected as the level of each frequency division spectrum. Note that the power spectrum may be detected as the level of each frequency division spectrum.

The level ratio calculating unit 4033 then calculates D3/D4. Also, the level ratio calculating unit 4034 calculates the inverse D4/D3. The level ratios calculated at the level ratio calculating units 4033 and 4034 are supplied to each of the selectors 4035, 4036, and 4037. One level ratio thereof is then extracted from each of the selectors 4035, 4036, and 4037, as output level ratios r6, r7, and r8.

Each of the selectors 4035, 4036, and 4037 are supplied with selection control signals SEL6, SEL7, and SEL8, for performing selection control regarding which to select, the output of the level ratio calculating unit 4033 or the output of the level ratio calculating unit 4034, according to the sound source set by the user to be separated and the level ratio thereof. The output level ratios r6, r7, and r8 obtained from each of the selectors 4035, 4036, and 4037 are supplied to the frequency division spectral control processing unit 404.

The frequency division spectral control processing unit 404 has the number of sound source separating processing units corresponding to the number of audio signals of multiple sound sources to be separated, in this case three sound source separating unit 4041, 4042, and 4043.

In this example, the output F3 of the FFT unit 401 is supplied to the sound source separation processing unit 4041, and the output level ratio r6 obtained from the selector 4035 of the frequency division spectral comparison processing unit 403 is supplied. Also, the output F4 of the FFT unit 402 is supplied to the sound source separation processing unit 4042, and the output level ratio r7 obtained from the selector 4036 of the frequency division spectral comparison processing unit 403 is supplied. Also, the output F3 of the FFT unit 401 and the output F4 of the FFT unit 402 are supplied to the sound source separation processing unit 4043, and the output level ratio r8 obtained from the selector 4037 of the frequency division spectral comparison processing unit 403 is supplied.

In this example, the sound source separation processing unit 4041 is made up of a multiplier coefficient generating unit 411 and a multiplication unit 412, and the sound source separation processing unit 4042 is made up of a multiplier coefficient generating unit 421 and a multiplication unit 422. Also, the sound separation processing unit 4043 are made up of a multiplier coefficient generating unit 431, and multiplication units 432 and 433, and an adding unit 434.

At the sound source separation processing unit 4041, the output F3 of the FFT unit 401 is supplied to the multiplication unit 412, and also the output level ratio r6 obtained from the selector 4035 of the frequency division spectral comparison processing unit 403 is supplied to the multiplication coefficient generating unit 411. In the same manner as described above, the multiplier coefficient wi corresponding to the input level ratio r6 is obtained from the multiplier coefficient generating unit 411, and supplied to the multiplication unit 412.

Also, at the sound source separation processing unit 4042, the output F4 of the FFT unit 402 is supplied to the multiplication unit 422, and also the output level ratio r7 obtained from the selector 4036 of the frequency division spectral comparison processing unit 403 is supplied to the multiplication coefficient generating unit 421. In the same manner as described above, the multiplier coefficient wi corresponding to the input level ratio r7 is obtained from the multiplier coefficient generating unit 411, and supplied to the multiplication unit 422.

Also, at the sound source separation processing unit 4043, the output F3 of the FFT unit 401 is supplied to the multiplication unit 432, the output F4 of the FFT unit 402 is supplied to the multiplication unit 433, and also the output level ratio r8 obtained from the selector 4036 of the frequency division spectral comparison processing unit 403 is supplied to the multiplier coefficient generating unit 431. In the same manner as described above, the multiplier coefficient wi corresponding to the input level ratio r8 is obtained from the multiplier coefficient generating unit 411, and supplied to the multiplication units 432 and 433. The outputs of the multiplication units 432 and 433 are added at the adding unit 434, and subsequently output.

Each of the sound source separation processing units 4041, 4042, and 4043 receive the information of the level ratios r6, r7, and r8, from the frequency division spectral comparison processing unit 403, extract only frequency division spectral components wherein the level ratio equals the distribution ratio of the sound source signals to be separated and extracted to the two channels of signals S1' and S5', from one or both of the FFT unit 401 and FFT unit 402, and output the extraction result outputs of Fex11, Fex12, and Fex13, to the respective inverse FFT units 1101, 1102, and 1103.

Supplied to the multiplier coefficient generating unit 411 of the sound source separation processing unit 4041 is the level ratio r6 of D4/D3, from the selector 4035. A function generating circuit such as shown in FIG. 5B is set to this multiplier coefficient generating unit 411, with frequency components included only in the signals S1' are primarily obtained from the multiplication unit 412, which is output as the output signal Fex11 of the sound source separation processing unit 4042.

Supplied to the multiplier coefficient generating unit 421 of the sound source separation processing unit 4042 is the level ratio r7 of D3/D4, from the selector 4036. A function generating circuit such as shown in FIG. 5B is set to this multiplier coefficient generating unit 421, with frequency components included only in the signals S5' are primarily obtained from the multiplication unit 422, which is output as the output signal Fex12 of the sound source separation processing unit 4042.

Supplied to the multiplier coefficient generating unit 431 of the sound source separation processing unit 4043 is the level ratio r8 from one of D4/D3 or D3/D4, from the selector 4037. A function generating circuit such as shown in FIG. 5A is set to this multiplier coefficient generating unit 431. Accordingly, frequency components included in the signals S1' and S5' at the same phase and same level are primarily obtained from the multiplication units 432 and 433, and added output of the output signals of these multiplication units 432 and 433 are obtained from the adding unit 434, which is output as the output signal Fex13 of the sound source separation processing unit 4043.

The inverse FFT units 1101, 1102, and 1103 each transform the frequency division spectral components of the extraction result outputs Fex11, Fex12, and Fex13, from each of the sound source separation processing units 4041, 4042, and 4043, of the frequency division spectral control processing unit 404, into the original time-sequence signals, and output the transformed output signals from output terminals 1201, 1202, and 1203, as audio signals LS', RS', and SB, of the three sound sources which the user has set so as to be separated.

Thus, according to the sixth embodiment, 6.1 channel audio signals are generated from 5.1 channel audio signals, and a system wherein this is reproduced from the seven speakers SP1 through SP7 is realized.

Note that with the description in the above sixth embodiment, the signals LS' and RS' are subjected to sound source separation using sound source separation processing units using the level ratio, but an arrangement may be made wherein, as with the third or fourth embodiments, the signal SB is extracted as a separated residual. According to such a configuration, even more sound sources can be separated from audio signals input in multi-channel, and resituated, thereby enabling a multi-channel system having sound image localization with even better separation.

Seventh Embodiment

Figure 16:
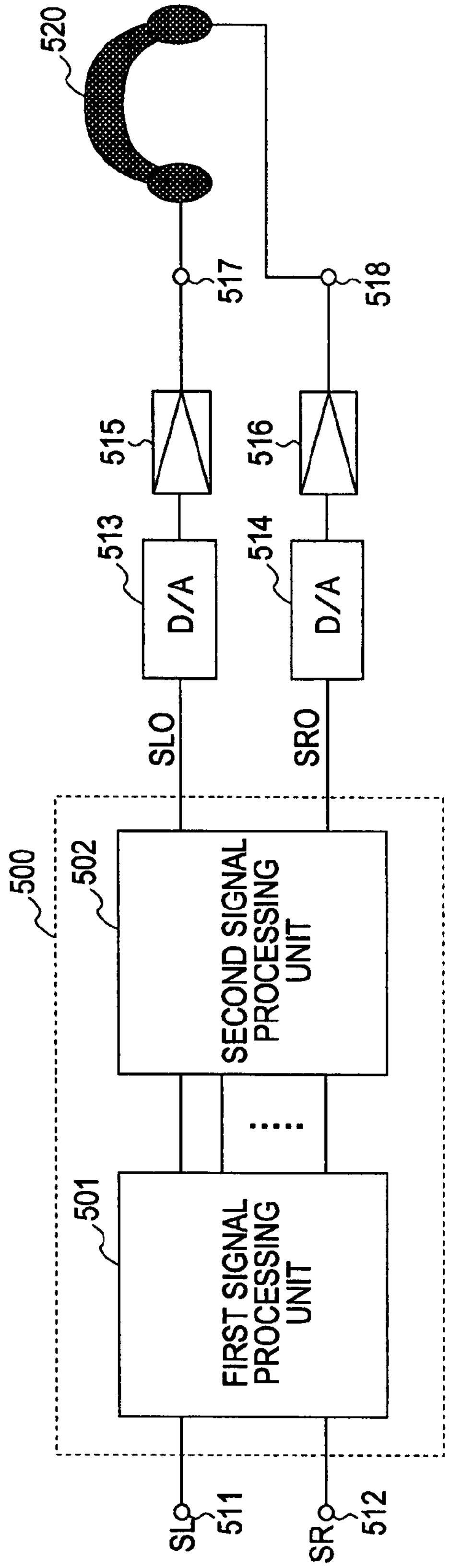
FIG. 16 is a diagram illustrating a configuration example of a seventh embodiment of an audio signal processing device according to the present invention.

FIG. 16 illustrates a configuration example of a seventh embodiment. This seventh embodiment is a system wherein two-channel stereo audio signals SL and SR are subjected to signal processing at an audio signal processing device unit 500, and the audio signals which are the signal processing results are listened to with headphones.

As shown in FIG. 16, with the seventh embodiment, two channel stereo audio signals SL and SR are input to the audio signal processing device unit 500 via input terminals 511 and 512. The audio signal processing device unit 500 is made up of a first signal processing unit 501 and second signal processing unit 502.

The first signal processing unit 501 is configured in the same way as the audio signal processing device unit 100 in the above-described embodiments. That is to say, with the first signal processing unit 501, input two channel stereo audio signals SL and SR are transformed into multi-channel signals of three channels or more, five channels for example, in the same way as with the first embodiment.

Next, the second signal processing unit 502 takes the multi-channel audio signals from the first signal processing unit 501 as input, adds to the audio signals of each of the multi-channels properties equivalent to transfer functions from speakers situated at arbitrary locations to both ears of the listener, and then merges these again into two channels of signals SLo and SRo.

The output signals SLo and SRo from the second signal processing unit 502 are taken as the output of the audio signal processing device unit 500, supplied to D/A converters 513 and 514, converted into analog audio signals, and output to output terminals 517 and 518 via amplifiers 515 and 516. The output signals SLo and SRo are acoustically reproduced by headphones 520 connected to the output terminals 517 and 518.

The principle by which properties with headphones 520 the same as with speaker reproduction is realized is as described below.

Figure 17:
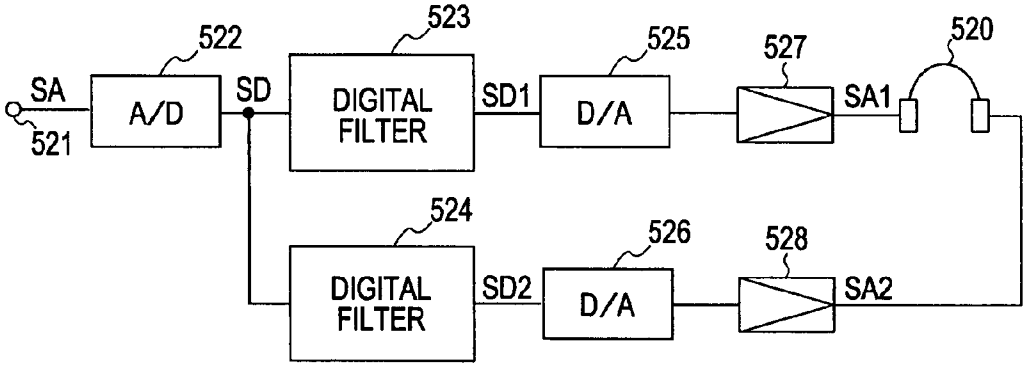
FIG. 17 is a diagram for describing the seventh embodiment.

FIG. 17 illustrates a block diagram as an example of such a headphone set, wherein analog audio signals SA are supplied to an A/D converter 522 via the input terminal 521 and converted into digital audio signals SD. The digital audio signals SD are supplied to digital filters 523 and 524.

Each of the digital filters 523 and 524 are configured as an FIR (Finite Impulse Response) filter of multiple sample delays 531, 532 . . . 53(n−1), filter coefficient multiplying units 541, 542, . . . 54n, and adding units 551, 552, . . . 55(n−1) (wherein n is an integer of 2 or more), with processing being performed for localization of sound images outside the head at each of the digital filters 523 and 524.

Figure 19:
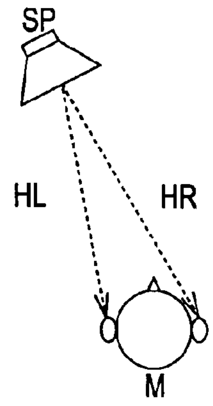
FIG. 19 is a diagram for describing the seventh embodiment.

That is to say, as shown in FIG. 19 for example, In the event that the sound source SP is situated to the front of the listener M, the sound output from this sound source SP is transferred to the left ear and right ear of the listener M via paths having the transfer functions HL and HR.

Accordingly, with the digital filers 523 and 524, the signals SD are convoluted with impulse signals wherein the transfer functions HL and HR are converted into a time axis. That is to say, filter coefficients W1, W2, . . . , Wn are obtained corresponding to the transfer functions HL and HR, and processing such that the sound of the sound source SP as such that of reaching the left ear and right ear of the listener M is performed at the digital filters 523 and 524. Note that the impulse signals convoluted at the digital filters 523 and 524 are calculated by measuring beforehand or calculating beforehand, then converted into the filter coefficients W1, W2, . . . , Wn, and provided to the digital filters 523 and 524.

The signals SD1 and SD2 as the result of this processing are supplied to D/A converter circuits 525 and 526 and converted into analog audio signals SA1 and SA2, and the signals SA1 and SA2 are supplied to left and right acoustic units (electroacoustic transducer elements) of the headphones 520 via headphone amplifiers 527 and 528.

Accordingly, reproduced sounds from the left and right acoustic units of the headphones are sounds which have passed through the paths of the transfer functions HL and HR, so when the listener M wears the headphones 520 and listens to the reproduced sound thereof, a state wherein the sound image SP is localized outside the head is reconstructed, as shown in FIG. 19.

Figure 18:
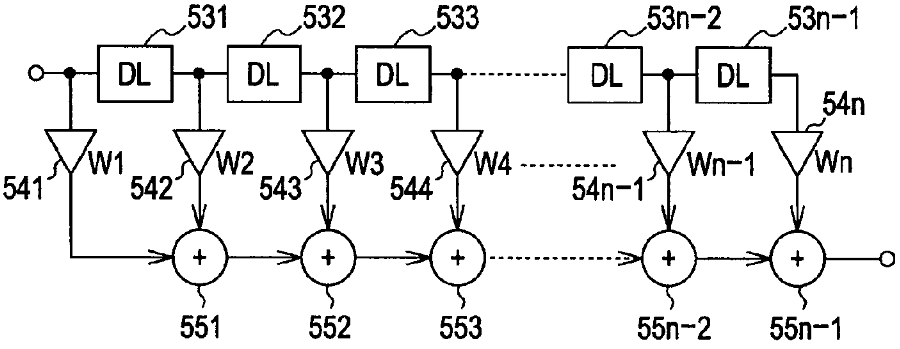
FIG. 18 is a diagram for describing the seventh embodiment.

The above description made with reference to FIG. 17 through FIG. 19 corresponds to description of processing corresponding to one channel of audio signals from the first signal processing unit 501, while the second signal processing unit 502 performs the above-described processing on audio signals of each channel of the multi-channels from the first signal processing unit 501. The signals to be left channel or right channel signals are each generated by adding among the multiple channel signals.

While an A/D converter is provided in FIG. 17, the output of the first signal processing unit 501 is digital audio signals, so it is needless to say that an A/D converter is unnecessary for the second signal processing unit 502.

Performing digital filter processing such as described above with the second signal processing unit 502 on each of the sound sources of the multiple channels separated at the first signal processing unit 501 enables listening at the headphones 520 such that the sound sources of the multiple channels have sound image localization at arbitrary positions.

Eighth Embodiment

Figure 20:
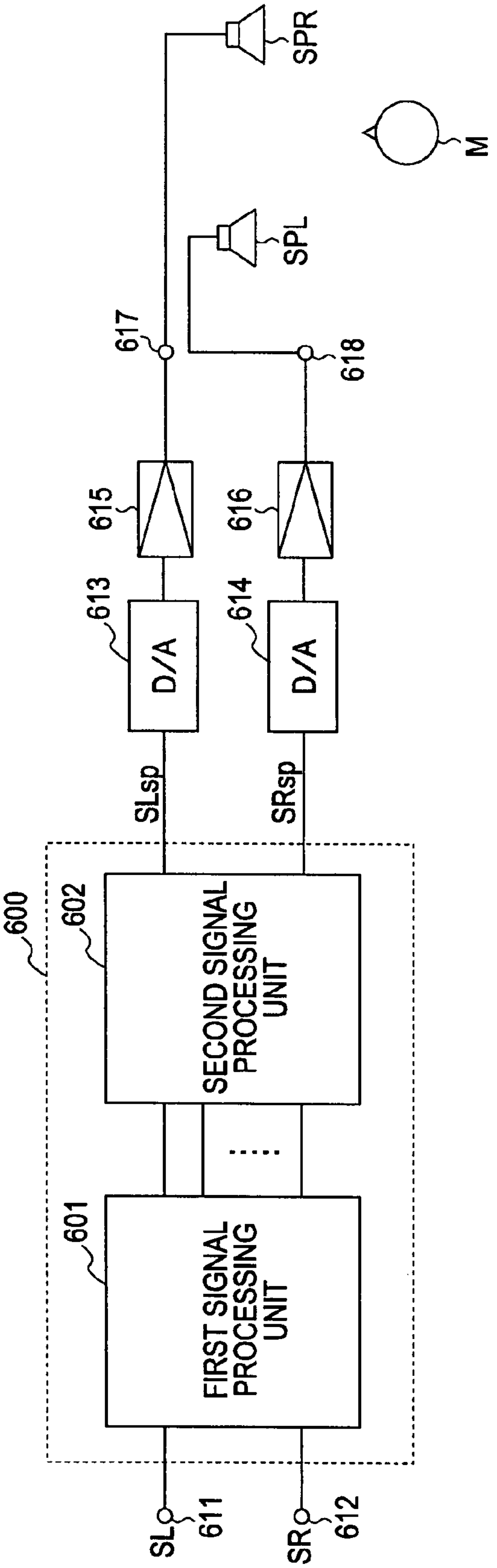
FIG. 20 is a diagram illustrating a configuration example of an eighth embodiment of an audio signal processing device according to the present invention.

A configuration example of an eighth embodiment is illustrated in FIG. 20. The eighth embodiment is a system for signal processing of the two-channel stereo audio signals SL, SR with an audio signal processing device unit 600, and enabling listening to audio signals of the signal processing results with two speakers SPL, SPR.

As shown in FIG. 20, with the eighth embodiment, similar to the seventh embodiment, the two-channel stereo audio signals SL, SR are input into the audio signal processing device unit 600 through the input terminals 611 and 612, respectively. The audio signal processing device unit 600 is made up of a first signal processing unit 601 and a second signal processing unit 602.

The first signal processing unit 601 is entirely the same as the first signal processing unit 501 of the seventh embodiment, and transforms the input two-channel stereo signals SL, SR into multi-channel signals of three or more multi-channels, for example five channels, as with, for example, the first embodiment.

With the second signal processing unit 602, the multi-channel audio signal is received as input from the first signal processing unit 601, wherein the properties of the audio signals of each channel of the multi-channels which are the same as that of the transfer function reaching both ears of the listener from the speakers placed at arbitrary positions are added to the properties actualized with the two speakers SPL, SPR. Then, the signals are merged into the two-channel signals SLsp and SRsp again.

The output signals SLsp and SRsp from the second signal processing unit 602 are then output from the audio signal processing device unit 600, supplied to the D/A transformer 613 and 614, transformed into analog audio signals, and output to the output terminals 617 and 618 via amplifiers 615 and 616. The audio signals SLsp and SRsp are acoustically reproduced by the speakers SPL and SPR connected to the output terminals 617 and 618.

The principle for realizing the properties similar to speaker reproduction with the two speakers SPL and SPR in arbitrary position will be described below.

Figure 21:
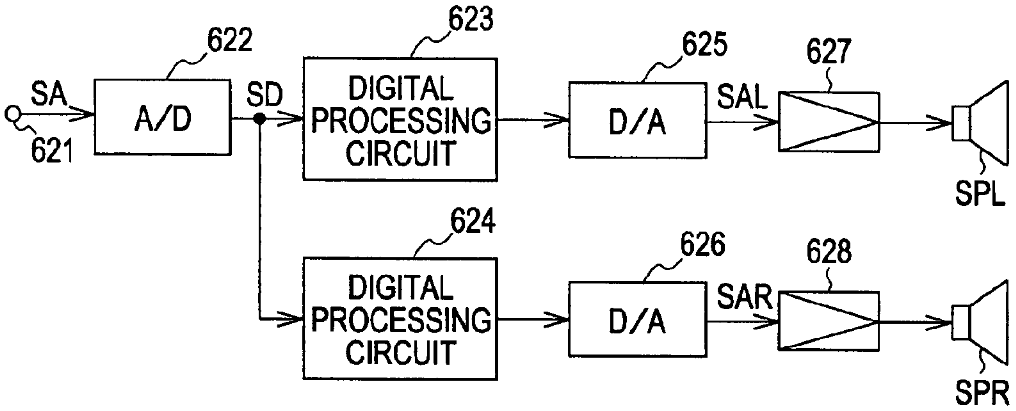
FIG. 21 is a diagram for describing the eighth embodiment.

FIG. 21 is a block diagram of a configuration example of a signal processing device which localizes the sound images in arbitrary positions with the two speakers.

That is to say, the analog audio signal SA is supplied to the A/D transformer 622 via the input terminal 621 and is transformed to a digital audio signal SD. Then this digital audio signal SD is supplied to digital processing circuits 623 and 624 configured with the digital filter illustrated in FIG. 18 as described above. With the digital processing circuits 623 and 624, an impulse response wherein a transfer function to be described later is transformed to a time axis is convolved into the signal SD.

The signals SDL and SDR of the processing results thereof are supplied to the D/A converter circuits 625, 626, transformed to analog audio signals SAL, SAR, and these signals SAL, SAR are supplied to the left and right channel speakers SPL, SPR which are positioned on the left front and right front of the listener M, via the speaker amplifiers 627 and 628.

Figure 22:
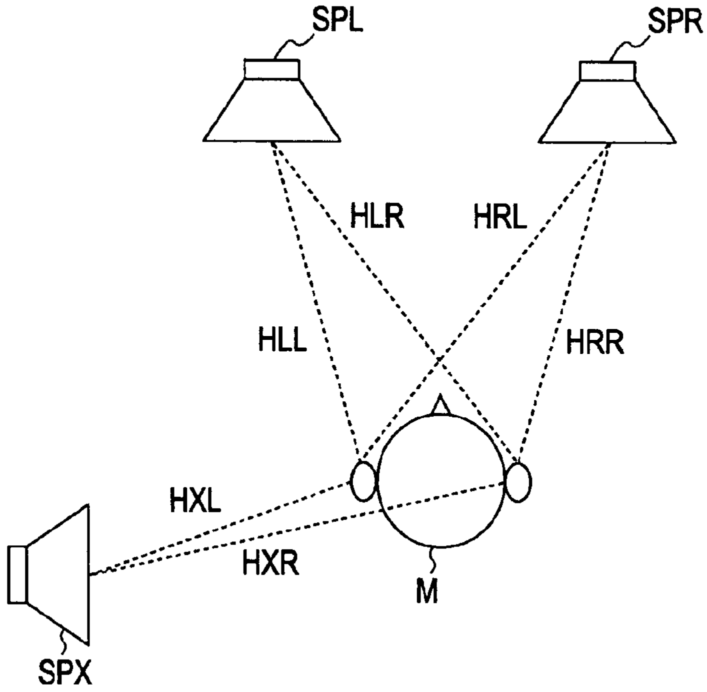
FIG. 22 is a diagram for describing the eighth embodiment.

Now, the processing in the digital processing circuits 623 and 624 have the following content. That is to say, now as illustrated in FIG. 22, a case is considered for disposing the sound sources SPL, SPR at the left front and right front of the listener M, and equivalently reproducing the sound source SPX at an arbitrary position with the sound sources SPL, SPR.

Then, if

HLL: transfer function from the sound source SPL to the left ear of the listener M HLR: transfer function from the sound source SPL to the right ear of the listener M HRL: transfer function from the sound source SPR to the left ear of the listener M HRR: transfer function from the sound source SPR to the right ear of the listener M HXL: transfer function from the sound source SPX to the left ear of the listener M HXR: transfer function from the sound source SPX to the right ear of the listener M holds, the sound sources SPL, SPR can be expressed as $$SPL=(HXL\times HRR-HXR\times HRL)/(HLL\times HRR-HLR\times HRL)\times SPX \quad \text{(Expression 5)}$$

$$SPR=(HXR\times HLL-HXL\times HLR)/(HLL\times HRR-HLR\times HRL)\times SPX \quad \text{(Expression 6)}$$

Accordingly, if the input audio signal SXA corresponding to the sound source SPX is supplied to a speaker disposed in the position of the sound source SPL via the filter realizing the portion of the transfer function in (Expression 5), as well as the signal SXA being supplied to a speaker disposed in the position of the sound source SPR via the filter realizing the portion of the transfer function in (Expression 6), a sound image by the audio signal SX can be localized in the position of the sound source SPX.

With the digital processing circuits 623 and 624, an impulse response, wherein a transfer function similar to the transfer function portion of (Expression 5) and (Expression 6) is transformed to a time axis, is convolved into the digital audio signal SD. Note that the impulse response convolved into the digital filter which makes up the digital processing circuits 623 and 624 calculated by being measured beforehand or computed, and is transformed into filter coefficients W1, W2, . . . , Wn, and provided to the digital processing circuits 623 and 624.

The signals SDL, SDR of the processing results of the digital processing circuit 623 and 624 are supplied to the D/A converter circuit 625 and 626 and converted into analog audio signals SAL and SAR, and these signals SAL and SAR are supplied to the speakers SPL and SPR via the amplifiers 627 and 628, and are acoustically reproduced.

Accordingly, from the reproduction sound from the two speakers SPL, SPR, the sound image from the analog audio signal SA can be localized in the position of the sound source SPX as illustrated in FIG. 22.

Note that the descriptions given above with reference to FIG. 20 through FIG. 22 correspond to the descriptions of the processing as to the one-channel audio signal from the first signal processing unit 601, and with the second signal processing unit 602, the above-described processing is performed as to the audio signals of each channel of the multi-channels from the first signal processing unit 601. Then the signals to serve as the left channel or the right channel signals are added together with the multi-channel signals, and are respectively generated.

With FIG. 21, an A/D transformer is provided, but since the output of the first signal processing unit 601 is a digital audio signal, it goes without saying that the A/D transformer is unnecessary with the second signal processing unit 602.

Thus, by performing digital filter processing as described above with the second signal processing unit 602 as to each of the sound sources of the multiple channels separated with the first signal processing unit 601, each sound source of the multiple channels can have the sound image thereof localized in an arbitrary position, and this can be reproduced with the two speakers SPL, SPR.

Ninth Embodiment

Figure 23:
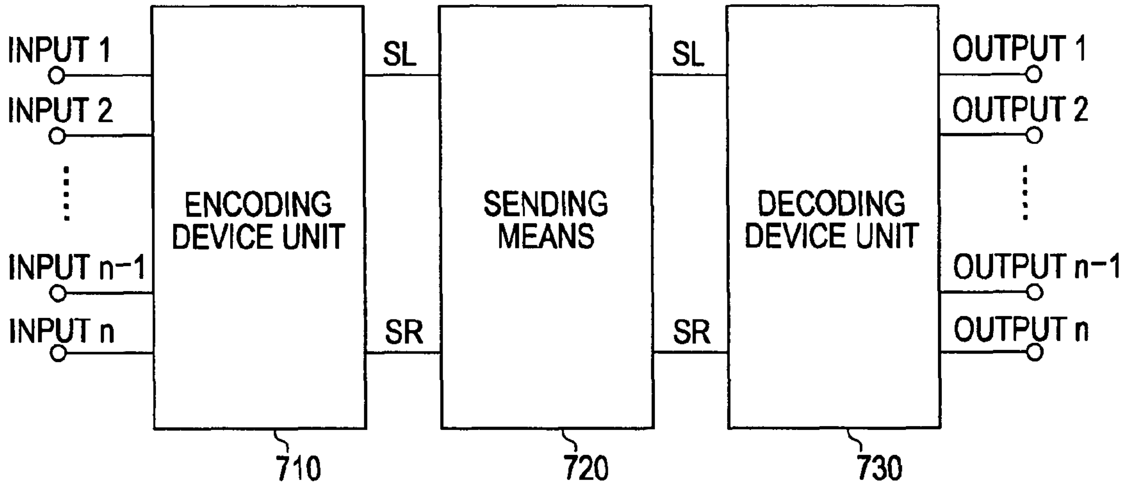
FIG. 23 is a diagram illustrating a configuration example of a ninth embodiment of an audio signal processing device according to the present invention.

A configuration example of a ninth embodiment is illustrated in FIG. 23. This ninth embodiment is an example of an encoding/decoding device made up of an encoding device unit 710, a transmitting means 720, and a decoding device unit 730, as illustrated in FIG. 23.

That is to say, with the ninth embodiment, a multi-channel audio signal is encoded to two-channel signals SL, SR with the encoding device unit 710, and following the signals SL, SR of the encoded two-channel signals being recorded and reproduced, or signals transmitted with the transmitting means 720, the original multi-channel signal is re-synthesized at the decoding device unit 730.

Figure 24:
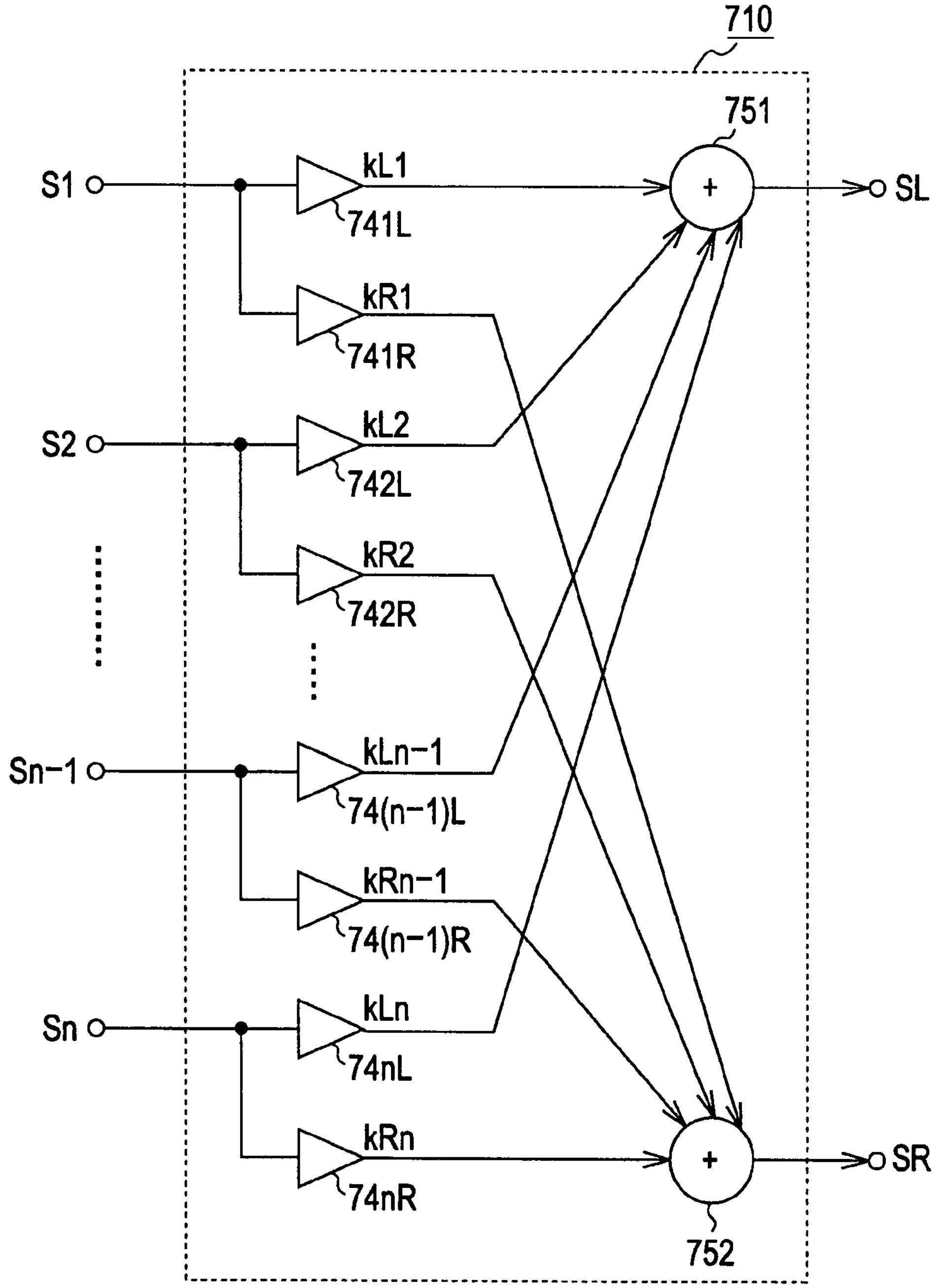
FIG. 24 is a block diagram illustrating a configuration example of a part of FIG. 23.

Here, the encoding device unit 710 is configured as that illustrated in FIG. 24, for example. With FIG. 24, the audio signals S1, S2, . . . , Sn of the input multi-channels are adjusted in level respectively with attenuators 741L, 742L, 743L, . . . , **74*n*L, and are supplied to the adding unit 751, and also are subjected to level adjusting by the attenuators 741R, 742R, 743R, . . . , 74*n*R, and are supplied to the adding unit 752. Then these are output as the two-channel signals SL and SR from the adding units 751 and 752**.

That is to say, each of the audio signals S1, S2, Sn of the multi-channels are subjected to a level difference being attached with a different ratio, with the attenuators 741L, 742L, 743L, . . . , **74*n*L, and the attenuators 741R, 742R, 743R, . . . , 74*n*R, synthesized to the two-channel signals SL, SR, and are output. In other words, with the attenuators 741L, 742L, 743L, . . . , 74*n*L, the input signals for each channel are output as levels of multiples of kL1, kL2, kL3, . . . , kLn (kL1, kL2, kL3, . . . , kLn≦1). Also, with the attenuators 741R, 742R, 743R, . . . , 74*n*R, the input signals for each channel are output as levels of multiples of kR1, kR2, kR3, . . . , kRn (kR1, kR2, kR3**, . . . , kRn≦1).

The synthesized two-channel signals SL, SR are recorded on a recording medium such as an optical disk, for example. Then reproducing is performed from the recording medium and is transmitted, or is transmitted via a communication wire. The transmitting means 720 is made up of means for transmitting/receiving by a recording reproducing device or via a communication wire for such a purpose.

The two-channel audio signals SL, SR which are transmitted via the transmitting means 720 are provided to the decoding device unit 730, and the original sound source which has been re-synthesized is output here. The decoding device unit 730 includes the audio signal processing device unit 100 from the above-described first through third embodiments, and separates to restore the original multi-channel signals with the level ratio, in the case of mixing the two-channel audio signals SL, SR of each sound source when encoded with the encoding device unit 710 from the two-channel audio signal, as a base, and reproduces this through multiple speakers.

Figure 25:
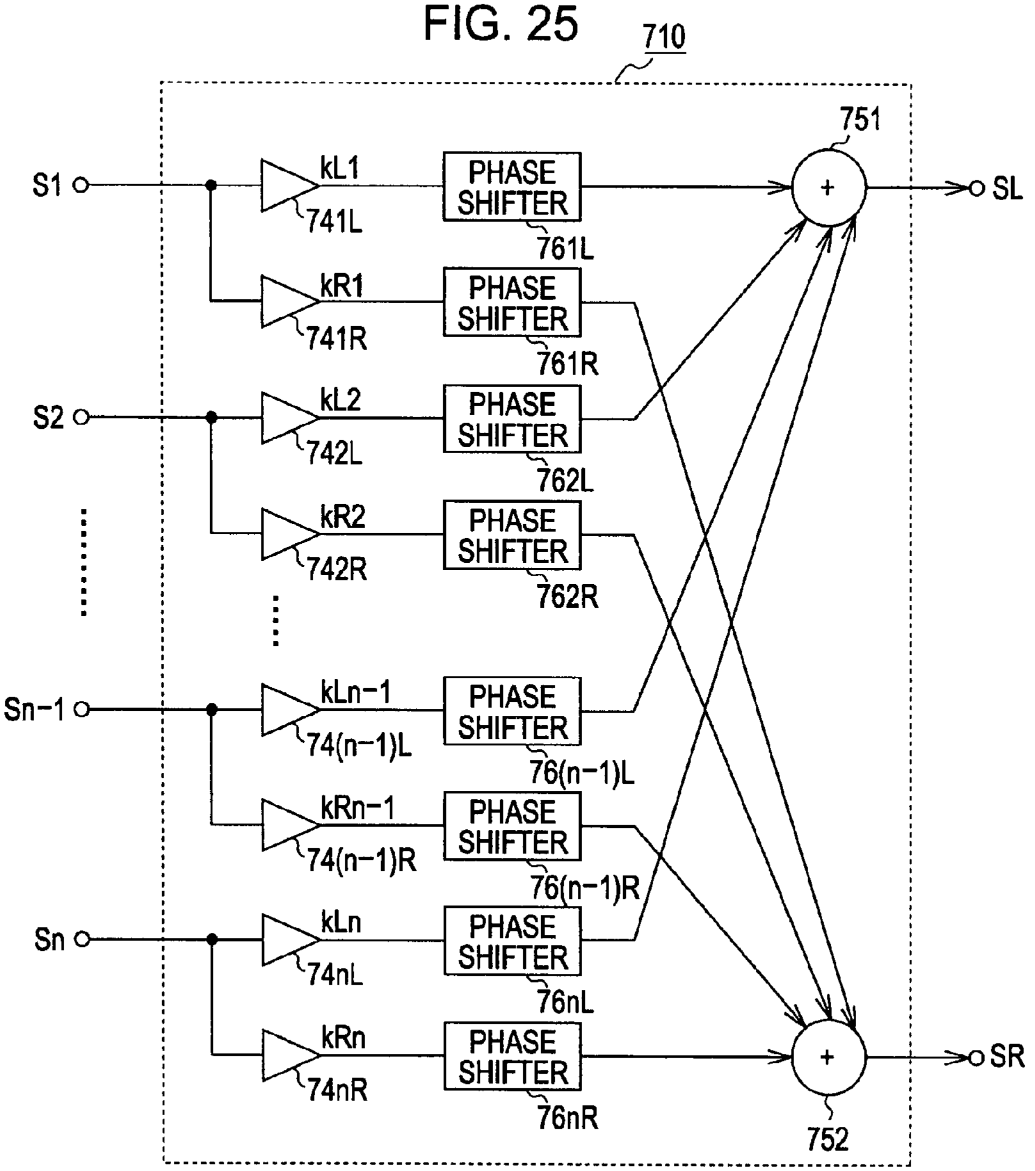
FIG. 25 is a block diagram illustrating another configuration example of a part of FIG. 23.

With the above-described example, signal phases have not been considered with the encoding device unit 710, but in the event of generating the two-channel signals SL, SR, phases can be considered. FIG. 25 is a configuration example of the encoding device unit 710 in this case.

As shown in FIG. 25, with the encoding device unit 710 in this case, phase shifters 761L, 762L, 763L, . . . , **76*n*L are provided between the attenuators 741L, 742L, 743L, . . . , 74*n*L and the adding unit 751, and phase shifters 761R, 762R, 763R, . . . , 76*n*R are provided between the attenuators 741R, 742R, 743R, . . . , 74*n*R and the adding unit 752. In the case of synthesizing each channel, signal with the two-channel signals SL, SR with these phase shifters 761L, 762L, 763L, . . . , 76*n*L and phase shifters 761R, 762R, 763R, . . . , 76*n***R, a phase difference can be attached between the two-channel signals SL and SR.

In the case of this example, the decoding device unit 730 uses the audio signal processing device unit 100 of the fourth example, for example.

According to the acoustic reproduction system as described above, an encoding/decoding system excelling in separation between sound sources can be configured.

Tenth Embodiment

Figure 26:
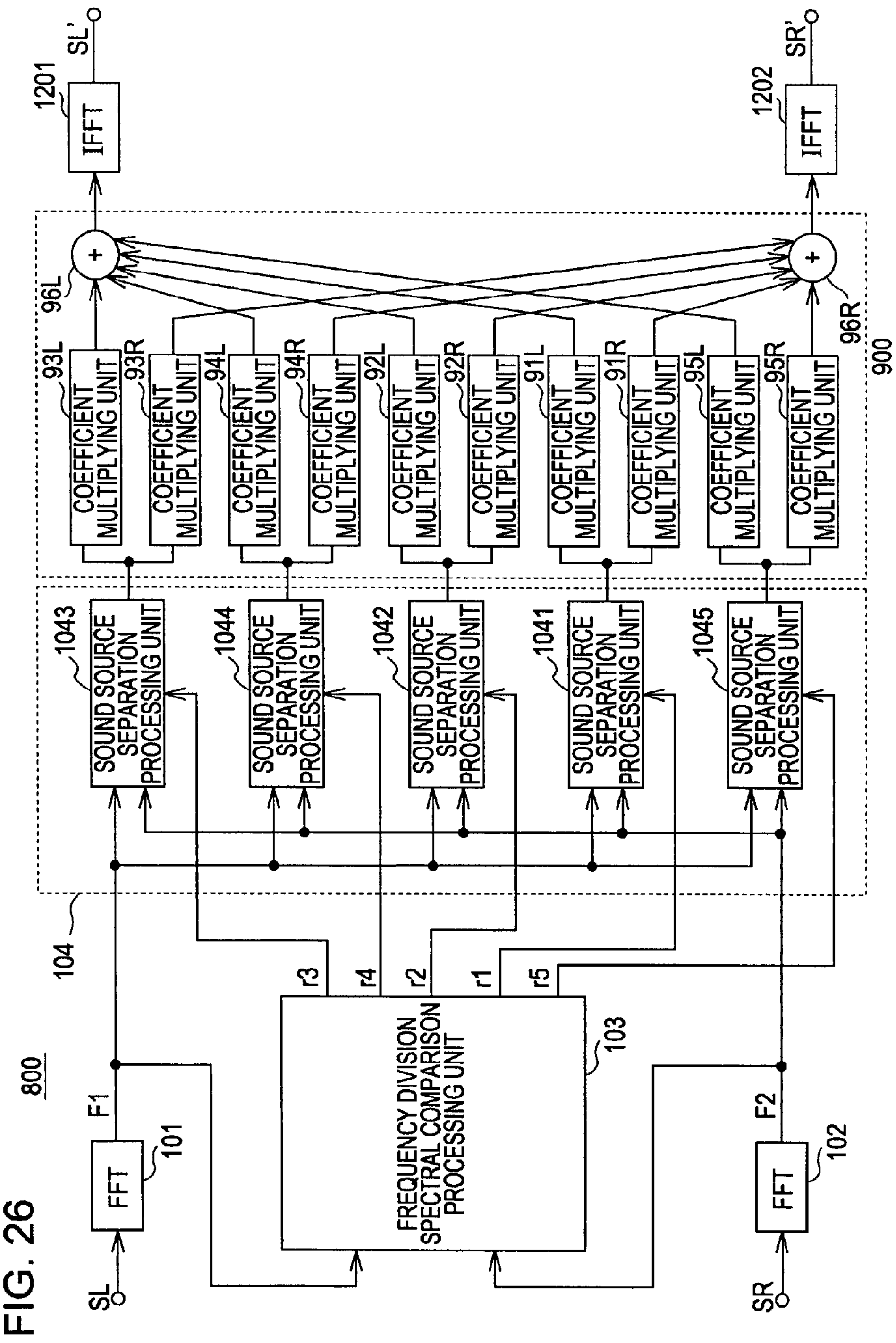
FIG. 26 is a diagram illustrating a configuration example of a tenth embodiment of an audio signal processing device according to the present invention.

A configuration example of a tenth embodiment is illustrated in FIG. 26. This tenth embodiment is a system for signal processing of the two-channel stereo audio signals SL, SR with an audio signal processing device unit 800, and enabling listening to audio signals of the signal processing results with headphones or with two speakers.

With the seventh embodiment and eighth embodiment, a first signal processing unit and a second signal processing unit are provided on the audio signal processing device unit, the input stereo signal is transformed to a multi-channel signal by the first signal processing unit, and with the multi-channel audio signal as input to the second signal processing unit, the properties of the multi-channel audio signals which are the same as that of the transfer function reaching both ears of the listener from the speakers placed at arbitrary positions, or properties such that the sound sources, localized at arbitrary positions with two speakers can be obtained, are to be obtained.

With the tenth embodiment, the processing with the first signal processing unit and the processing with the second signal processing unit are not to be performed independently, but all are to be performed in one transforming process from the time region to the frequency region.

In FIG. 26, the configuration for the two-channel audio signals SL, SR transformed into frequency region signals and then separated to the audio signal components of the frequency region of five channels, for example, are the same as that illustrated in FIG. 1. That is to say, the embodiment in FIG. 26 includes configuration portions of the FFT units 101 and 102, frequency division spectral comparison processing unit 103, and frequency division spectral control processing unit 104.

The tenth embodiment has a signal processing unit 900 for performing processing corresponding to the second signal processing of the seventh embodiment or the second signal processing of the eighth embodiment, before transforming the output signal from the frequency division spectral control processing unit 104 to the time region.

This signal processing unit 900 has coefficient multipliers 91L, 92L, 93L, 94L, and 95L for left channel signal generating, and coefficient multipliers 91R, 92R, 93R, 94R, and 95R for right channel signal generating, regarding each of the five channels of audio signals from the frequency division spectral control processing unit 104. The signal processing unit 900 further has an adding unit 96L for synthesizing the output signals of the coefficient multipliers 91L, 92L, 93L, 94L, and 95L for left channel signal generating, and an adding unit 96R for synthesizing the output signals of the coefficient multipliers 91R, 92R, 93R, 94R, and 95R for right channel signal generating.

The multiplication coefficients of the coefficient multipliers 91L, 92L, 93L, 94L, and 95L and the coefficient multipliers 91R, 92R, 93R, 94R, and 95R are set as multiplication coefficients corresponding to the filter coefficients of the digital filters of the second signal processing unit in the seventh embodiment as described above, or the filter coefficients of the digital processing circuits of the second signal processing unit in the eighth embodiment as described above.

Convolution integration at the time region can be realized with multiplication with the frequency region, so with the tenth embodiment, in FIG. 26, a pair of coefficients for realizing transmitting properties are multiplied as to each of the separated signals, by the coefficient multipliers 91L, 92L, 93L, 94L, and 95L and the coefficient multipliers 91R, 92R, 93R, 94R, and 95R.

Also, the multiplied results are supplied to the inverse FFT units 1201 and 1202, following the channels outputs to headphones or speakers being added to one another with the adding units 96L and 96R, are restored to time-series data, and are output as two-channel audio signals SL' and SR'.

The time-series data SL' and SR' from the inverse FFT units 1201 and 1202 are restored to analog signals with the D/A transformers, supplied to headphones or two speakers, and acoustic reproduction is performed, although the diagrams are omitted.

With such a configuration, the number of times of inverse FFT processing can be reduced, as well as adding transmitting properties with the frequency region, so long tap properties can be added with little processing time, and thus an efficient multi-channel reproduction system can be built.

[Audio Signal Processing Device of Eleventh Embodiment]

Figure 27:
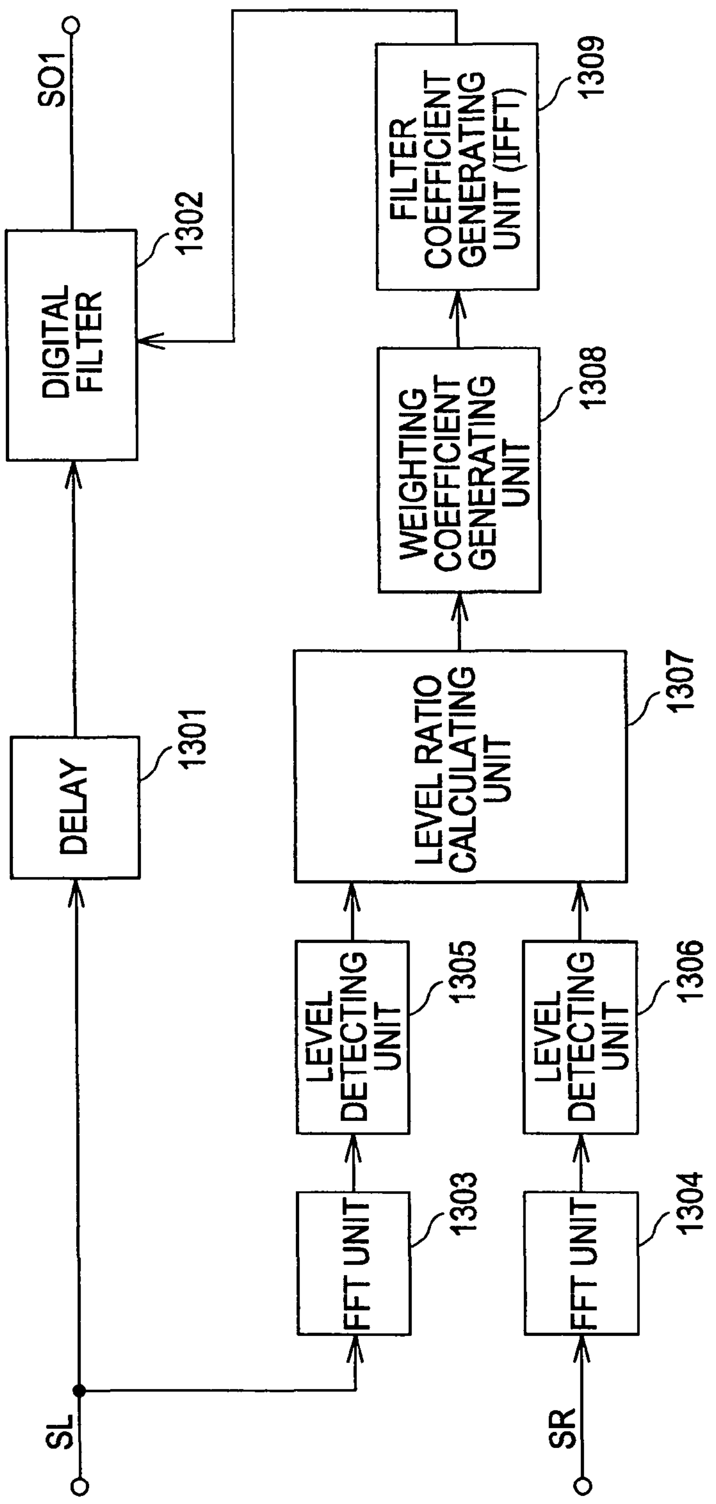
FIG. 27 is a diagram illustrating a configuration example of an eleventh embodiment of an audio signal processing device according to the present invention.

FIG. 27 is a block diagram illustrating a partial configuration example of the audio signal processing device unit according to the eleventh embodiment. FIG. 27 illustrates a configuration for separating the audio signals of one sound source which are distributed with a predetermined level ratio or level difference to the left and right channels from the left channel audio signals SL which is one of the left and right two-channel audio signals SL, SR, by using a digital filter.

That is to say, the audio signals SL of the left channel (digital signal in this example) are supplied to the digital filter 1302 via a delay 1301 for timing adjusting. A filter coefficient, which is formed based on the level ratio as to the left and right channels of the sound source audio signals to be separated, as described later, is supplied to the digital filter 1302, whereby the sound source audio signals to be separated are extracted from the digital filter 1302.

The filter coefficient is formed as follows. First, the audio signals SL and SR of the left and right channels (digital signals) are supplied to the FFT units 1303 and 1304 respectively, subjected to FFT processing, the time-series audio signals are transformed to frequency region data, and multiple frequency division spectral components with frequencies differing from one another are output from each of the FFT unit 1303 and FFT unit 1304.

The frequency division spectral components from each of the FFT units 1303 and 1304 are supplied to the level detecting units 1305 and 1306, and the levels thereof are detected by the amplitude spectrum or power spectrum thereof being detected. The level values D1 and D2 detected by the level detecting unit 1305 and 1036 respectively are supplied to the level ratio calculating unit 1307, and the level ratio thereof. D1/D2 or D2/D1 is calculated.

The level ratio value calculated with the level ratio calculating unit 1307 is supplied to a weighted coefficient generating unit 1308. The weighted coefficient generating unit 1308 corresponds to the multiplier coefficient generating unit of the above-described embodiment, outputs a large value weighted coefficient with a mixed level ratio as to the left and right two-channel audio signals of the audio signals of the sound source to be separated, or when nearby that level ratio, and outputs a smaller weighted coefficient with another level ratio. The weighted coefficients are obtained for each frequency of the frequency division spectrum components output from the FFT units 1303 and 1304.

The weighting coefficient of the frequency region from the weighted coefficient generating unit 1308 is supplied to the filter coefficient generating unit 1309, and is transformed into a filter coefficient of the time axis region. The filter coefficient generating unit 1309 obtains the filter coefficient to be supplied to the digital filter 1302 by subjecting the frequency region weighted coefficient to inverse FFT processing.

Then the filter coefficient from the filter coefficient generating unit 1309 is supplied to the digital filter 1302, and the sound source audio signal components corresponding to the functions set with the weighted coefficient generating unit 1308 are separated and extracted from the digital filter 1302, and are output as output SO. Note that the delay 1301 is for adjusting the processing delay time until the filter coefficient supplied to the digital filter 1302 is generated.

The example in FIG. 27 has consideration only for the level ratio, but a configuration may be made with consideration for the phase difference only, or with the level ratio and phase difference combined. That is to say, for example in the case of considering a combination of level ratio and phase difference, the output of the FFT units 1303 and 1304 is supplied to the phase difference detecting units as well, and also the detected phase difference is also supplied to the weighted coefficient generating unit, although the diagrams thereof are omitted. The weighted coefficient generating unit in the case of this example is configured as a function generating circuit for generating weighted coefficients, not only with the level difference as to the left and right two-channel audio signals of the sound source to be separated, but also with the phase difference as variables.

In other words, the weighted coefficient generating unit in this case is for setting functions to generate coefficients, wherein in the case of the level ratio at or nearby the level ratio with the left and right two channels of the audio signals of the sound source to be separated, and if the phase difference is at or nearby the phase difference with the left and right two channels of the audio signals of the sound source to be separated, a large weighted coefficient is generated, and in other cases a small coefficient is generated.

Then by subjecting the weighted coefficient from the weighted coefficient generating unit to inverse FFT processing, the filter coefficient for the digital filter 1302 is formed.

With FIG. 27, the audio signals of the sound source desired only from the left channel are to be separated, but by providing a separate system for generating a filter coefficient for the audio signals of the right channel also, similarly the audio signals of a predetermined sound source can be separated.

Note that in order to separate and extract the sound source signals of multiple channels with three or more channels from the two-channel stereo signals SL, SR, the configuration portion in FIG. 27 need to be provided only by the number of corresponding channels. In this case, the FFT units 1303 and 1304, the level detecting units 1305 and 1036, and the level ratio calculating unit 1307 can be shared at each of the channels.

[Audio Signal Processing Device of Other Embodiments]

With the above-described embodiments, when subjecting the input audio signals to FFT processing, subjecting a long time-series signal such as a musical composition as it is to FFT processing is difficult, and so this is sectored into predetermined analysis sections, and FFT processing is performed by obtaining sector data for each analysis section.

However, in the case of simply extracting only one set length of time-series data and performing sound source separating processing, following which inverse FFT transformation is performed to link the data, a discontinuous point in a waveform is generated at the linking point, and when this is listened to as a sound, there is a problem of this generating noise.

Figure 28:
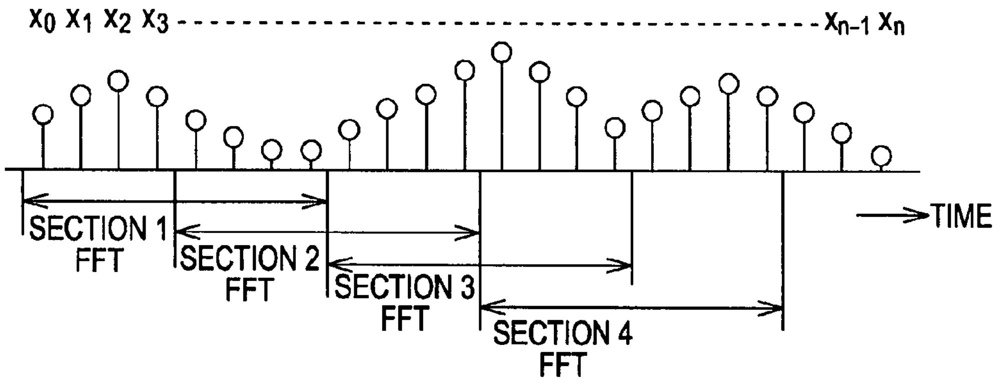
FIG. 28 is a diagram illustrating a configuration example of a twelfth embodiment of an audio signal processing device according to the present invention.

Thus, with a twelfth embodiment, in order to extract the sector data, the lengths of section 1, section 2, section 3, section 4, . . . are set as increment sections each of the same length, as shown in FIG. 28, but with adjoining sections, a sectional portion of for example ½ the length of the increment section can be set to overlap each of the sections, and the sector data for each section is extracted. Note that in FIG. 28, x1, x2, x2, . . . , xn illustrate sample data of the digital audio signal.

Figure 29:
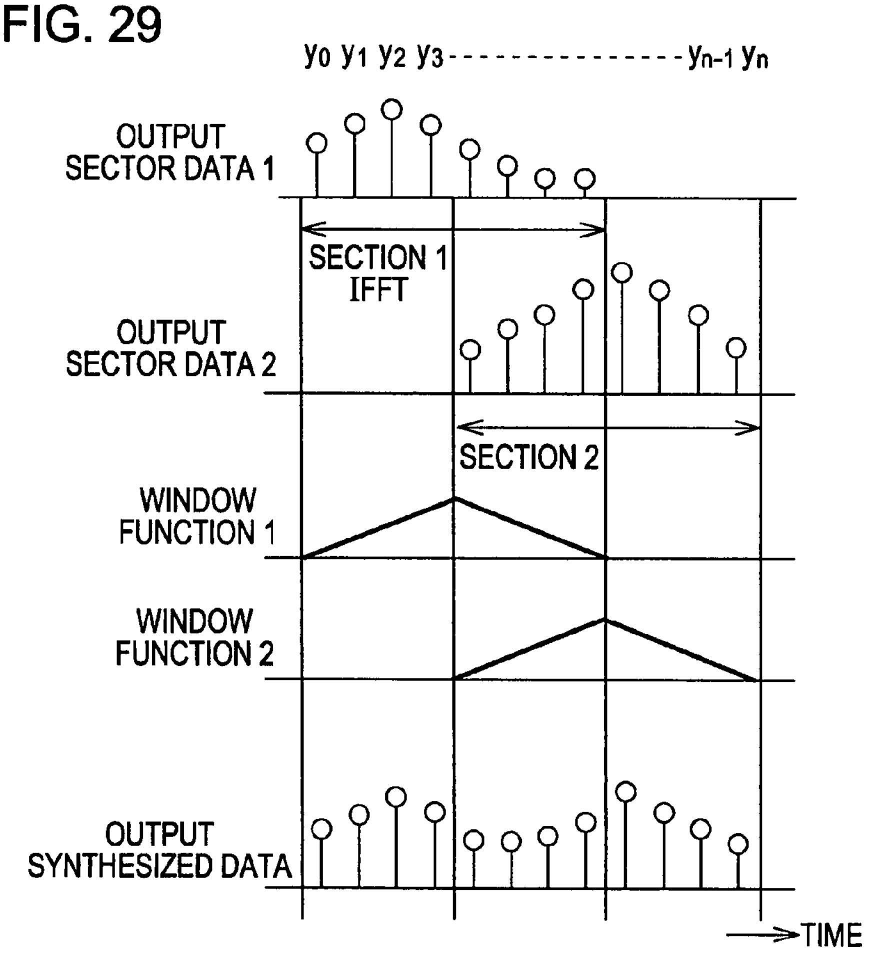
FIG. 29 is a diagram illustrating a configuration example of the twelfth embodiment of an audio signal processing device according to the present invention.

When processed in this manner, the time series data, which has been subjected to sound source separation processing as described with the above embodiment and subjected to inverse FFT transformation, can also have overlapped sections such as the output sector data 1, 2 as illustrated in FIG. 29.

With the eighth embodiment, as illustrated in FIG. 29, processing for a window function 1, 2 to have a triangle window such as that illustrated in FIG. 29 is performed as to the adjoining output sector data with overlapped sections, for example the overlapped sections of output sector data 1, 2, and by adding the same point in time data together for the overlapped sections of the respective output sector data 1, 2, the output synthesized data as illustrated in FIG. 29 can be obtained. Thus, a separated output audio signal without waveform discontinuous points and without noise can be obtained.

Figure 30:
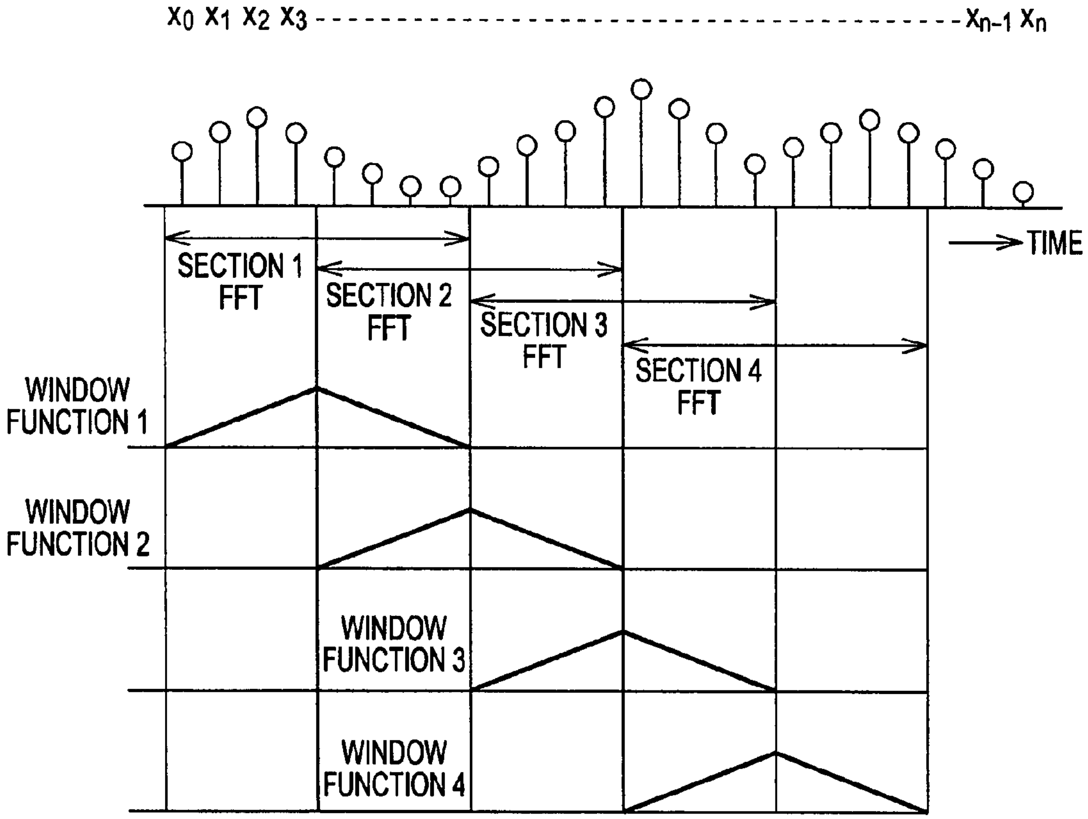
FIG. 30 is a diagram illustrating a configuration example of a thirteenth embodiment of an audio signal processing device according to the present invention.

Further, with the thirteenth embodiment, in order to extract the sector data, a fixed section of adjoining sector data is extracted to overlap with each other such as section 1, section 2, section 3, section 4, as illustrated in FIG. 30, and at the same time this sector data for the respective sections are subjected to window function processing of window function 1, 2, 3, 4 for a triangle window such as illustrated in FIG. 30 before FFT processing.

Figure 31:
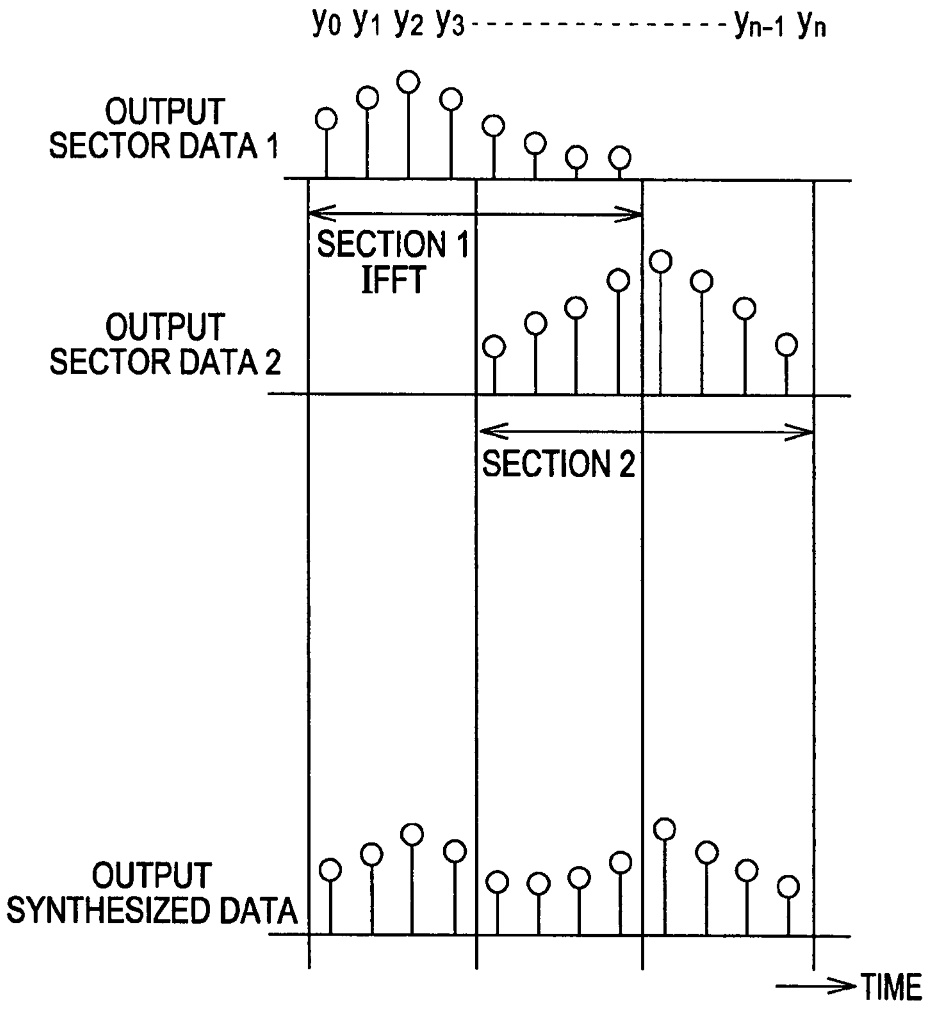
FIG. 31 is a diagram illustrating a configuration example of the thirteenth embodiment of an audio signal processing device according to the present invention.
Figure 32:
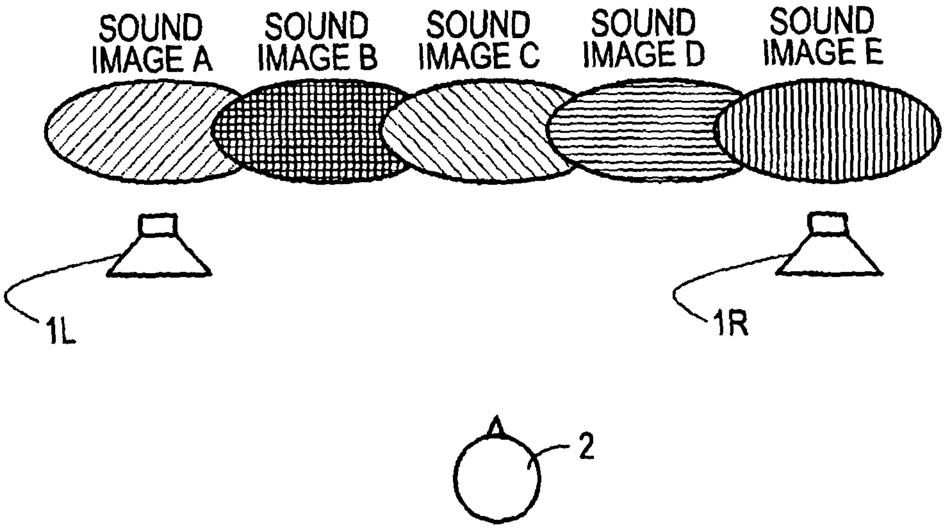
FIG. 32 is a diagram for describing audio image localization with 2-channel signals made up of multiple sound sources.
Figure 33:
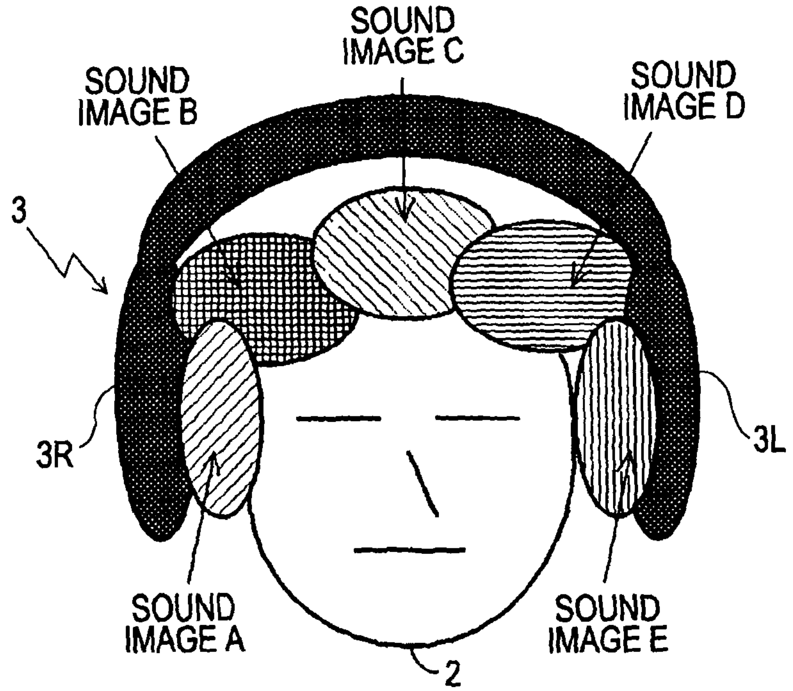
FIG. 33 is a diagram for describing audio image localization with 2-channel signals made up of multiple sound sources.
Figure 34:
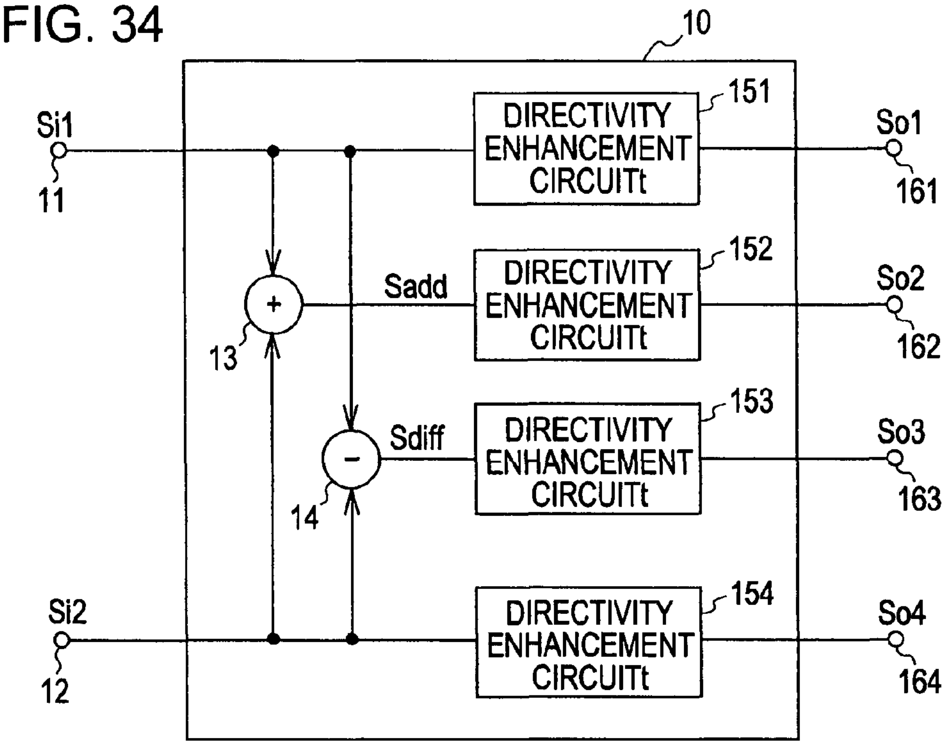
FIG. 34 is a block diagram for describing a conventional separating device for audio signals of a particular sound source.
Figure 35:
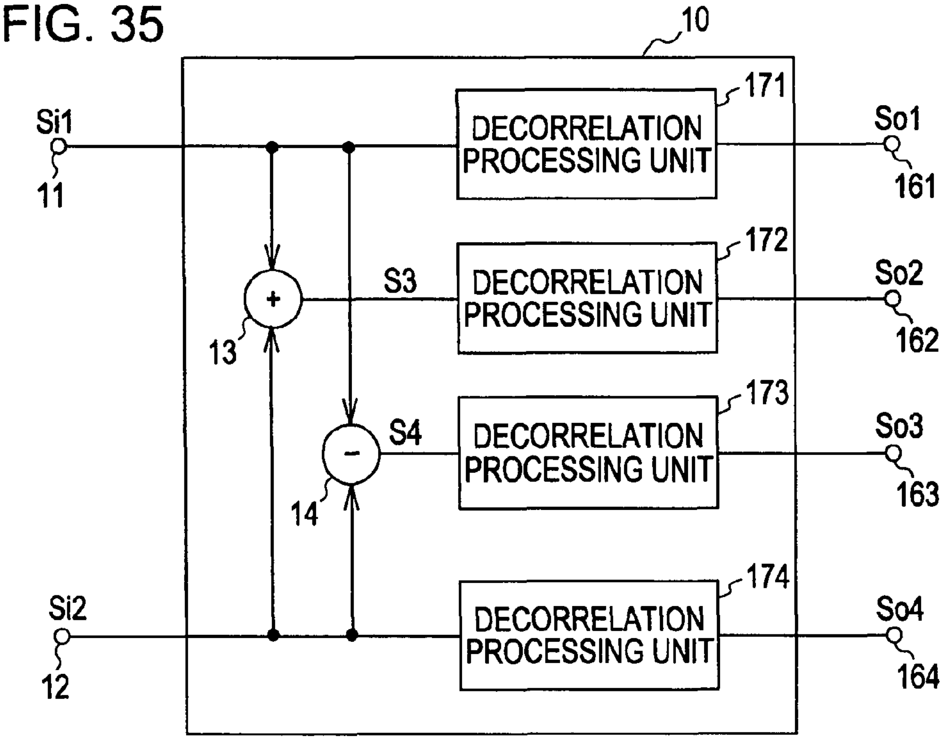
FIG. 35 is a block diagram for describing a conventional separating device for audio signals of a particular sound source.
Figure 36A:
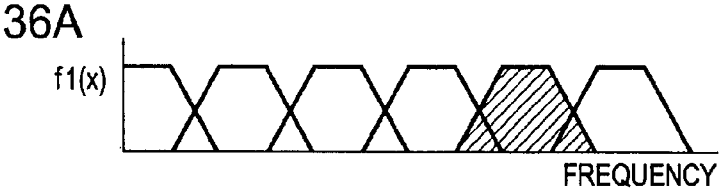
FIG. 36A is a block diagram for describing a conventional separating device for audio signals of a particular sound source.
Figure 36B:
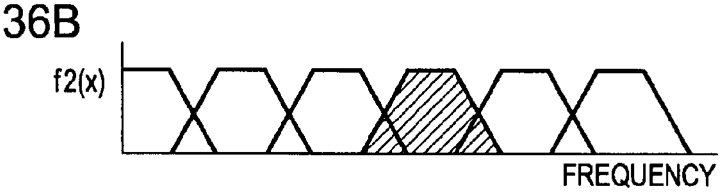
FIG. 36B is a block diagram for describing a conventional separating device for audio signals of a particular sound source.
Figure 36C:
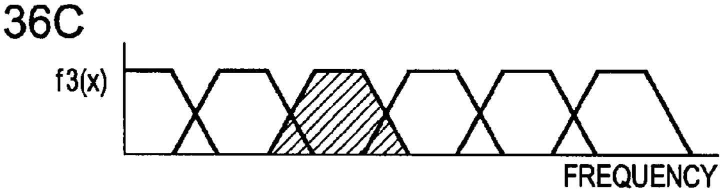
FIG. 36C is a block diagram for describing a conventional separating device for audio signals of a particular sound source.
Figure 36D:
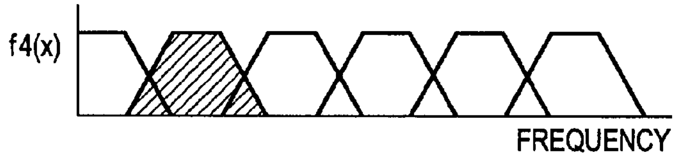
FIG. 36D is a block diagram for describing a conventional separating device for audio signals of a particular sound source.
Figure 37A:
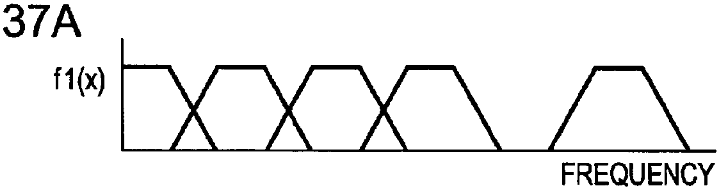
FIG. 37A is a block diagram for describing a conventional separating device for audio signals of a particular sound source.
Figure 37B:
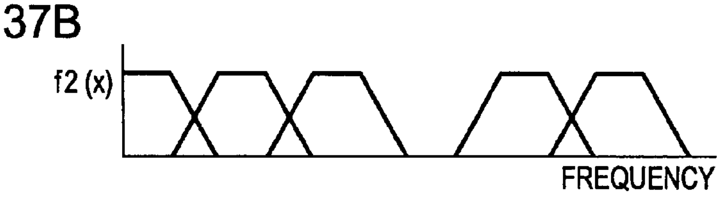
FIG. 37B is a block diagram for describing a conventional separating device for audio signals of a particular sound source.
Figure 37C:
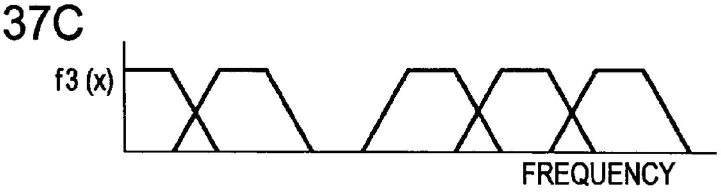
FIG. 37C is a block diagram for describing a conventional separating device for audio signals of a particular sound source.
Figure 37D:
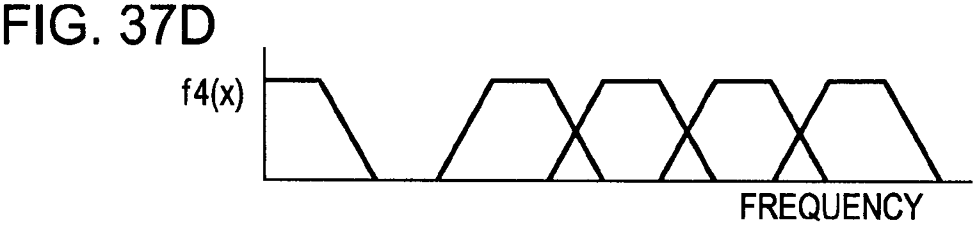
FIG. 37D is a block diagram for describing a conventional separating device for audio signals of a particular sound source.

Then after the window function processing such as illustrated in FIG. 30 is performed, the FFT transforming processing is performed. Then the signals to be subjected to sound source separation processing is subjected to inverse FFT transformation, and so the output sector data 1, 2 as that illustrated in FIG. 31 is obtained. This output sector data is data which has already been subjected to window function processing with overlap portions, and therefore at the output unit, simply by adding the respective overlapping sector data portions, a separated audio signal without discontinuous waveform points and without noise can be obtained.

Note that for the above-described window function, other than a triangle window, a Hanning window, a Hamming window, or a Blackman window or the like may be used.

Also, with the above-described embodiment, by orthogonally transforming the time separation signal, the signal is then transformed to a frequency region signal, so as to compare the frequency division spectrums between the stereo channels, but a configuration may be made wherein in principle, the signal at the time region can be narrowed into multiple band bus filters, and similar processing performed for the respective frequency bands. However, as with the above-described embodiment, performing FFT processing is easier to increase frequency separation functionality, and improves separability of the sound source to be separated, and therefore has a high practicality.

Note that with the above-described embodiment, a two-channel stereo signal has been described as a two-system audio signal to which the present invention is applied, but the present invention can be applied with any type of two-system audio signals, as long as the audio signals of the sound source are two audio signals to be distributed with a predetermined level ratio or level difference. The same can be said for phase difference.

Also, with the above-described embodiment, the level ratio of the frequency division spectrums of the two-system audio signals are obtained and the multiplier coefficient generating unit uses a function of a multiplier coefficient as to level ratio, but an arrangement may be made wherein the level difference of the frequency division spectrum for the two-system audio signal is obtained, and the multiplier coefficient generating unit uses a function of a multiplier coefficient as to the level difference.

Also, the orthogonal transform means for transforming the time-series signal to a frequency region signal is not limited to the FFT processing means, and rather can be anything as long as the level or phase of the frequency division spectrums can be compared.

The invention claimed is:

1. An audio signal processing device comprising:

first and second orthogonal transform means for transforming two systems of input audio time-sequence signals into respective frequency region signals;

frequency division spectral comparison means for comparing a level ratio or a level difference between corresponding frequency division spectrums from said first orthogonal transform means and said second orthogonal transform means;

frequency division spectral control means made up of three or more sound source separating means for controlling a level of frequency division spectrums obtained from both or one of said first and second orthogonal transform means based on the comparison results at said frequency division spectral comparison means, so as to extract and output frequency band components of and nearby values regarding which said level ratio or said level difference have determined beforehand;

three or more inverse orthogonal transform means for converting said frequency region signals from each of said three or more sound source separating means of said frequency division spectral control means into processed time-sequence signals;

wherein output audio signals are obtained from each of said three or more inverse orthogonal transform means; and wherein said frequency division spectral comparison means calculate the level ratio or the level difference between corresponding frequency division spectrums from said first orthogonal transform means and said second orthogonal transform means, and also calculate a phase difference;

and wherein said three or more sound source separating means of said frequency division spectral control means each have generating means for generating a first multiplier coefficient set as a function of said calculated level ratio or said calculated level difference and generating means for generating a second multiplier coefficient set as a function of said phase difference;

said audio signal processing device comprising:

first means for multiplying frequency division spectrums obtained from both or one of said first orthogonal transform means and said second orthogonal transform means with said fin multiplier function from said first multiplier coefficient generating means; and second means for multiplying the output of said first means with said second multiplier coefficient from said second multiplier coefficient generating means, thereby determining the output level thereof;

wherein the output of said second means is input to said inverse orthogonal transform means.

2. The audio signal processing device according to claim 1, wherein said frequency division spectral comparison means calculate the level ratio or the level difference between corresponding frequency division spectrums from said first orthogonal transform means and said second orthogonal transform means;

and wherein said three or more sound source separating means of said frequency division spectral control means each has generating means for generating a multiplier coefficient set as a function of said calculated level ratio or said calculated level difference, and multiplying frequency division spectrums obtained from one or both of said first orthogonal transform means and said second orthogonal transform means with said multiplier function from said multiplier coefficient generating means, thereby determining an output level thereof.

3. The audio signal processing device according to claim 2, wherein said calculated level ratio or said calculated level difference sets said multiplier coefficient to frequency division spectrums other than a frequency division spectrum of a predetermined range to zero.

4. The audio signal processing device according to claim 1, wherein the two systems of input audio time-sequence signals are sectored into predetermined analysis sections with sector data being obtained, and also predetermined sector sections are extracted in an overlapping manner, with output time-sequence signals being subjected to window function processing and time-sequence data of a same point-in-time being added to each other and output.

5. The audio signal processing device according to claim 1, wherein the two systems of input audio time-sequence signals are sectored into predetermined analysis sections with sector data being obtained, and also predetermined sector sections are extracted in an overlapping manner, subjected to window function processing, and subjected to orthogonal transform, with output time-sequence signals being subjected to inverse orthogonal transform so as to be converted into time-sequence data, with time-sequence data of a same point-in-time of consecutive analysis sections being added to each other and output.

6. An audio signal processing device comprising:

first and second orthogonal transform means for transforming two systems of input audio time-sequence signals into respective frequency region signals;

frequency division spectral comparison means for comparing a level ratio or a level difference between corresponding frequency division spectrums from said first orthogonal transform means and said second orthogonal transform means;

first sound source separating means for, based on the comparison results at said frequency division spectral comparison means, controlling a first level of a first frequency division spectrum obtained from said first orthogonal transform means and extracting frequency components of and nearby a first value determined beforehand regarding said level ratio or said level difference;

second sound source separating means for, based on the comparison results at said frequency division spectral comparison means, controlling a second level of a second frequency division spectrum obtained from said second orthogonal transform means and extracting frequency components of and nearby a second value determined beforehand regarding said level ratio or said level difference;

first and second inverse orthogonal transform means for restoring first and second frequency region signals from said first and second sound source separating means into time-sequence signals;

first residual extracting means for subtracting the first frequency region signals of said first sound source separating means from third frequency region signals of said first orthogonal transform means;

second residual extracting means for subtracting the second frequency region signals of said second sound source separating means from fourth frequency region signals of said second orthogonal transform means; and third and fourth inverse orthogonal transform means for restoring said third and fourth frequency region signals from said first and second residual extracting means into processed time-sequence signals;

wherein output audio signals are obtained from said first, second, third, and fourth inverse orthogonal transform means.

7. An audio signal processing device comprising:

first and second orthogonal transformers configured to transform two systems of input audio time-sequence signals into respective frequency region signals;

frequency division spectral comparer configured to compare a level ratio or a level difference between corresponding frequency division spectrums from said first orthogonal transformer and said second orthogonal transformer;

first sound source separator configured to, based on the comparison results at said frequency division spectral comparer, control a first level of a first frequency division spectrum obtained from said first orthogonal transformer and extract frequency components of and nearby a first value determined beforehand regarding said level ratio or said level difference;

second sound source separator configured to, based on the comparison results at said frequency division spectral comparer, control a second level of a second frequency division spectrum obtained from said second orthogonal transformer and extract frequency components of and nearby a second value determined beforehand regarding said level ratio or said level difference;

first and second inverse orthogonal transformers configured to restore first and second frequency region signals from said first and second sound source separators into time-sequence signals;

first residual extractors configured to subtract the first frequency region signals of said first sound source separator from third frequency region signals of said first orthogonal transformer;

second residual extractor configured to subtract the second frequency region signals of said second sound source separator from fourth frequency region signals of said second orthogonal transformer; and third and fourth inverse orthogonal transformers configured to restore said third and fourth frequency region signals from said first and second residual extractors into processed time-sequence signals;

wherein output audio signals are obtained from said first, second, third, and fourth inverse orthogonal transformers.

* * * * *